(12) United States Patent
Padiyath et al.

(10) Patent No.: US 11,414,924 B2
(45) Date of Patent: Aug. 16, 2022

(54) DURABLE LOW EMISSIVITY WINDOW FILM CONSTRUCTIONS

(71) Applicant: 3M INNOVATIVE PROPERTIES COMPANY, Saint Paul, MN (US)

(72) Inventors: Raghunath Padiyath, Saint Paul, MN (US); Gregory F. King, Saint Paul, MN (US); Stephen P. Maki, Saint Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 425 days.

(21) Appl. No.: 16/500,146

(22) PCT Filed: Apr. 12, 2018

(86) PCT No.: PCT/IB2018/052573
§ 371 (c)(1),
(2) Date: Oct. 2, 2019

(87) PCT Pub. No.: WO2018/189714
PCT Pub. Date: Oct. 18, 2018

(65) Prior Publication Data
US 2020/0181975 A1  Jun. 11, 2020

Related U.S. Application Data

(60) Provisional application No. 62/485,701, filed on Apr. 14, 2017.

(51) Int. Cl.
*E06B 9/24* (2006.01)
*C09J 7/29* (2018.01)
(Continued)

(52) U.S. Cl.
CPC .......... *E06B 9/24* (2013.01); *B32B 7/06* (2013.01); *B32B 7/12* (2013.01); *B32B 27/08* (2013.01);
(Continued)

(58) Field of Classification Search
None
See application file for complete search history.

(56) References Cited

U.S. PATENT DOCUMENTS

| 4,338,237 A | 7/1982 | Sulzbach |
| 5,285,002 A | 2/1994 | Grootaert |

(Continued)

FOREIGN PATENT DOCUMENTS

| WO | WO 1999-36248 | 7/1999 |
| WO | WO 1999-36262 | 7/1999 |

(Continued)

OTHER PUBLICATIONS

International Search Report for PCT International Application No. PCT/IB2018/52573, dated Jan. 17, 2019, 3 pages.

*Primary Examiner* — Kevin R Kruer
(74) *Attorney, Agent, or Firm* — Jeffrey M. Olofson

(57) ABSTRACT

In certain embodiments, the present disclosure relates to low emissivity films and articles comprising them. Other embodiments are directed to methods of reducing emissivity in an article comprising the use of low emissivity films. In some embodiments, the low emissivity films comprise a metal layer and a pair of layers, one comprising a metal oxide such as zinc tin oxide and the other layer comprising a silicon compound, adjacent each of the two sides of the metal layer. This type of assembly may serve various purposes, including being used as a sun control film. These constructions may be used, for example, as window films on (Continued)

glazing units for reducing transmission of infrared radiation across the film in both directions.

15 Claims, 3 Drawing Sheets

(51) Int. Cl.
C23C 14/02 (2006.01)
C23C 14/06 (2006.01)
C23C 14/08 (2006.01)
C23C 14/12 (2006.01)
C23C 14/18 (2006.01)
C23C 14/28 (2006.01)
C23C 14/35 (2006.01)
B32B 7/06 (2019.01)
B32B 27/36 (2006.01)
B32B 27/08 (2006.01)
B32B 7/12 (2006.01)
B32B 33/00 (2006.01)

(52) U.S. Cl.
CPC .............. *B32B 27/36* (2013.01); *C09J 7/29* (2018.01); *C23C 14/02* (2013.01); *C23C 14/0676* (2013.01); *C23C 14/081* (2013.01); *C23C 14/086* (2013.01); *C23C 14/12* (2013.01); *C23C 14/18* (2013.01); *C23C 14/28* (2013.01); *C23C 14/35* (2013.01); *B32B 33/00* (2013.01); *B32B 2255/20* (2013.01); *B32B 2255/205* (2013.01); *B32B 2255/26* (2013.01); *B32B 2255/28* (2013.01); *B32B 2307/416* (2013.01); *B32B 2419/00* (2013.01); *C09J 2301/122* (2020.08); *C09J 2301/16* (2020.08); *C09J 2301/302* (2020.08); *C09J 2301/312* (2020.08); *C09J 2467/006* (2013.01); *E06B 2009/2417* (2013.01)

(56) References Cited

U.S. PATENT DOCUMENTS

| | | | |
|---|---|---|---|
| 6,352,761 B1 | 3/2002 | Hebrink | |
| 6,368,699 B1 | 4/2002 | Gilbert | |
| 6,432,545 B1 * | 8/2002 | Schicht | C03C 17/3681 |
| | | | 428/428 |
| 6,449,093 B2 | 9/2002 | Hebrink | |
| 6,459,514 B2 | 10/2002 | Gilbert | |
| 6,783,349 B2 | 8/2004 | Neavin | |
| 6,827,886 B2 | 12/2004 | Neavin | |
| 8,853,301 B2 | 10/2014 | Jing | |
| 9,960,389 B1 * | 5/2018 | Hao | C08G 18/73 |
| 2002/0022156 A1 | 2/2002 | Bright | |
| 2004/0005482 A1 * | 1/2004 | Kobayashi | G02B 1/115 |
| | | | 428/701 |
| 2004/0212759 A1 * | 10/2004 | Hayashi | H01L 51/5253 |
| | | | 349/84 |
| 2006/0084780 A1 | 4/2006 | Hebrink | |
| 2006/0214152 A1 * | 9/2006 | Seo | H01L 33/62 |
| | | | 257/13 |
| 2007/0009674 A1 * | 1/2007 | Okubo | G02F 1/1333 |
| | | | 428/1.4 |
| 2007/0034856 A1 * | 2/2007 | Ohsawa | H01L 51/5048 |
| | | | 257/13 |
| 2007/0176161 A1 * | 8/2007 | Seo | H01L 51/5044 |
| | | | 257/13 |
| 2008/0160347 A1 * | 7/2008 | Wang | H01L 51/0054 |
| | | | 585/27 |
| 2009/0072230 A1 * | 3/2009 | Ito | H01L 51/5256 |
| | | | 428/448 |
| 2011/0031499 A1 * | 2/2011 | Kimura | H01L 27/1251 |
| | | | 257/E29.296 |
| 2013/0342899 A1 * | 12/2013 | Van Nutt | B32B 15/08 |
| | | | 359/350 |
| 2014/0022479 A1 * | 1/2014 | Hosaka | H01L 27/1225 |
| | | | 257/43 |
| 2014/0030830 A1 * | 1/2014 | Lee | H01L 51/5268 |
| | | | 438/29 |
| 2014/0166996 A1 * | 6/2014 | Kim | H01L 51/5203 |
| | | | 438/34 |
| 2014/0272353 A1 | 9/2014 | Ding | |
| 2015/0303336 A1 | 10/2015 | Lefebvre | |
| 2016/0306084 A1 * | 10/2016 | Padiyath | G02B 1/11 |
| 2017/0165947 A1 * | 6/2017 | Murakami | G02B 5/02 |
| 2018/0086024 A1 * | 3/2018 | Padiyath | E06B 9/24 |
| 2018/0123083 A1 * | 5/2018 | Im | H01L 51/0097 |
| 2018/0301629 A1 * | 10/2018 | Hatakeyama | H01L 51/0052 |
| 2020/0024436 A1 * | 1/2020 | Tsou | C08F 210/18 |
| 2020/0181975 A1 * | 6/2020 | Padiyath | C23C 14/18 |

FOREIGN PATENT DOCUMENTS

| | | |
|---|---|---|
| WO | WO 2009-085741 | 7/2009 |
| WO | WO 2009-140493 | 11/2009 |
| WO | WO 2011-062836 | 5/2011 |

* cited by examiner

DURABLE LOW EMISSIVITY WINDOW FILM CONSTRUCTIONS

CROSS REFERENCE TO RELATED APPLICATIONS

This application is a national stage filing under 35 U.S.C. 371 of PCT/IB32018/052573, filed Apr. 12, 2018, which claims the benefit of U.S. Provisional Application No. 62/485,701, filed Apr. 14, 2017, the disclosure of which is incorporated by reference in its/their entirety herein.

In certain embodiments, the present disclosure relates to low emissivity films and articles comprising them. Other embodiments are directed to methods of reducing emissivity in an article comprising the use of low emissivity films. In some embodiments, the low emissivity films comprise a metal layer and a pair of layers, one comprising a metal oxide such as zinc tin oxide and the other layer comprising a silicon compound, adjacent each of the two sides of the metal layer. This type of assembly may serve various purposes, including being used as a sun control film. These constructions may be used, for example, as window films on glazing units for reducing transmission of infrared radiation across the film in both directions.

BACKGROUND

A variety of approaches are used to reduce energy consumption in commercial or residential buildings, as well as in the automotive industry to help maintain a comfortable temperature in the passenger cabin with minimum energy expenditure. For example, dyed and vacuum-coated plastic films have been applied to windows to reduce heat load due to sunlight. Typically, heat load reduction is accomplished by blocking solar radiation in the visible or the infrared portions of the solar spectrum, or both (i.e., at wavelengths ranging from 400 nm to 2500 nm or greater).

In general, dyed films can control the transmission of visible light, primarily through absorption, and consequently may also provide glare reduction. However, dyed films generally do not block near-infrared solar energy and are not completely effective as solar control films. Typical dyed films also often fade with solar exposure. In addition, when films are colored with multiple dyes, the dyes may fade at different rates, causing unwanted color changes over the life of the film.

Other window films for solar control include those with vacuum-deposited layers of certain metals, such as silver, aluminum, and copper, which control solar radiation primarily by reflection. Certain thin metal films, which may remain semi-transparent in the visible spectrum and reflect near infrared radiation, are used in solar control glazing applications. Most often, silver or silver alloys are the choice of metal due to silver's high reflectance in the infrared region. However, window films having a metal layer of a sufficient thicknesses to achieve a high level of near infrared reflection may also have significant reflection in the visible region, which may be undesirable.

Of increasing interest in window film markets is the desire for heat insulation properties that offer energy savings in cold weather as well as heat rejection in warm weather. The property of primary interest in these applications is thermal emissivity, which describes the ability of a material to absorb and re-emit radiant thermal energy. A perfect absorber would have an emissivity of 1.0 and would be very efficient at transferring thermal energy, thus would be poor at insulating. Materials that reflect rather than absorb thermal energy are labelled "low emissivity" and provide insulating properties desirable in cold climates. While a typical glass or plastic window film surface has a thermal emissivity in the range of 0.84 to 0.91, an insulating material, such as aluminum foil, can have an emissivity as low as 0.02.

There is a continuing need for high visible light transmission (e.g., >70%) and low emissivity (e.g., less than 0.2) films having suitable color (e.g., neutral color). The present disclosure describes novel low emissivity films that could be used as solar control films, and which have high durability, low visible reflectance, and high visible transmission.

SUMMARY

The present disclosure is directed generally to films designed to manage heat gain and loss across glazing units. Certain embodiments of these films have high visible light transmission and low visible light reflectance, even after significant weathering, and comprise both: a) means for rejecting the infrared and ultraviolet portions of the incident solar radiation in order to reduce solar heat gain (e.g., during the summer when the energy source (sun) is outdoors) and b) means for reflecting the infrared back into the room to reduce heat loss (e.g., during the winter when the energy source (heater inside building) is indoors).

In certain embodiments, reflection of infrared radiation by the film is accomplished in part by having a metal layer sandwiched between two pairs of layers, the first pair independently comprising a metal, a metal oxide, or a metal nitride (such as, e.g., zinc tin oxide), and the second pair independently comprising a silicon compound (such as, e.g., silicon aluminum oxide or silicon oxynitride), wherein the entire previously-described stack is sandwiched between two radiation-cured acrylate layers. In general, the thickness of each of the two layers comprising a metal, a metal oxide, or a metal nitride is significantly lower than the thickness of dielectric layers normally used to sandwich metal layers used for suppressing visible reflection. The thickness of each of the layers comprising a metal, a metal oxide, or a metal nitride is, independent from each other, from 3 nm to 9 nm. Additionally, the sum of thickness of the layer comprising a metal, a metal oxide, or a metal nitride plus the thickness of the layer comprising a silicon compound on each side of the metal layer is significantly lower than comparable layers in the art. In some embodiments, the metal, metal oxide, a metal nitride of each of the layers sandwiching the metal layer is chosen, independently for each layer, from chromium, nickel, copper, alloys comprising chromium and nickel, zinc tin oxide, zirconium nitride, aluminum zinc oxide, tin oxide, and zinc oxide. In some embodiments, a metal oxide is preferred among the metal, metal oxide, and a metal nitride. In some embodiments, zinc tin oxide is preferred among the metal oxides. In other embodiments, an additional "nucleation layer" (sometimes also called a "pre-coat layer," or a "contact layer") is present, onto which the metal layer can be deposited.

In certain embodiments, the film has an emissivity of less than 0.2, a visible reflectance of less than 30%; and a visible transmission greater than 30%. In other embodiments, the film has a neutral color.

All scientific and technical terms used herein have meanings commonly used in the art unless otherwise specified. The definitions provided herein are to facilitate understanding of certain terms used frequently in this application and are not meant to exclude a reasonable interpretation of those terms in the context of the present disclosure.

Unless otherwise indicated, all numbers in the description and the claims expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviations found in their respective testing measurements.

The recitation of numerical ranges by endpoints includes all numbers subsumed within that range (e.g. a range from 1 to 5 includes, for instance, 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The term "polymer" will be understood to include polymers, copolymers (e.g., polymers formed using two or more different monomers), oligomers and combinations thereof, as well as polymers, oligomers, or copolymers that can be formed in a miscible blend. Polymers referred to in this invention include those polymerized in-situ from monomers as well as those materials that exist in a polymeric form independent of the processes used to create them herein.

The term "adjacent" refers to the relative position of two elements, such as, for example, two layers, that are close to each other and may or may not be necessarily in contact with each other or that may have one or more layers separating the two elements as understood by the context in which "adjacent" appears.

The term "immediately adjacent" refers to the relative position of two elements, such as, for example, two layers, that are next to each other and in contact with each other and have no intermediate layers separating the two elements. The term "immediately adjacent," however, encompasses situations where one or both elements (e.g., layers) have been treated with a primer, or whose surface has been modified to affect the properties thereof, such as etching, embossing, etc., or by surface treatments, such as corona or plasma treatment, etc. that may improve adhesion.

The term "outermost layer" refers to the layer in a film that is only in contact with one of the layer of the film and that is furthest away from the substrate layer. The outermost layer is not the adhesive layer that is intended to be in contact with the glazing unit (which is typically a pressure sensitive adhesive), nor is it the liner that may be protecting the adhesive layer. For example, with respect to the construction in FIG. 5, layer 114 is the outermost layer. With respect to Examples 1-15, Layer 7 is the outermost layer. With respect to comparative Examples 1 and 2, layer 7 is also the outermost layer in each case. However, with respect to comparative Example 3, layer 6 is the outermost layer. In some embodiments, the outermost layer is a protective layer.

The term "optically clear" as used herein refers to an article (e.g., a film) that has a luminous transmittance of between 3 and 80 percent and that exhibits a haze value lower than 10%. Both the luminous transmission and the total haze can be determined using, for example, a BYK Gardner Haze-gard Plus (Catalog No. 4725) according to the method of ASTM-D 1003-13, Procedure A (Hazemeter).

The term "adhesive" as used herein refers to polymeric compositions useful to adhere together two components (adherents). Examples of adhesives include heat activated adhesives and pressure sensitive adhesives.

The term "haze" as used herein refers to the percentage of transmitted light that deviates from the incident beam by more than 2.5° from the normal incident beam when passing through a material. As mentioned above, haze can be determined using the method of ASTM-D 1003-13.

The term "construction" or "assembly" are used interchangeably in this application when referring to a multilayer film, in which the different layers can be coextruded, laminated, coated one over another, or any combination thereof.

The term "film" as used herein refers, depending on the context, to either a single layer article or to a multilayer construction, where the different layers may have been laminated, extruded, coated, or any combination thereof.

The term "visible light" or "visible spectrum" as used herein refers to refers to radiation in the visible spectrum, which in this disclosure is taken to be from 400 nm to 700 nm.

The term "near infrared spectrum" or simply "infrared spectrum" as used herein refers to radiation in the in the range from 700 nm to 2500 nm.

The term "emissivity" as used herein is a measure of the efficiency that a surface emits thermal energy and is defined as the ratio of the radiation emitted by a surface to the radiation emitted by a perfect black body at the same temperature. The emissivity is a value between 0 and 1 and is measured according to ASTM C1371. One such instrument for measuring emissivity is available (model AE1 emissometer) from Devices and Services Company, Dallas, Tex.

The term "radiation-cured" in the context of curing a polymer refers to curing aided by the use of any type of electromagnetic radiation, including, for example, actinic radiation (radiation that is capable of producing photochemical reactions, such as ultraviolet radiation, vacuum UV (VUV), extreme UV (EUV or XUV)) or in some cases even visible light, electron beam, or UV radiation generated from plasma such as that used in a sputtering process, for example.

The term "visible light reflectance" as used herein refers to the percentage of solar energy in the visible spectrum that is reflected by a surface with respect to the total energy in the visible spectrum that reaches that surface. The visible light reflectance is a value between 0 and 100% and is measured according to ASTM E903, using, for example, a Perkin Elmer Lambda 1050 spectrophotometer. Additional details on the calculation of visible light reflectance is given in the section titled visible light reflectance.

The color of the specimen is measured according the methods described under section titled measurement of color. The term "reflected $\Delta L^*$" as used herein refers to the difference in the value of reflected $L^*$ before and after the weathering test, after a given exposure to total irradiance integrated over the band 295 nm to 385 nm and time, at a black panel temperature of 70° C., and humidity of 30% (or under the conditions otherwise indicated in the test).

The term "reflected Δa*" as used herein refers to the difference in the value of reflected a* before and after the weathering test, after a given exposure to total irradiance integrated over the band 295 nm to 385 nm and time, at a black panel temperature of 70° C., and humidity of 30% (or under the conditions otherwise indicated in the test).

The term "reflected Δb*" as used herein refers to the difference in the value of reflected b* before and after the weathering test, after a given exposure to total irradiance integrated over the band 295 nm to 385 nm and time, at a black panel temperature of 70° C., and humidity of 30% (or under the conditions otherwise indicated in the test).

The term "reflected ΔE" as used herein is the difference in the color in the L*a*b* color space of the specimen before and after weathering and is calculated according the following equation:

$$\Delta E = \sqrt{\Delta L^2 + \Delta a^2 + \Delta b^2}$$

Typically, film samples exposed to accelerated weathering conditions are exposed to the energy source through the outermost layer, which corresponds to the layer that will be physically exposed after installation of the window film ("coated side"). In the absence of a specific note, reported delta values after exposure to accelerated weathering (e.g., reflected ΔL*, etc.) values in this application refer to exposure through the coated side. However, in certain instances, reported delta values correspond to exposure through the "substrate" side, which corresponds to exposure of a window film installed indoors (on an indoor surface of the glazing) and being exposed to sunlight passing first through the glazing.

The term "visible light transmission" as used herein refers to the percentage of solar energy in the visible spectrum that is transmitted across a surface. The visible light transmission is a value between 0 and 100% and is measured according to ASTM E903, using, for example, in a Perkin Elmer Lambda 1050 spectrophotometer. Additional details on the calculation of visible light reflectance is given in the section titled visible light transmittance.

The term "substantially color neutral" as used herein refers to an article having a CIE L*a*b* color coordinates for a* from −10 to +10 and for b* from −10 to +10 measured according to ASTM E308. L*, a* and b* are calculated using illuminant D65 and 10° observer. A colorimeter device such as Ultrascan PRO, available from Hunter Associates Laboratory, VA is used for measuring both transmitted and reflected color. In the case of reflected color, specular included measurement configuration is used.

The term "irradiated through the substrate" as used herein in the context of accelerated weathering refers to the substrate side of the film being presented to the radiation source so that radiation passes through the substrate first before it passes through, for example, the first radiation-cured acrylate layer.

The term "irradiated through the coated side" as used herein in the context of accelerated weathering refers to the outermost layer of the film being presented to the radiation source, so that radiation passes through the outermost layer first before it passes through, for example, the substrate.

The term "dielectric layer" as used herein refers to a layer that comprises a dielectric material. A dielectric material refers to a material that is less conductive than metallic conductors. Examples of suitable dielectric materials include semiconducting materials, insulators, and certain metal oxide materials (e.g., aluminum zinc oxide and indium tin oxide). Typical dielectric layers known in the transparent infrared reflector art have a minimum thickness of about 18 nm. More commonly, a combination of dielectric layers is used in conjunction with a thin silver or silver alloy layer where the sum of thickness of the dielectric layers is typically about 30-40 nm. The thickness chosen to produce a transparent infrared reflector is a function of refractive index of the dielectric material used.

The term "substrate" or "substrate layer" as used herein refers to the material or surface on which another material or layer may be deposited.

The term "resistant to condensed water" as used herein refers to the absence of delamination, blister formation, or discoloration in any area of the exposed film after 100 hours of exposure to condensed water as described in the Examples section. Discoloration of the edge less than about 2 mm from the edge) of the exposed film is not considered failure.

The term "resistant to dilute acetic acid" as used herein refers to a change in the appearance of a film exposed to dilute acetic acid as described in the Examples section.

The term "resistant to scratching by steel wool" as used herein refers to absence of scratches after exposing the film to scratching with steel wool as described in the Examples section.

The term "resistant to cracking" as used herein refers to the absence of cracks when the test specimen is bent around a 1 mm radius under 1 kg tension as described in the Examples section.

The term "resistant to rubbing" as used herein refers to the lack of damage observed on the outermost layer or layers of the test specimen after performing the rub test as described in the Examples section.

BRIEF DESCRIPTION OF THE DRAWINGS

FIG. 5 is not drawn to scale and the relative thicknesses of each of the layers are not shown accurately in that figure. Other embodiments of the low emissivity films of the present disclosure include optional adhesive layers (not shown in FIG. 5) (such as pressure sensitive adhesive layers) adjacent (or immediately adjacent) the substrate layer 100, as well as protective liner layers (not shown in FIG. 5) adjacent (or immediately adjacent) to the pressure sensitive adhesive layer.

Figure 1:
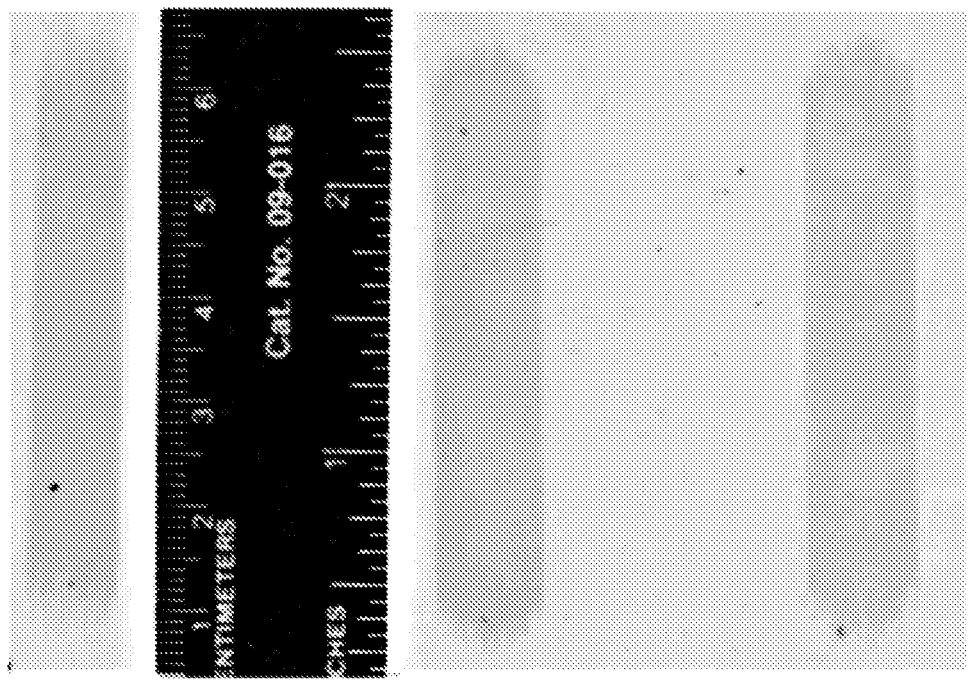
FIG. 1 shows a test specimen exhibiting complete removal of coating after completion of rub test (comparative example 4).

In the following description, reference is made to the accompanying drawings. In certain cases, each Figures may depict, by way of illustration, one or more specific embodiments of the present disclosure. It is to be understood that other embodiments different from those explicitly depicted in the Figures are contemplated and may be made without departing from the scope or spirit of the present disclosure. The following detailed description, therefore, is not to be taken in a limiting sense.

DETAILED DESCRIPTION

In one embodiment, the films of this disclosure are low emissivity films. In another embodiment, the present disclosure is directed to a film comprising: a) a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof; in preferred embodiments the silicon compound is silicon oxynitride, b) a first layer immediately adjacent the first layer comprising a silicon compound comprising a metal (which may include alloys), a metal oxide, or a metal nitride, which acts as a substrate or seed layer for the subsequent metal layer; in preferred embodiments, this layer comprises a metal oxide, and in most preferred embodiments, the metal oxide is zinc tin oxide, c) a metal layer immediately adjacent the first layer comprising a metal, a metal oxide, or a metal nitride, and d) a second layer comprising a metal (which may include alloys), a metal oxide, or a metal nitride, immediately adjacent the metal layer; in preferred embodiments, this layer comprises a metal oxide, and in most preferred embodiments, the metal oxide is zinc tin oxide, and e) a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof; in preferred embodiments the silicon compound is silicon oxide.

In some embodiments, the metal, metal oxide, or metal nitride in each of the layers sandwiching the metal layer is chosen, independently for each layer, from chromium, nickel, copper, alloys comprising chromium and nickel, zirconium nitride, aluminum zinc oxide (AZO), zinc tin oxide, tin oxide, and zinc oxide; wherein the film has an emissivity of less than 0.2, a visible reflectance of less than 25%; and a visible transmission greater than 60%.

In some embodiments, the film further comprises a first radiation-cured acrylate layer immediately adjacent the first layer comprising silicon compound. In other embodiments, the film further comprises a) a second radiation-cured acrylate layer immediately adjacent the second layer comprising a silicon compound, wherein the silicon compound is chosen independently for each layer of the two silicon-comprising layers from silicon aluminum oxide, silicon aluminum oxynitride; silicon oxide, silicon oxynitride, silicon nitride, silicon aluminum nitride and combinations thereof.

In other embodiments, the film further comprises a layer comprising a pressure sensitive adhesive immediately adjacent to the substrate and in yet other embodiments further comprises a liner immediately adjacent to the layer comprising a pressure sensitive adhesive.

Figure 5:
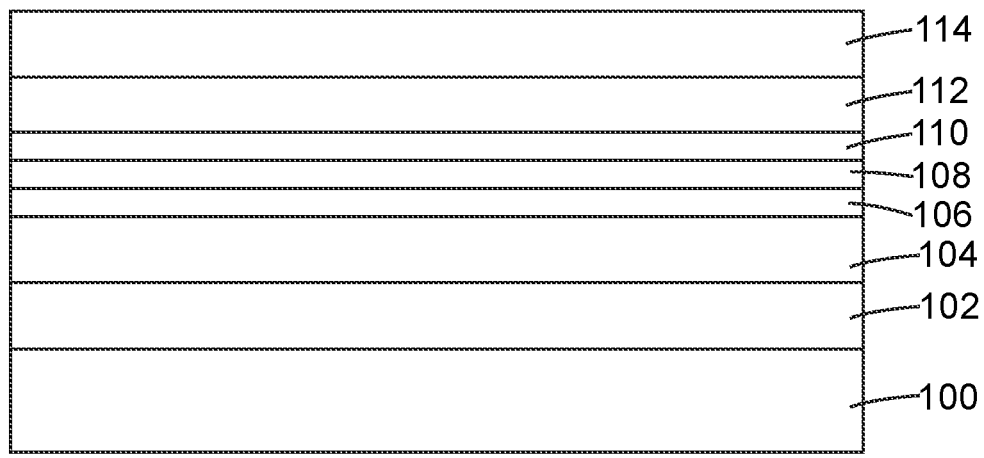
FIG. 5 shows an embodiment of a low emissivity film of the present disclosure. Layer 100 refers to the substrate. Layer 102 refers to a radiation-cured acrylate layer (e.g., in certain embodiments, it is the first-radiation-cured acrylate layer recited in the claims). Layer 104 refers to a layer comprising a silicon compound (e.g., in certain embodiments, it is the first layer comprising a silicon compound recited in the claims). Layer 106 refers to a substrate layer for the metal layer (e.g., in certain embodiments, it is the "first layer comprising a metal, a metal oxide, or a metal nitride" recited in the claims, or in other embodiments, it is the substrate layer for the metal layer recited in other claims, yet in other embodiments, it is a the first layer comprising zinc tin oxide). Layer 108 refers to a metal layer. Layer 110 refers to a layer comprising a metal, a metal oxide or a metal nitride (e.g., in certain embodiments, it is the second layer comprising a metal, a metal oxide, or a metal nitride recited in the claims, yet in other embodiments, this is a the second layer comprising zinc tin oxide). Layer 112 refers to a layer comprising a silicon compound (e.g., in certain embodiments, it is the second layer comprising a silicon compound recited in the claims). Layer 114 refers to a radiation-cured acrylate layer (e.g., in certain embodiments, it is the second radiation-cured acrylate layer recited in the claims). In the embodiment shown in FIG. 5, layer 114 is the outermost layer of the construction. In some embodiments, the outermost layer is a separate protective layer (not shown in FIG. 5).

In other embodiments, the film comprises the following layers immediately adjacent to each other in the recited order:

a substrate;

a first radiation-cured acrylate layer;

a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, a first layer comprising a metal, an alloy, a metal oxide, or a metal nitride, wherein the layer has a thickness from 3 nm to 9 nm;

a metal layer, a second layer comprising a metal, an alloy, a metal oxide, or a metal nitride, wherein the layer has a thickness from 3 nm to 9 nm;

a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and a second radiation cured acrylate layer; and wherein the film has an emissivity of less than 0.2. In other embodiments, the film further has a visible reflectance of less than 25%; a visible transmission greater than 60%, and is substantially color neutral in both transmission and reflection. An exemplary film of this kind is depicted in FIG. 5. Optionally, the film may have a pressure sensitive adhesive immediately adjacent the substrate (on the surface of the substrate opposite the surface immediately adjacent the first radiation cured acrylate layer.

In other embodiments, the film comprises the following layers immediately adjacent to each other in the recited order:

a substrate;

a first radiation-cured acrylate layer;

a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, a first layer comprising a metal oxide, preferably zinc tin oxide, wherein the layer has a thickness from 3 nm to 9 nm;

a metal layer, a second layer comprising a metal oxide, preferably zinc tin oxide, wherein the layer has a thickness from 3 nm to 9 nm;

a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and a second radiation cured acrylate layer; and wherein the film has an emissivity of less than 0.2. In other embodiments, the film further has a visible reflectance of less than 25%; a visible transmission greater than 60%, and is substantially color neutral in both transmission and reflection. An exemplary film of this kind is depicted in FIG. 5. Optionally, the film may have a pressure sensitive adhesive immediately adjacent the substrate (on the surface of the substrate opposite the surface immediately adjacent the first radiation cured acrylate layer.

Surprisingly, contrary to what one of ordinary skill in the art would have expected, the inventors have found that window films with suitable low emissivity, having neutral color in both transmission and reflection, that are resistant to weathering, can be produced with relatively thin layers of metal oxides (such as zinc tin oxide) encasing the metal layer, including relatively thin thickness for the sum of the thickness of the of the first layer comprising a silicon compound plus the thickness of the first layer comprising zinc tin oxide.

Therefore, in some embodiments, the sum of the thickness of the first layer comprising a silicon compound plus the thickness of the first layer comprising zinc tin oxide is from 15 nm to 30 nm, or from 16 nm to 30 nm, or from 20 nm to 30 nm, or from 25 nm to 30 nm, or from 25 nm to 28 nm, or from 25 nm to 27 nm.

In other embodiments, the sum of the thickness of the second layer comprising a silicon compound plus the thickness of the second layer comprising zinc tin oxide is from 9 nm to 15 nm, or from 10 nm to 14 nm, or from 10 nm to 13 nm, or from 11 nm to 13 nm, or from 10 nm to 12 nm.

In other embodiments, the present inventors envision film having any combination of a) any of the values for the sum of the thickness of the first layer comprising a silicon compound plus the thickness of the first layer comprising zinc tin oxide describe above with any of the values for sum of the thickness of the second layer comprising a silicon compound plus the thickness of the second layer comprising zinc tin oxide describe above.

In other embodiments, the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm, or 25 nm to 30 nm, or 25 nm to 35 nm, or 35 nm to 40 nm, or 30 nm to 35 nm, from 30 nm to 40 nm.

The characteristics of the different layers that can be part of the films described herein will be described in detailed below. For simplicity, the layers in the films described in this disclosure have been named using a brief description of the component(s) present in that layer. When two or more layers have similar components, the first layer that appears in the construction (starting from the substrate and proceeding in the direction towards the outermost layer) will include the qualifier "first" in its name, followed by a description of the layer. For example, the first layer that comprises a radiation-cured acrylate and that is closest to the substrate is named "first radiation-cured acrylate layer." The next layer having a radiation-cured acrylate would be called the "second radiation-cured acrylate layer" (i.e. the second layer comprising a radiation-cured acrylate wherein the "first" radiation-cured acrylate is closer to the substrate than the "second" radiation-cured acrylate). In order to avoid confusion, the layers will retain the label "first" or "second" in a given assembly even if one of the other layers is not present. For example, it is possible to have a film with a "second layer comprising a silicon compound" even if the film does not have a "first layer comprising a silicon compound." As mentioned above, the outermost layer is understood to be the layer that is the farthest from the surface of the substrate that is opposite to the surface that could be bonded to a glazing unit (e.g., via a pressure sensitive adhesive).

Substrate

In one embodiment, the substrate comprises a polyester. In other embodiments, the polyester is polyethylene terephthalate (PET). The skilled person would understand that various types of polyesters can be used as substrates for the present low emissivity films. For example, useful polyester polymers include polymers having terephthalate or naphthalate comonomer units, for example, polyethylene naphthalate (PEN), polyethylene terephthalate (PET) and copolymers and blends thereof. Examples of other suitable polyester copolymers are provided in, for example, published patent application WO 99/36262 and in WO 99/36248, both of which are incorporated herein by reference for their disclosure of polyester copolymers. Other suitable substrate materials include polycarbonates, polyarylates, and other naphthalate and terephthalate-containing polymers, such as, for example, polybutylene naphthalate (PBN), polypropylene naphtahalate (PPN), and blends and copolymers of the above with each other or with non-polyester polymers.

In other embodiments, the substrate may be (or comprise) a polymeric multilayer optical film ("MOF"). In general, an MOF comprises at least a core section that comprises a multilayer optical stack, which comprises series of two alternating polymeric layers. In addition to the multilayer optical stack, the MOF may also comprise two outer polymeric layers (first and second outer layers) one on each side of the multilayer optical stack. The two outer layers may be different from each other in their polymeric composition or they may have the same polymeric composition. Each of the two outer layers can comprise one or more polymers or blends of polymers and co-polymers. In certain embodiments, one or both of the outer layers are part of the multilayer optical stack, representing the outer layers of the multilayer optical stack. In other embodiments, the two outer layers are separate from the multilayer optical stack and their polymeric compositions are different from those of the two alternating polymeric layers in the multilayer optical stack.

In certain embodiments, the multilayer optical stack and the first and second outer layers are co-extruded. In other embodiments, the first and second outer layers are laminated on the multilayer optical stack. In certain embodiments, coextruding the first and second outer layers along with the multilayer optical stack provides protection to the multilayer optical stack during further processing.

In one embodiment, the multilayer optical stack comprises alternating layers of at least one birefringent polymer and one second polymer. The multilayer optical stacks are generally a plurality of alternating polymeric layers, which can be selected to achieve the reflection of a specific bandwidth of electromagnetic radiation.

Materials suitable for making the at least one birefringent layer of the multilayer optical stack of the present disclosure include crystalline, semi-crystalline, or liquid crystalline polymers (e.g., polyesters, copolyesters, and modified copolyesters). In this context, the term "polymer" will be understood as previously defined. Polyesters suitable for use in some exemplary multilayer optical stacks constructed according to the present disclosure generally include carboxylate and glycol subunits and can be generated by reactions of carboxylate monomer molecules with glycol monomer molecules. Each carboxylate monomer molecule has two or more carboxylic acid or ester functional groups and each glycol monomer molecule has two or more hydroxy functional groups. The carboxylate monomer molecules may all be the same or there may be two or more different types of molecules. The same applies to the glycol monomer molecules. Also included within the term "polyester" are polycarbonates derived from the reaction of glycol monomer molecules with esters of carbonic acid.

Suitable carboxylate monomer molecules for use in forming the carboxylate subunits of the polyester layers include, for example, 2,6-naphthalene dicarboxylic acid and isomers thereof; terephthalic acid; isophthalic acid; phthalic acid; azelaic acid; adipic acid; sebacic acid; norbornene dicarboxylic acid; bi-cyclo-octane dicarboxylic acid; 1,4-cyclohexane dicarboxylic acid and isomers thereof; t-butyl isophthalic acid, trimellitic acid, sodium sulfonated isophthalic acid; 4,4'-biphenyl dicarboxylic acid and isomers thereof; and lower alkyl esters of these acids, such as methyl or ethyl esters. The term "lower alkyl" refers, in this context, to C1-C10 straight-chained or branched alkyl groups.

Suitable glycol monomer molecules for use in forming glycol subunits of the polyester layers include ethylene glycol; propylene glycol; 1,4-butanediol and isomers thereof; 1,6-hexanediol; neopentyl glycol; polyethylene glycol; diethylene glycol; tricyclodecanediol; 1,4-cyclohexanedimethanol and isomers thereof; norbornanediol; bicyclo-octanediol; trimethylol propane; pentaerythritol; 1,4-benzenedimethanol and isomers thereof; bisphenol A; 1,8-dihydroxy biphenyl and isomers thereof; and 1,3-bis (2-hydroxyethoxy)benzene.

An exemplary polymer useful as the birefringent layer in the multilayer optical stacks of the present disclosure is polyethylene terephthalate (PET). Another useful birefringent polymer is polyethylene naphthalate (PEN). The molecular orientation of the birefringent polymer may be increased by stretching the material to greater stretch ratios and holding other stretching conditions fixed. Copolymers of PEN (CoPEN), such as those described in U.S. Pat. Nos. 6,352,761 and 6,449,093 are useful for their low temperature processing capability making them more coextrusion compatible with less thermally stable second polymers. Other semicrystalline polyesters suitable as birefringent polymers include, for example, polybutylene 2,6- naphthalate (PBN) and copolymers thereof, as well as copolymers of polyethylene terephthalate (PET) such as those described in U.S. Pat. No. 6,449,093 B2 or U.S. Pat. App. Pub. No. 20060084780, which are incorporated herein by reference for their disclosure of birefringent polymers and polyesters. Alternatively, syndiotactic polystyrene (sPS) is another useful birefringent polymer.

The second polymer of the multilayer optical stack can be made from a variety of polymers having glass transition temperatures compatible with that of the first birefringent polymer and having a refractive index similar to the isotropic refractive index of the birefringent polymer. Examples of other polymers suitable for use in optical stacks as the second polymer include vinyl polymers and copolymers made from monomers such as vinyl naphthalenes, styrene, maleic anhydride, acrylates, and methacrylates. Examples of such polymers include polyacrylates, polymethacrylates, such as poly (methyl methacrylate) (PMMA), and isotactic or syndiotactic polystyrene. Other polymers include condensation polymers such as polysulfones, polyamides, polyurethanes, polyamic acids, and polyimides. In addition, the second polymer can be formed from homopolymers and copolymers of polyesters, polycarbonates, fluoropolymers, and polydimethylsiloxanes, and blends thereof.

Other exemplary suitable polymers, for use as the second polymer, include homopolymers of polymethylmethacrylate (PMMA), such as those available from Ineos Acrylics, Inc., Wilmington, Del., under the trade designations CP71 and CP80, or polyethyl methacrylate (PEMA), which has a lower glass transition temperature than PMMA. Additional second polymers include copolymers of PMMA (coPMMA), such as a coPMMA made from 75 wt % methylmethacrylate (MMA) monomers and 25 wt % ethyl acrylate (EA) monomers, (available from Ineos Acrylics, Inc., under the trade designation Perspex CP63), a coPMMA formed with MMA comonomer units and n-butyl methacrylate (nBMA) comonomer units, or a blend of PMMA and poly(vinylidene fluoride) (PVDF).

Yet other suitable polymers, useful as the second polymer, include polyolefin copolymers such as poly (ethylene-co-octene) (PE-PO) available from Dupont Performance Elastomers under the trade designation Engage 8200, poly (propylene-co- ethylene) (PPPE) available from Fina Oil and Chemical Co., Dallas, Tex., under the trade designation Z9470, and a copolymer of atactic polypropylene (aPP) and isotatctic polypropylene (iPP). The multilayer optical stacks can also include, for example in the second polymer layers, a functionalized polyolefin, such as linear low density polyethylene-g-maleic anhydride (LLDPE-g-MA) such as that available from E.I. duPont de Nemours & Co., Inc., Wilmington, Del., under the trade designation Bynel 4105.

In one embodiment, polymer compositions suitable as the second polymer in alternating layers with the at least one birefringent polymer include PMMA, CoPMMA, polydimethyl siloxane oxamide based segmented copolymer (SPOX), fluoropolymers including homopolymers such as PVDF and copolymers such as those derived from tetrafluoroethylene, hexafluoropropylene, and vinylidene fluoride (THV), blends of PVDF/PMMA, acrylate copolymers, styrene, styrene copolymers, silicone copolymers, polycarbonate, polycarbonate copolymers, polycarbonate blends, blends of polycarbonate and styrene maleic anhydride, and cyclic-olefin copolymers.

The selection of the polymer compositions used in creating the multilayer optical stack can be influenced by the desire to reflect a given bandwidth of incoming radiation. Higher refractive index differences between the birefringent polymer and the second polymer create more optical power thus enabling more reflective bandwidth. Alternatively, additional layers may be employed to provide more optical power. Examples of combinations of birefringent layers and second polymer layers may include, for instance, the following: PET/coPMMA, PET/THV, PET/SPOX, PEN/THV, PEN/SPOX, PEN/PMMA, PEN/CoPMMA, CoPEN/PMMA, CoPEN/SPOX, sPS/SPOX, sPS/THV, CoPEN/THV, PET/fluoroelastomers, sPS/fluoroelastomers and CoPEN/fluoroelastomers.

Exemplary multilayer optical stacks of the present disclosure may be prepared, for example, using the apparatus and methods disclosed in U.S. Pat. No. 6,783,349, entitled "Apparatus for Making Multilayer Optical Films," U.S. Pat. No. 6,827,886, entitled "Method for Making Multilayer Optical Films," and PCT Publication Nos. WO 2009/140493 entitled "Solar Concentrating Mirror" and WO 2011/062836 entitled "Multi-layer Optical Films," all of which are incorporated herein by reference in their entireties. Examples of additional layers or coatings suitable for use with exemplary multilayer optical stacks of the present disclosure are described, for example, in U.S. Pat. Nos. 6,368,699, and 6,459,514 both entitled "Multilayer Polymer Film with Additional Coatings or Layers," both of which are incorporated herein by reference in their entireties.

In some embodiments, the multilayer optical stack may have spectral regions of high reflectivity (>90%) and other spectral regions of high transmissivity (>90%). In some embodiments, the multilayer optical stack provides high optical transmissivity over a portion of the solar spectrum and low haze and yellowing, good weatherability, good abrasion, scratch, and crack resistance during to handling and cleaning, and good adhesion to other layers, for example, other (co)polymer layers, metal oxide layers, and metal layers applied to one or both major surfaces of the films when used as substrates, for example, in compact electronic display and/or solar energy applications.

Inclusion of the multilayer optical stack in the film construction can, in some embodiments, be introduced as in-line processes.

As is known in the art, one way to produce a multilayer optical film is to biaxially stretch a multilayer stack. In certain embodiments, for a high efficiency reflective film, average transmission along each stretch direction at normal incidence over the visible spectrum (380-750 nm) is less than 10 percent (reflectance greater than 90 percent), or less than 5 percent (reflectance greater than 95 percent), or less than 2 percent (reflectance greater than 98 percent).

In one embodiment, the average transmission along each stretch direction at normal incidence over the visible spectrum (380-750 nm) is less than 1 percent (reflectance greater than 99 percent).

In other embodiments, the average transmission along each stretch direction at normal incidence over the wavelength region 380-1500 nm is less than 10 percent (reflectance greater than 90 percent), or less than 5 percent (reflectance greater than 95 percent), or less than 2 percent (reflectance greater than 98 percent), or less than 1 percent (reflectance greater than 99 percent).

In other embodiments, the average transmission at 60 degrees from the normal from 380-750 nm is less than 20 percent (reflectance greater than 80 percent), less than 10 percent (reflectance greater than 90 percent), less than 5 percent (reflectance greater than 95 percent), less than 2 percent (reflectance greater than 98 percent), or less than 1 percent (reflectance greater than 99 percent).

In certain embodiments, the films of this disclosure further comprise an adhesive, such as a pressure sensitive adhesive, adjacent (or immediately adjacent) the substrate. In other embodiments, the films comprising the adhesive adjacent (or immediately adjacent) the substrate further comprise a suitable liner.

First Radiation-Cured Acrylate Layer

The first radiation-cured acrylate layer comprises a blend of one or more acrylate polymers. As used herein, acrylate polymers include acrylates, methacrylates, and their copolymers. Acrylate polymers as used herein also include functionalized versions of acrylates, methacrylates, and their copolymers, which can be used alone or in combination with other multifunctional or monofunctional (meth)acrylates. Examples of suitable acrylate polymers also include polyacrylates, polymethacrylates, such as poly (methyl methacrylate) (PMMA), either as homopolymers or copolymers.

Examples of functionalized acrylate monomers include phenylthioethyl acrylate, hexanediol diacrylate, ethoxyethyl acrylate, phenoxyethyl acrylate, cyanoethyl (mono) acrylate, isobornyl acrylate, isobornyl methacrylate, octadecyl acrylate, isodecyl acrylate, lauryl acrylate, ~carboxyethyl acrylate, tetrahydrofurfuryl acrylate, dinitrile acrylate, pentafluorophenyl acrylate, nitrophenyl acrylate, 2-phenoxyethyl acrylate, 2-phenoxyethyl methacrylate, 2,2,2-trifluoromethyl (meth)acrylate, diethylene glycol diacrylate, triethylene glycol diacrylate, triethylene glycol dimethacrylate, tripropylene glycol diacrylate, tetraethylene glycol diacrylate, neopentyl glycol diacrylate, propoxylated neopentyl glycol diacrylate, polyethylene glycol diacrylate, tetraethylene glycol diacrylate, bisphenol A epoxy diacrylate, 1,6-hexanediol dimethacrylate, trimethylol propane triacrylate, ethoxylated trimethylol propane triacrylate, propylated trimethylol propane triacrylate, 2-biphenyl acrylate, tris(2-hydroxyethyl)-isocyanurate triacrylate, pentaerythritol triacrylate, phenylthioethyl acrylate, naphthloxyethyl acrylate, EBECRYL 130 cyclic diacrylate (available from Cytec Surface Specialties, West Paterson, N.J.), epoxy acrylate RDX80095 (available from Rad-Cure Corporation, Fairfield, N.J.), CN120E50 and CN120C60 (both available from Sartomer, Exton, Pa.), and mixtures thereof.

In certain embodiments, the acrylate polymers include blends comprising tricyclodecane dimethanol diacrylate and an acidic acrylic oligomer, such as CN147, SR833, or SR 9051, from Arkema, Inc. In other embodiments, the first radiation-cured acrylate layer further comprises an acid functionalized monomer, such as, for example, an acid-modified epoxy acrylate, such as KRM 8762, from Daicel-Allnex. In yet other embodiments the first radiation-cured acrylate further comprises additives for improving adhesion to the substrate. One such example is the use of functional silane compounds available under the brand name Dynasilan.

In some embodiments, the first radiation-cured acrylate layer is crosslinked in situ atop the substrate. In certain embodiments, the first radiation-cured acrylate layer can be formed by flash evaporation or vapor deposition of an acrylate monomer or a mixture of acrylate monomers followed by curing or crosslinking via an actinic radiation. In some embodiments, the first radiation-cured acrylate layer can be applied using other conventional coating methods such as roll coating, (e.g., gravure roll coating) die coating or spray coating (e.g., electrostatic spray coating) and cured using a method mentioned earlier.

In some embodiments, the film further comprises one or more additional radiation-cured acrylate layers immediately adjacent the first radiation-cured acrylate layer, between the first radiation-cured acrylate layer and the first layer comprising silicon compound, with each of the one or more additional radiation-cured acrylate layers having a refractive index from 1.45 to 1.60.

In some embodiments, the first radiation-cured acrylate layer is flash-evaporated and condensed on the substrate. In certain embodiments, the first radiation-cured acrylate layer has a thickness from 500 nm to 3000 nm. In some embodiments, the thickness is from 500 nm to 2000 nm, or 500 nm to 1500 nm, or 800 nm to 1400 nm, or 900 nm to 1200 nm, or 900 nm to 1100 nm, or 900 nm to 1000 nm, or 1000 nm to 1,500 nm, or 1100 nm to 1400 nm, or 1200 nm to 1400 nm, or about 1300 nm, or about 1100 nm, or about 1000 nm.

In some embodiments, the first radiation-cured acrylate layer is adjacent the substrate. In other embodiments, the first radiation-cured acrylate layer is immediately adjacent the substrate. In certain embodiments, in addition to being adjacent the substrate, the first radiation-cured acrylate layer is also adjacent the first layer comprising a silicon compound. In other embodiments, in addition to being immediately adjacent the substrate, the first radiation-cured acrylate layer is also immediately adjacent the first layer comprising a silicon compound. That is, in certain preferred embodiments, the first radiation-cured acrylate layer is between the substrate and the first layer comprising a silicon compound (either adjacent to each of those layers, or immediately adjacent to those layers).

As mentioned before, a radiation-cured layer refers to a layer in which curing is aided by the use of any type of electromagnetic radiation, including, for example, actinic radiation, electron beam, and plasma radiation. In certain embodiments, the radiation-cured layer is cured by exposure to electron beam radiation or ultraviolet radiation.

Grey Metal Layer

The grey metal layer is optional and can be located anywhere within the film. In certain embodiments, the grey metal layer is located between the first radiation cured acrylate layer and the first layer comprising silicon compound, preferably immediately adjacent to both of those layers. In other embodiments, the grey metal layer is located between the first layer comprising silicon compound and the first layer comprising a metal, an alloy, a metal oxide, or a metal nitride, preferably immediately adjacent to both of those layers.

Grey metals are typically vacuum-deposited and include stainless steel, nickel, inconel, monel, chrome, and nichrome alloys, among others known in the art. Deposited grey metal layers typically offer about the same degree of transmission in the visible and infrared portions of the solar spectrum. As a result, in general, the use of grey metal layers represent an improvement over films using dyed layers with regard to solar control. The grey metal films are relatively stable when exposed to light, oxygen, or moisture, and in those cases in which the transmission of the coatings increases due to oxidation, color changes may not be generally detectable. When applied to clear glass, most grey metals block light transmission by approximately equal amounts in both visible and near infrared portion of the solar spectrum.

First Layer Comprising a Silicon Compound

As used herein the first layer comprising a silicon compound refers to a layer comprising silicon that has been deposited under a reduced pressure process (less than 1 atm) and does not refer to layers only comprising silicon as part of silica nanoparticles. In certain embodiments, the silicon compound in this layer is chosen from silicon aluminum oxide, silicon aluminum oxynitride; silicon oxide, silicon oxynitride, silicon nitride, silicon aluminum nitride, and combinations thereof.

In some embodiments, the silicon compound in this layer is silicon aluminum oxynitride. In other embodiments, when the silicon compound is silicon aluminum oxynitride, the ratio of oxygen to nitrogen in the silicon aluminum oxynitride is from 0.1 to 1.2, or from 0.8 to 1.2, or from 0.9 to 1.2, or from 0.9 to 1.1, or from 0.3 to 0.5, or 0.4. In other embodiments, when the first layer comprising a silicon compound comprises silicon oxide, the silicon to oxygen ratio is from 0.4 to 1.0, or from 0.4 to 0.8, or 0.5. Ratios in this paragraph were determined by x-ray photoelectron spectroscopy (XPS, also known as electron spectroscopy for chemical analysis (ESCA)) as described in the Examples section.

In other embodiments, the silicon compound in the first layer comprising a silicon compound is silicon aluminum oxide. In other embodiments, when the first layer comprising a silicon compound comprises silicon aluminum oxide, the silicon to aluminum ratio is greater than 8, or from 8 to 10, or 9. In some embodiments, when the silicon compound in the first layer comprising a silicon compound is silicon aluminum oxide, the first layer comprising a silicon compound comprises 5% or less of aluminum by atomic weight.

In some embodiments, the first layer comprising a silicon compound is deposited on the first radiation-cured acrylate layer. Deposition of the first layer comprising a silicon compound can be accomplished by any means known in the art to deposit inorganic oxides. For example, in some embodiments, deposition occurs by sputtering (e.g., reactive sputtering, either from planar or rotary cathodes), evaporation (e. g., thermal, resistive, or electron beam evaporation), various chemical vapor depositions, ion-assisted e-beam evaporation, and variations thereof, under suitable gaseous atmospheres.

In certain embodiments, the silicon is sputter-deposited using a silicon target (or in other embodiments, a silicon-aluminum target) under a suitable atmosphere. In one embodiment, a target consisting of 90% silicon and 10% aluminum is used. In some embodiments, an oxygen atmosphere, or a nitrogen atmosphere is used, while in other embodiments, a mixture of oxygen and nitrogen are used.

In other embodiments, the first layer comprising a silicon compound has a thickness from 3 nm to 20 nm, or from 5 nm to 20 nm, or from 5 nm to 15 nm, or from 5 nm to 10 nm, or from 5 nm to 9 nm, or from 10 nm to 30 nm, or from 20 nm to 30 nm, or 25 nm.

In other embodiments, the first layer comprising a silicon compound may be adjacent (and in some embodiments, immediately adjacent) the first radiation-cured acrylate layer. In other embodiments, the first layer comprising a silicon compound is between the first layer comprising a metal, an alloy, a metal oxide, or a metal nitride (e.g., a first zinc tin oxide layer) and the first radiation-cured acrylate layer (either adjacent to each of those layers, or immediately adjacent to those layers).

First Layer Comprising a Metal, a Metal Oxide, or a Metal Nitride

The first layer comprising a metal (including alloys), a metal oxide, or a metal nitride is, in general, a substrate layer for the metal layer or a "seed" layer. This layer may comprise one of the following components; a metal (including alloys), a metal oxide, or a metal nitride. Although combinations of any of these components are envisioned herein, it is preferred that this layer comprise one type of the components (either a metal (or metal alloy), a metal oxide, or a metal nitride). The metal or metal alloy may be chosen from chromium, nickel, copper, alloys comprising chromium and nickel or combinations thereof. The metal oxide may be chosen from aluminum zinc oxide, tin oxide, zinc oxide, and zinc tin oxide. In certain preferred embodiments, the metal oxide is zinc tin oxide.

Deposition of the metal (or alloy), metal oxide, or metal nitride in this layer can be accomplished by using various deposition techniques with a suitable metal target under a suitable gaseous atmosphere as required (nitrogen, oxygen, or combinations thereof), such as sputtering (e.g., reactive sputtering, for example planar or rotary magnetron sputtering), evaporation (e. g., thermal, resistive, or electron beam evaporation), various chemical vapor depositions, ion-assisted e-beam evaporation, and variations thereof. Metal oxide layer may also be deposited using an oxide target in a sputtering process. The oxygen content of the deposited layer may be different from that of the target.

In some embodiments, the first layer comprising a metal, a metal oxide, or a metal nitride is adjacent the first radiation cured acrylate layer. In other embodiments, the first layer comprising a metal, a metal oxide, or a metal nitride is immediately adjacent the first radiation cured acrylate layer.

Typically, the deposition process continues for a sufficient duration to build up a suitable layer thickness as needed. The thickness of the first layer comprising a metal, a metal oxide, or a metal nitride is from 3 nm to 9 nm. In certain embodiments, the thickness is from 3 nm to 8 nm, or from 3 nm to 7 nm, or from 3 nm to 6 nm, or from 3 nm to 5 nm, or from 3 nm to 4 nm, or from 4 nm to 9 nm, 4 nm to 8 nm, or from 4 nm to 7 nm, or from 4 nm to 6 nm, or from 4 nm to 5 nm, or from 5 nm to 9 nm, 5 nm to 8 nm, or from 5 nm to 7 nm, or from 5 nm to 6 nm, or from 6 nm to 9 nm, 6 nm to 8 nm, or from 6 nm to 7 nm, or from 7 nm to 9 nm, 7 nm to 8 nm, or from 8 nm to 9 nm.

In other embodiments, the thickness of the first layer comprising a metal, a metal oxide, or a metal nitride is about 3 nm, or about 4 nm, or about 5 nm, or about 6 nm, or about 7 nm, or about 8 nm, or about 9 nm. In certain preferred embodiments, the thickness of the first layer comprising a metal, a metal oxide, or a metal nitride is from 5 nm to 7 nm.

Without wishing to be bound by theory, the inventors have discovered that in the low emissivity constructions disclosed herein, the thickness of the first layer comprising a metal, a metal oxide, or a metal nitride is significantly smaller than the thickness normally associated with typical dielectric layers surrounding a metal layer.

In addition to being adjacent the first layer comprising a silicon compound, the first layer comprising a metal, a metal oxide, or a metal nitride (in preferred embodiments being a first layer comprising zinc tin oxide) is also adjacent the metal layer. In other embodiments, in addition to being immediately adjacent to the first layer comprising a silicon compound, the first layer comprising a metal, a metal oxide, or a metal nitride (in preferred embodiments being a layer comprising zinc tin oxide) is also immediately adjacent the metal layer. That is, in certain preferred embodiments, the first layer comprising a metal, a metal oxide, or a metal nitride (in preferred embodiments being a first layer comprising zinc tin oxide) is between the metal layer and the first layer comprising a silicon compound (either adjacent to each of those layers, or immediately adjacent to those layers).

Metal Layer

In some embodiments, the metal layer comprises one or more metallic component chosen from: silver, gold, copper, nickel, iron, cobalt, zinc, and alloys of one or more metals chosen from gold, copper, nickel, iron, cobalt, and zinc. In other embodiments, the metal layer comprises a silver alloy, including silver alloys comprising 80% or more silver, such as 85% silver. In certain preferred embodiments, the metal layer comprises a silver-gold alloy.

The metal layer can be deposited using the same techniques described above for the first layer comprising a metal, a metal oxide, or a metal nitride. In some embodiments, the metal layer is deposited using physical vapor deposition (PVD) techniques. Typically, in a PVD technique, atoms of the target are ejected by high-energy particle bombardment so that they can impinge onto a suitable substrate (such as the first layer comprising a metal, a metal oxide, or a metal nitride) to form a thin film. The high-energy particles used in sputter-deposition are generated by a glow discharge, or a self-sustaining plasma created by applying, for example, an electromagnetic field to argon gas.

In other embodiments, the metal layer is deposited on the second layer comprising zirconium nitride using a magnetron sputtering process with an alloy target having approximately 85% silver and 15% gold.

In some embodiments, the thickness of the metal layer is less than 30 nm, or less than 20 nm, or less than 15 nm, or less than 14 nm, or less than 13 nm, or less than 12 nm, or less than 11 nm, or less than 10 nm, or less than 9 nm, or less than 8 nm, or less than 7 nm, that thickness can depend on the efficacy of the substrate layer. In other embodiments, the thickness of the first layer comprising zirconium nitride is from 1 to 30 nm, or from 5 to 25 nm, or from 5 to 20 nm, or from 5 to 15 nm, or from 5 to 14 nm, or from 5 to 13 nm, or from 5 to 12 nm, or from 5 to 11 nm, or from 5 to 10 nm, or from 8 to 15 nm, or from 8 to 14 nm, or from 10 nm to 12 nm.

In some embodiments, the metal layer is adjacent the first layer comprising a metal, a metal oxide, or a metal nitride (in preferred embodiments being a first layer comprising zinc tin oxide).

In certain embodiments, in addition to being adjacent the first layer comprising a metal, a metal oxide, or a metal nitride (in preferred embodiments being a first layer comprising zinc tin oxide), the metal layer is also adjacent the second layer comprising a metal, a metal oxide, or a metal nitride (in preferred embodiments being a second layer comprising zinc tin oxide). In other embodiments, in addition to being immediately adjacent the first layer comprising a metal, a metal oxide, or a metal nitride, the metal layer (in preferred embodiments being a first layer comprising zinc tin oxide) is also immediately adjacent the second layer comprising a metal, a metal oxide, or a metal nitride (in preferred embodiments being a second layer comprising zinc tin oxide). That is, in certain preferred embodiments, the metal layer is between the first layer comprising a metal, a metal oxide, or a metal nitride (in preferred embodiments being a first layer comprising zinc tin oxide) and the second layer comprising a metal, a metal oxide, or a metal nitride (in preferred embodiments being a second layer comprising zinc tin oxide) (either adjacent to each of those layers, or immediately adjacent to those layers).

Second Layer Comprising a Metal, a Metal Oxide, or a Metal Nitride

The second layer comprising a metal (including alloys), a metal oxide, or a metal nitride has, in general, similar components and characteristics to the first layer comprising a metal, a metal oxide, or a metal nitride. In preferred embodiments this layer is a second layer comprising zinc tin oxide. However, although the components for the second layer comprising a metal, a metal oxide, or a metal nitride may be chosen from the same type of components as those used in the first layer comprising a metal, a metal oxide, or a metal nitride, the components and thicknesses of the first and second layers comprising a metal, a metal oxide, or a metal nitride are chosen independently of each other.

This layer may comprise one of the following components, a metal (including alloys), a metal oxide, or a metal nitride. Although combinations of any of these components are envisioned herein, it is preferred that this layer comprise one type of the components (either a metal (or metal alloy), a metal oxide, or a metal nitride). The metal or metal alloy may be chosen from chromium, nickel, copper, alloys comprising chromium and nickel or combinations thereof. The metal oxide may be chosen from aluminum zinc oxide, tin oxide, zinc oxide, and zinc tin oxide. In certain embodiments, the metal oxide is zinc tin oxide. The metal nitride is a zirconium nitride, which may further comprise oxygen, forming zirconium oxynitride. In preferred embodiments, this layer comprises a metal oxide and the metal oxide is zinc tin oxide.

Deposition of the metal (or alloy), metal oxide, or metal nitride in this layer can be accomplished by using various deposition techniques with a suitable metal target under a suitable gaseous atmosphere as required (nitrogen, oxygen, or combinations thereof), such as sputtering (e.g., reactive sputtering, for example planar or rotary magnetron sputtering), evaporation (e. g., thermal, resistive, or electron beam evaporation), various chemical vapor depositions, ion-assisted e-beam evaporation, and variations thereof.

In some embodiments, the second layer comprising a metal, a metal oxide, or a metal nitride is adjacent the metal layer, preferably immediately adjacent the metal layer. In other embodiments, the second layer comprising a metal, a metal oxide, or a metal nitride is deposited on the metal layer, which means it is immediately adjacent the metal layer.

Typically, the deposition process continues for a sufficient duration to build up a suitable layer thickness as needed. The thickness of the second layer comprising a metal, a metal oxide, or a metal nitride is from 3 nm to 9 nm. In certain embodiments, the thickness is from 3 nm to 8 nm, or from 3 nm to 7 nm, or from 3 nm to 6 nm, or from 3 nm to 5 nm, or from 3 nm to 4 nm, or from 4 nm to 9 nm, 4 nm to 8 nm, or from 4 nm to 7 nm, or from 4 nm to 6 nm, or from 4 nm to 5 nm, or from 5 nm to 9 nm, 5 nm to 8 nm, or from 5 nm to 7 nm, or from 5 nm to 6 nm, or from 6 nm to 9 nm, 6 nm to 8 nm, or from 6 nm to 7 nm, or from 7 nm to 9 nm, 7 nm to 8 nm, or from 8 nm to 9 nm.

In other embodiments, the thickness of the second layer comprising a metal, a metal oxide, or a metal nitride is about 3 nm, or about 4 nm, or about 5 nm, or about 6 nm, or about 7 nm, or about 8 nm, or about 9 nm. In certain preferred embodiments, the thickness of the second layer comprising a metal, a metal oxide, or a metal nitride is from 5 nm to 7 nm.

Without wishing to be bound by theory, the inventors have discovered that in the constructions disclosed herein, the thickness of the second (and first) layers comprising a metal, a metal oxide, or a metal nitride (preferably each being a zinc tin oxide layer) is significantly smaller than the thicknesses normally associated with typical dielectric layers surrounding a metal layer.

In certain embodiments, the first layer comprising a metal, a metal oxide, or a metal nitride comprises a metal oxide, such as zinc tin oxide, and the second layer comprising a metal, a metal oxide, or a metal nitride comprises a metal oxide, such as zinc tin oxide.

In addition to being adjacent the metal layer, the second layer comprising a metal, a metal oxide, or a metal nitride (in preferred embodiments being a second layer comprising zinc tin oxide) is also adjacent the second layer comprising a silicon compound. In other embodiments, in addition to being immediately adjacent the metal layer, the second layer comprising a metal, a metal oxide, or a metal nitride (in preferred embodiments being a second layer comprising zinc tin oxide) is also immediately adjacent the second layer comprising a silicon compound. That is, in certain preferred embodiments, the second layer comprising a metal, a metal oxide, or a metal nitride (in preferred embodiments being a second layer comprising zinc tin oxide) is between the metal layer and the second layer comprising a silicon compound (either adjacent to each of those layers, or immediately adjacent to those layers).

Second Layer Comprising a Silicon Compound

As used herein the second layer comprising a silicon compound refers to a layer comprising silicon that has been deposited under a reduced pressure process (less than 1 atm) and does not refer to layers only comprising silicon as part of silica nanoparticles. In certain embodiments, the silicon compound in this layer is chosen from silicon aluminum oxide, silicon aluminum oxynitride; silicon oxide, silicon oxynitride, silicon nitride, silicon aluminum nitride, and combinations thereof.

In some preferred embodiments, the silicon compound in this layer is silicon aluminum oxynitride. In other embodiments, when the silicon compound is silicon aluminum oxynitride, the ratio of oxygen to nitrogen in the silicon aluminum oxynitride is from 0.1 to 1.2, or from 08 to 1.2, or from 0.9 to 1.2, or from 0.9 to 1.1, or from 0.3 to 0.5, or 0.4.

In other embodiments, when the second layer comprising a silicon compound comprises silicon aluminum oxide, the silicon to aluminum ratio is greater than 8, or from 8 to 10, or 9.

In some embodiments, the second layer comprising a silicon compound is deposited on the second layer comprising a metal, a metal oxide, or a metal nitride (in preferred embodiments being a second layer comprising zinc tin oxide). Deposition of the layer comprising a silicon compound can be accomplished by any means known in the art to deposit inorganic oxides. For example, in some embodiments, deposition occurs by sputtering (e.g., reactive sputtering, for example planar or rotary magnetron sputtering), evaporation (e. g., thermal, resistive, or electron beam evaporation), various chemical vapor depositions, ion-assisted e-beam evaporation, and variations thereof, under suitable gaseous atmospheres.

In certain embodiments, the silicon is sputter-deposited using a silicon target (or in other embodiments, a silicon-aluminum target) under a suitable atmosphere. In one embodiment, a target consisting of 90% silicon and 10% aluminum is used. In some embodiments, an oxygen atmosphere, or a nitrogen atmosphere is used, while in other embodiments, a mixture of oxygen and nitrogen are used.

In other embodiments, the second layer comprising a silicon compound has a thickness from 3 nm to 20 nm, or from 3 nm to 15 nm, or from 3 nm to 12 nm, or from 4 nm to 10 nm, or from 4 nm to 9 nm, or from 4 nm to 8 nm, or from 5 nm to 7 nm, or about 4 nm, about 5 nm, about 6 nm, about 7 nm. In certain preferred embodiments, the second layer comprising a silicon compound has a thickness from 4 nm to 8 nm, or from 5 nm to 7 nm, or about 6 nm.

In certain preferred embodiments, the second layer comprising a silicon compound may be adjacent (and in some embodiments, immediately adjacent) the second layer comprising a metal, a metal oxide, or a metal nitride (in preferred embodiments being a second layer comprising zinc tin oxide). In other embodiments, the second layer comprising a silicon compound is between the second radiation-cured acrylate layer and the second layer comprising a metal, a metal oxide, or a metal nitride (in preferred embodiments being a second layer comprising zinc tin oxide) (either adjacent to each of those layers, or immediately adjacent to those layers).

Second Radiation-Cured Acrylate Layer In certain preferred embodiments, the second radiation-cured acrylate layer comprises a blend of one or more acrylate polymers. As mentioned above, acrylate polymers include acrylates, methacrylates, and their copolymers. Acrylate polymers also include functionalized versions of acrylates, methacrylates, and their copolymers, which can be used alone or in combination with other multifunctional or monofunctional (meth)acrylates. Examples of suitable acrylate polymers also include polyacrylates, polymethacrylates, such as poly (methyl methacrylate) (PMMA), either as homopolymers or copolymers.

Examples of functionalized acrylate monomers include phenylthioethyl acrylate, hexanediol diacrylate, ethoxyethyl acrylate, phenoxyethyl acrylate, cyanoethyl (mono) acrylate, isobornyl acrylate, isobornyl methacrylate, octadecyl acrylate, isodecyl acrylate, lauryl acrylate, ~carboxyethyl acrylate, tetrahydrofurfuryl acrylate, dinitrile acrylate, pentafluorophenyl acrylate, nitrophenyl acrylate, 2-phenoxyethyl acrylate, 2-phenoxyethyl methacrylate, 2,2,2-trifluoromethyl (meth)acrylate, diethylene glycol diacrylate, triethylene glycol diacrylate, triethylene glycol dimethacrylate, tripropylene glycol diacrylate, tetraethylene glycol diacrylate, neopentyl glycol diacrylate, propoxylated neopentyl glycol diacrylate, polyethylene glycol diacrylate, tetraethylene glycol diacrylate, bisphenol A epoxy diacrylate, 1,6-hexanediol dimethacrylate, trimethylol propane triacrylate, ethoxylated trimethylol propane triacrylate, propylated trimethylol propane triacrylate, 2-biphenyl acrylate, tris(2-hydroxyethyl)-isocyanurate triacrylate, pentaerythritol triacrylate, phenylthioethyl acrylate, naphthloxyethyl acrylate, EBECRYL 130 cyclic diacrylate (available from Cytec Surface Specialties, West Paterson, N.J.), epoxy acrylate RDX80095 (available from Rad-Cure Corporation, Fairfield, N.J.), CN120E50 and CN120C60 (both available from Sartomer, Exton, Pa.), and mixtures thereof.

In certain embodiments, the acrylate polymers include blends comprising tricyclodecane dimethanol diacrylate and an acidic acrylic oligomer, such as CN147, SR833, or SR 9051, from Arkema, Inc. In other embodiments, the second radiation-cured acrylate layer further comprises an acid functionalized monomer, such as, for example, an acid-modified epoxy acrylate, such as KRM 8762, from Daicel-Allnex.

In some embodiments, the second radiation-cured acrylate layer is crosslinked in situ atop the previously deposited layer (such as the second layer comprising a metal, a metal oxide, or a metal nitride). As with the first radiation cured acrylate layer, the second radiation-cured acrylate layer can be formed by flash evaporation or vapor deposition followed by crosslinking.

In some embodiments, the second radiation-cured acrylate layer can be applied using other conventional coating methods such as roll coating (e.g., gravure roll coating) or spray coating (e.g., electrostatic spray coating).

In some embodiments, the film further comprises one or more additional radiation-cured acrylate layers immediately adjacent the second radiation-cured acrylate layer, between the second radiation-cured acrylate layer and the second layer comprising a silicon compound, with each of the one or more additional radiation-cured acrylate layers having a refractive index from 1.45 to 1.6.

In some embodiments, the second radiation-cured acrylate layer is flash-evaporated and condensed on the substrate. In certain embodiments, the second radiation-cured acrylate layer has a thickness from 20 nm to 120 nm. In other embodiments, the thickness is from 40 nm to 100 nm, or from 40 nm to 90 nm, or from 50 nm to 90 nm, or from 60 nm to 90 nm, or from 70 nm to 90 nm, or from 75 nm to 85 nm, or about 80 nm. In certain preferred embodiments, the thickness of the second radiation cured acrylate layer is from 70 nm to 90 nm.

In certain embodiments, the second radiation-cured layer is cured by exposure to electron beam radiation or ultraviolet radiation.

In other embodiments, the second radiation-cured acrylate layer is deposited on the second layer comprising a silicon compound and is the outermost layer of the film. In some embodiments, the second radiation-cured acrylate layer is adjacent (or immediately adjacent) the second layer comprising a silicon compound.

Fluoropolymer

In addition to any suitable acrylate polymers, the second radiation-cured acrylate layer can also comprise a fluoropolymer. In certain embodiments, the fluoropolymer used in the second radiation-cured acrylate layer is a material that is capable of being extruded. In some embodiments, the fluoropolymer may be a partially fluorinated polymer. For example, the fluoropolymer may be either melt-processable such as in the case of polyvinylidene fluoride (PVDF), a terpolymer of tetrafluoroethylene, hexafluoropropylene and vinylidene fluoride (THV), and other melt-processable fluoroplastics, or may be non-melt processable such as in the case of modified PTFE copolymers, such as a copolymer of TFE and low levels of fluorinated vinyl ethers and fluoroelastomers. Fluoroelastomers may be processed before they are cured by injection or compression molding or other methods normally associated with thermoplastics. Fluoroelastomers after curing or crosslinking may not be able to be further processed. Fluoroelastomers may also be coated out of solvent in their uncross linked form. In one embodiment, the fluoropolymer blended with the acrylic polymer is PVDF.

In other embodiments, the fluoropolymer is a fluoroplastic including interpolymerized units derived from VDF and fluoroethylene and may further include interpolymerized units derived from other fluorine-containing monomers, non-fluorine-containing monomers, or a combination thereof. Examples of suitable fluorine containing monomers include tetrafluoroethylene (TFE), hexafluoropropylene (HFP), chlorotrifluoroethylene (CTFE), 3-chloropentafluoropropene, perfluorinated vinyl ethers (e.g., perfluoroalkoxy vinyl ethers such as $CF_3OCF_2CF_2CF_2OCF=CF_2$ and perfluoroalkyl vinyl ethers such as $CF_3OCF=CF_2$ and $CF_3CF_2CF_2CF=CF_2$), vinyl fluoride, and fluorine-containing di-olefins such as perfluorodiallylether and perfluoro-1, 3-butadiene. Examples of suitable nonfluorine-containing monomers include olefin monomers such as ethylene, propylene, and the like.

VDF-containing fluoroplastics may be prepared using emulsion polymerization techniques as described, e.g., in Sulzbach et al., U.S. Pat. No. 4,338,237 or Grootaert, U.S. Pat. No. 5,285,002, hereby incorporated by reference for their disclosure of VDF-containing fluoroplastics and for their disclosure of methods of preparing VDF-containing fluoroplastics. Useful commercially available VDF-containing fluoroplastics include, for example, THV™ 200, THV™ 400, THV™ 5000, THV™ 610X fluoropolymers (available from Dyneon LLC, St. Paul, Minn.), KYNAR™ 740 fluoropolymer (available from Atochem North America, Philadelphia, Pa.), HYLAR™ 700 (available from Ausimont USA, Inc., Morristown, N.J.), and FLUOREL™ FC-2178 (available from Dyneon LLC).

Other examples of fluoropolymers include THE (a terpolymer of $CF_2=CF_2/CF_3CF=CF_2/CH_2=CH_2$), PVDF-HV (a copolymer $CF_2=CH_2$ (85 wt %) and $CF_3CF=CF_2$ (15 wt %)) and PVDF-CV (a copolymer of $CF_2=CH_2$ (85 wt %) and $CF_2=CFCl$ (15 wt %)).

Protective Layer(s)

The film may also have one or more protective layers. The protective layer(s) are optional. In certain embodiments, in order to protect the film, the exposed surface of the film can be protected with an additional layer that can be coated, co-extruded, or laminated onto the outermost layer. In some embodiments, when present, the protective layer becomes the outermost layer. In one embodiment, the protective layer can be coated and can comprise a scratch and wear resistant hardcoat. The protective layer can improve the durability and weatherability of the film during processing and during use of the end product. The protective layer can include any useful material, such as acrylic hardcoats, silica-based hardcoats, siloxane hardcoats, melamine hardcoats, and the like. In the case of acrylic hardcoats, the protective layer can contain one or more acrylic polymers. The hardcoat can be any useful thickness that would maintain low emissivity of the film, such as, for example, from 1 to 200 nm, or 1 to 100 nm, or 1 to 50 nm, or from 5 to 10 nm.

In other embodiments, the protective layer comprises a hydrophobic material and is adjacent, preferably immediately adjacent, the third radiation cured acrylate layer. In certain preferred embodiments, when present, such a layer comprising a hydrophobic material constitutes the outermost layer of the construction. In certain preferred embodiments, the hydrophobic protective layer comprises a fluoropolymer chosen from fluoro acrylates, fluoro silanes, fluoro silane acrylates, fluoro silicones, and fluoro silicone acrylates. A hydrophobic protective layer comprises a fluoropolymer could be prepared by vapor or solvent depositing the suitable fluoromaterial. A film having a hydrophobic protective layer may also have additional protective layer between the outermost hydrophobic protective layer and the third radiation-cured acrylate layer.

In other embodiments, the surface of the protective layer can be modified to impart hydrophobicity, for example by the use of a fluorosilane coating. One such composition can be obtained by the use of Fluorolink® S 10 silane functionalized perfluoro polyether (PFPE) available from SOLVAY SOLEXIS S.p.A., Italy. In other embodiments, the surface of the protective layer can be modified to impart hydrophilicity, for example, by the use of an acid functionalized coating. The inventors found that hydrophilicity is desirable in low emissivity films to overcome excessive fogging of the windows that are covered with the low emissivity films or coatings. One suitable composition is described in U.S. Pat. No. 8,853,301, incorporated herein by reference for its disclosure of processes for imparting hydrophilicity and for its disclosure of the resulting surface-modified materials.

Additives

In some embodiments, the outermost layer comprises slip particles. In another embodiment, the slip particles are chosen from $SiO_2$, $CaCO_3$, and organic slip particles. In one embodiment, the outer layer is free of dyes and/or particulate pigments.

In some embodiments, any layer in the film, independently of each other, may comprise a stabilizer such as a UV absorber (UVA) or hindered amine light stabilizer (HALS).

Ultraviolet absorbers function by preferentially absorbing ultraviolet radiation and dissipating it as thermal energy. Suitable UVAs may include: benzophenones (hydroxybenzophenones, e.g., Cyasorb 531 (Cytec)), benzotriazoles (hydroxyphenylbenzotriazoles, e.g., Cyasorb 5411, Tinuvin 329 (Ciba Geigy)), triazines (hydroxyphenyltriazines, e.g., Cyasorb 1164), oxanilides, (e.g., Sanuvor VSU (Clariant)) cyanoacrylates (e.g., Uvinol 3039 (BASF)), or benzoxazinones. Suitable benzophenones include, CYASORB UV-9 (2-hydroxy-4-methoxybenzophenone, CHIMASSORB 81 (or CYASORB UV 531) (2 hyroxy-4 octyloxybenzophenone). Suitable benzotriazole UVAs include compounds available from Ciba, Tarrytown, N.Y. as TINUVIN P, 213, 234, 326, 327, 328, 405 and 571, and CYASORB UV 5411 and CYASORB UV 237. Other suitable UVAs include CYASORB UV 1164 (2-[4,6-bis(2,4-dimethylphenyl)-1,3,5-triazin-2yl]-5(oxctyloxy) phenol (an exemplary triazine) and CYASORB 3638 (an exemplary benzoxiazine).

Hindered amine light stabilizers (HALS) are efficient stabilizers against light-induced degradation of most polymers. HALS do not generally absorb UV radiation, but act to inhibit degradation of the polymer. HALS typically include tetra alkyl piperidines, such as 2,2,6,6-tetramethyl-4-piperidinamine and 2,2,6,6-tetramethyl-4-piperidinol. Other suitable HALS include compounds available from Ciba, Tarrytown, N.Y. as TINUVIN 123, 144, and 292.

The UVAs and HALS disclosed explicitly here are intended to be examples of materials corresponding to each of these two categories of additives. The present inventors contemplate that other materials not disclosed here but known to those skilled in the art for their properties as UV absorbers or hindered amine light stabilizers can be used in the films of this disclosure.

Adhesives

Adhesive compositions suitable to be used with or in window films are well known to those of ordinary skill in the art. In certain embodiments, the adhesives used in the films of the present disclosure include heat activated adhesives and pressure sensitive adhesives (PSAs). Heat activated adhesives are non-tacky at room temperature but become tacky and capable of bonding to a substrate at elevated temperatures. These adhesives usually have a glass transition temperature (Tg) or melting point (Tm) above room temperature. When the temperature is elevated above the Tg or Tm, the storage modulus usually decreases and the adhesive becomes tacky.

Pressure sensitive adhesives suitable to be used in the instant films possess properties at room temperature including the following: (1) aggressive and permanent tack, (2) adherence with no more than finger pressure, (3) sufficient ability to hold onto an adherend, and (4) sufficient cohesive strength to be cleanly removable from the adherend. Materials that have been found to function well as pressure sensitive adhesives are polymers designed and formulated to exhibit the requisite viscoelastic properties resulting in a desired balance of tack, peel adhesion, and shear holding power.

The pressure sensitive adhesives may be (meth)acrylate-based pressure sensitive adhesives. Useful alkyl (meth) acrylates (i.e., acrylic acid alkyl ester monomers) include linear or branched monofunctional unsaturated acrylates or methacrylates of non-tertiary alkyl alcohols, the alkyl groups of which have from 4 to 14 and, in particular, from 4 to 12 carbon atoms. Poly(meth)acrylic pressure sensitive adhesives are derived from, for example, at least one alkyl (meth)acrylate ester monomer such as, for example, isooctyl acrylate, isononyl acrylate, 2-methyl-butyl acrylate, 2-ethyl-n-hexyl acrylate and n-butyl acrylate, isobutyl acrylate, hexyl acrylate, n-octyl acrylate, n-octyl methacrylate, n-nonyl acrylate, isoamyl acrylate, n-decyl acrylate, isodecyl acrylate, isodecyl methacrylate, isobornyl acrylate, 4-methyl-2-pentyl acrylate and dodecyl acrylate; and at least one optional co-monomer component such as, for example, (meth)acrylic acid, vinyl acetate, N-vinyl pyrrolidone, (meth)acrylamide, a vinyl ester, a fumarate, a styrene macromer, alkyl maleates and alkyl fumarates (based, respectively, on maleic and fumaric acid), or combinations thereof.

Windows and Glazing Articles

In some embodiments, the films of this disclosure are window films that may be attached to glazing substrates to provide articles, such as windows or glazing articles with low emissivity properties. Examples or suitable glazing substrates may be prepared from a variety of different materials including, for example, a variety of different types of glass or from polymeric materials such as polyolefins, polyimides, polycarbonates or polymethyl methacrylates. In some embodiments, the glazing substrate may also comprise additional layers or treatments. Examples of additional layers include, for example, additional layers of film designed to provide glare reduction, tinting, shatter resistance and the like. Examples of additional treatments that may be present on glazing substrates include, for example, coatings or various types such as hardcoats, and etchings such as decorative etchings.

As mentioned previously, in some embodiments, the films contain an adhesive layer on a suitable surface of the optical film to laminate the film to a first glazing substrate. The adhesive layer may be protected by a release liner.

As mentioned above, the adhesive may also be removable, meaning adhesives with relatively low initial adhesion, permitting temporary removability from and repositionability on a substrate, with a building of adhesion over time to form a sufficiently strong bond. This can particularly useful when large areas of a substrate are to be laminated.

In certain embodiments, the lamination of a film to a large surface substrate has been accomplished by what is sometimes called a "wet" application process. The wet application process involves spraying a liquid, typically a water/surfactant solution, onto the adhesive side of the large format article, and optionally onto the substrate surface. The liquid temporarily "detackifies" the pressure sensitive adhesive so the installer may handle, slide, and re-position the large format article into a desired position on the substrate surface. The liquid also allows the installer to pull the large format article apart if it sticks to itself or prematurely adheres to the surface of the substrate. Applying a liquid to the adhesive may also improve the appearance of the installed large format film by providing a smooth, bubble free appearance with good adhesion build on the surface of the substrate.

While the wet application process has been used successfully in many instances, it is a time consuming and messy process. Therefore, in certain embodiments, a "dry" application process may be generally desirable for installing large format films. Adhesives that are self-wetting and removable may be applied with a dry installation process. The articles are easily attached to a large substrate because they are self-wetting and yet they may be easily removed and repositioned as needed.

EXEMPLARY EMBODIMENTS

The following embodiments are exemplary in nature and are not meant to limit the scope of the invention described herein. Other natural variations of the embodiments in this disclosure would be apparent to those with ordinary skill in the art.

1. A film comprising the following elements immediately adjacent to each other in the recited order:
 a substrate;
 a first radiation-cured acrylated layer;
 a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
 a first layer comprising zinc tin oxide, wherein the layer has a thickness from 4 nm to 8 nm;
 a metal layer;
 a second layer comprising zinc tin oxide, wherein the layer has a thickness from 4 nm to 8 nm;
 a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
 a second radiation-cured acrylate layer;
 wherein the film has an emissivity of less than 0.2.

2. A film comprising the following elements immediately adjacent to each other in the recited order:
 a substrate;
 a first radiation-cured acrylate layer;
 a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
 a first layer comprising zinc tin oxide, wherein the layer has a thickness from 4 nm to 8 nm;
 a metal layer;
 a second layer comprising zinc tin oxide, wherein the layer has a thickness from 4 nm to 8 nm;
 a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
 a second radiation-cured acrylate layer;
 wherein the film has an emissivity of less than 0.2, and
 wherein the film has reflected CIELAB parameters a* from −1 to 4, and b* from 0 to 3 and L* less than 48 before weathering.

3. A film comprising the following elements immediately adjacent to each other in the recited order:
 a substrate;
 a first radiation-cured acrylate layer;
 a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
 a first layer comprising zinc tin oxide, wherein the layer has a thickness from 4 nm to 8 nm;
 a metal layer;
 a second layer comprising zinc tin oxide, wherein the layer has a thickness from 4 nm to 8 nm;
 a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
 a second radiation-cured acrylate layer;
 wherein the film has an emissivity of less than 0.2
 wherein the sum of the thickness of the first layer comprising a silicon compound plus the thickness of the first layer comprising zinc tin oxide is from 15 nm to 30 nm,
 wherein the sum of the thickness of the second layer comprising a silicon compound plus the thickness of the second layer comprising zinc tin oxide is from 9 nm to 15 nm.

4. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;
wherein the film has an emissivity of less than 0.2,
wherein the film has reflected CIELAB parameters a* from −1 to 4, and b* from 0 to 3 and L* less than 48 before weathering,
wherein the sum of the thickness of the first layer comprising a silicon compound plus the thickness of the first layer comprising zinc tin oxide is from 15 nm to 30 nm, and
wherein the sum of the thickness of the second layer comprising a silicon compound plus the thickness of the second layer comprising zinc tin oxide is from 9 nm to 15 nm.

5. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;
wherein the film has an emissivity of less than 0.2
wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 10 nm to 20 nm.

6. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;
wherein the film has an emissivity of less than 0.2 wherein the film has reflected CIELAB parameters a* from −1 to 4, and b* from 0 to 3 and L* less than 48 before weathering, and
wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 10 nm to 20 nm.

7. A film comprising the following elements immediately adjacent to each other in the recited order:
   a substrate;
   a first radiation-cured acrylated layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;
wherein the film has an emissivity of less than 0.2
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and
wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm.

8. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2,
wherein the film has reflected CIELAB parameters a* from −1 to 4, and b* from 0 to 3 and L* less than 48 before weathering,
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and
wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm.

9. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2, and
wherein the film has a reflected ΔL* value of less than 2 after exposure to 720 MJ/m2 of total irradiance integrated over the band 295 nm to 385 nm and time, at a black panel temperature of 70° C., and humidity of 30% when irradiated through the substrate.

10. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2, and
wherein the film has a reflected Δa* value of less than 2 after exposure to 720 MJ/m2 of total irradiance integrated over the band 295 nm to 385 nm and time, at a black panel temperature of 70° C., and humidity of 30% when irradiated through the substrate.

11. A film comprising the following elements immediately adjacent to each other in the recited order:
a substrate;
a first radiation-cured acrylated layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2, and
wherein the film has a reflected Δb* value of less than 5 after exposure to 720 MJ/m2 of total irradiance integrated over the band 295 nm to 385 nm and time, at a black panel temperature of 70° C., and humidity of 30% when irradiated through the substrate.

12. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2, and
wherein the film has a reflected ΔE* value of less than 5 after exposure to 720 MJ/m2 of total irradiance integrated over the band 295 nm to 385 nm and time, at a black panel temperature of 70° C., and humidity of 30% when irradiated through the substrate.

13. A film comprising the following elements immediately adjacent to each other in the recited order:
    a substrate;
    a first radiation-cured acrylate layer;
    a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
    a first layer comprising zinc tin oxide, wherein the layer has a thickness from 4 nm to 8 nm;
    a metal layer;
    a second layer comprising zinc tin oxide, wherein the layer has a thickness from 4 nm to 8 nm;
    a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
    a second radiation-cured acrylate layer;
wherein the film has an emissivity of less than 0.2, and wherein the film has an increase in emissivity of less than 0.02 after exposure to 720 MJ/m2 of total irradiance integrated over the band 295 nm to 385 nm and time, at a black panel temperature of 70° C., and humidity of 30% when irradiated through the substrate.

14. A film comprising the following elements immediately adjacent to each other in the recited order:
    a substrate;
    a first radiation-cured acrylate layer;
    a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
    a first layer comprising zinc tin oxide, wherein the layer has a thickness from 4 nm to 8 nm;
    a metal layer;
    a second layer comprising zinc tin oxide, wherein the layer has a thickness from 4 nm to 8 nm;
    a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
    a second radiation-cured acrylate layer;
wherein the film has an emissivity of less than 0.2, and wherein the film has a change in visible light transmission of less than 2% after exposure to 720 MJ/m2 of total irradiance integrated over the band 295 nm to 385 nm and time, at a black panel temperature of 70° C., and humidity of 30% when irradiated through the substrate.

15. A film comprising the following elements immediately adjacent to each other in the recited order:
    a substrate;
    a first radiation-cured acrylate layer;
    a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
    a first layer comprising zinc tin oxide, wherein the layer has a thickness from 4 nm to 8 nm;
    a metal layer;
    a second layer comprising zinc tin oxide, wherein the layer has a thickness from 4 nm to 8 nm;
    a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
    a second radiation-cured acrylate layer;
wherein the film has an emissivity of less than 0.2, and wherein the film has a reflected $\Delta L^*$ value of less than 2, a reflected $\Delta a^*$ value of less than 2, reflected $\Delta b^*$ value of less than 5, reflected $\Delta E^*$ value of less than 5, increase in emissivity of less than 0.02, and change in visible light transmission of less than 2% after exposure to 720 MJ/m2 of total irradiance integrated over the band 295 nm to 385 nm and time, at a black panel temperature of 70° C., and humidity of 30% when irradiated through the substrate.

16. A film comprising the following elements immediately adjacent to each other in the recited order:
    a substrate;
    a first radiation-cured acrylate layer;
    a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
    a first layer comprising zinc tin oxide, wherein the layer has a thickness from 4 nm to 8 nm;
    a metal layer;
    a second layer comprising zinc tin oxide, wherein the layer has a thickness from 4 nm to 8 nm;
    a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
    a second radiation-cured acrylate layer;
wherein the film has an emissivity of less than 0.2, and wherein the film has a reflected $\Delta L^*$ value of less than 2 after exposure to 3.6 MJ/m2 of total irradiance integrated over the band 295 nm to 385 nm and time, at a black panel temperature of 70° C., and humidity of 30% when irradiated through the coated side.

17. A film comprising the following elements immediately adjacent to each other in the recited order:
    a substrate;
    a first radiation-cured acrylated layer;
    a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
    a first layer comprising zinc tin oxide, wherein the layer has a thickness from 4 nm to 8 nm;
    a metal layer;
    a second layer comprising zinc tin oxide, wherein the layer has a thickness from 4 nm to 8 nm;
    a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and a second radiation-cured acrylate layer;

wherein the film has an emissivity of less than 0.2, and wherein the film has a reflected Δa* value of less than 2 after exposure to 3.6 MJ/m2 of total irradiance integrated over the band 295 nm to 385 nm and time, at a black panel temperature of 70° C., and humidity of 30% when irradiated through the coated side.

18. A film comprising the following elements immediately adjacent to each other in the recited order:

a substrate;

a first radiation-cured acrylate layer;

a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and a first layer comprising zinc tin oxide, wherein the layer has a thickness from 4 nm to 8 nm;

a metal layer;

a second layer comprising zinc tin oxide, wherein the layer has a thickness from 4 nm to 8 nm;

a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and a second radiation-cured acrylate layer;

wherein the film has an emissivity of less than 0.2, and wherein the film has a reflected Δb* value of less than 2 after exposure to 3.6 MJ/m2 of total irradiance integrated over the band 295 nm to 385 nm and time, at a black panel temperature of 70° C., and humidity of 30% when irradiated through the coated side.

19. A film comprising the following elements immediately adjacent to each other in the recited order:

a substrate;

a first radiation-cured acrylate layer;

a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and a first layer comprising zinc tin oxide, wherein the layer has a thickness from 4 nm to 8 nm;

a metal layer;

a second layer comprising zinc tin oxide, wherein the layer has a thickness from 4 nm to 8 nm;

a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and a second radiation-cured acrylate layer;

wherein the film has an emissivity of less than 0.2, and wherein the film has a reflected ΔE* value of less than 2 after exposure to 3.6 MJ/m2 of total irradiance integrated over the band 295 nm to 385 nm and time, at a black panel temperature of 70° C., and humidity of 30% when irradiated through the coated side.

20. A film comprising the following elements immediately adjacent to each other in the recited order:

a substrate;

a first radiation-cured acrylated layer;

a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and a first layer comprising zinc tin oxide, wherein the layer has a thickness from 4 nm to 8 nm;

a metal layer;

a second layer comprising zinc tin oxide, wherein the layer has a thickness from 4 nm to 8 nm;

a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and a second radiation-cured acrylate layer;

wherein the film has an emissivity of less than 0.2, and wherein the film has an increase in emissivity of less than 0.02 after exposure to 3.6 MJ/m2 of total irradiance integrated over the band 295 nm to 385 nm and time, at a black panel temperature of 70° C., and humidity of 30% when irradiated through the coated side.

21. A film comprising the following elements immediately adjacent to each other in the recited order:

a substrate;

a first radiation-cured acrylate layer;

a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and a first layer comprising zinc tin oxide, wherein the layer has a thickness from 4 nm to 8 nm;

a metal layer;

a second layer comprising zinc tin oxide, wherein the layer has a thickness from 4 nm to 8 nm;

a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and a second radiation-cured acrylate layer;

wherein the film has an emissivity of less than 0.2, and wherein the film has a change in visible light transmission of less than 2 after exposure to 3.6 MJ/m2 of total irradiance integrated over the band 295 nm to 385 nm and time, at a black panel temperature of 70° C., and humidity of 30% when irradiated through the coated side.

22. A film comprising the following elements immediately adjacent to each other in the recited order:

a substrate;

a first radiation-cured acrylate layer;

a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and a first layer comprising zinc tin oxide, wherein the layer has a thickness from 4 nm to 8 nm;

a metal layer;

a second layer comprising zinc tin oxide, wherein the layer has a thickness from 4 nm to 8 nm;

a second layer comprising a silicon compound, wherein
the silicon compound is chosen from silicon aluminum
oxide, silicon aluminum oxynitride, silicon oxide, silicon oxynitride, silicon nitride, silicon aluminum
nitride, and combinations thereof, and
a second radiation-cured acrylate layer;
wherein the film has an emissivity of less than 0.2, and
wherein the film has a reflected ΔL* value of less than 2, a
reflected Δa* value of less than 2, reflected Δb* value of less
than 2, reflected ΔE* value of less than 2, increase in
emissivity of less than 0.02, and change in visible light
transmission of less than 2 after exposure to 3.6 MJ/m2 of
total irradiance integrated over the band 295 nm to 385 nm
and time, at a black panel temperature of 70° C., and
humidity of 30% when irradiated through the coated side.

23. A film comprising the following elements immediately
adjacent to each other in the recited order:
a substrate;
a first radiation-cured acrylated layer;
a first layer comprising a silicon compound, wherein the
silicon compound is chosen from silicon aluminum
oxide, silicon aluminum oxynitride, silicon oxide, silicon oxynitride, silicon nitride, silicon aluminum
nitride, and combinations thereof, and
a first layer comprising zinc tin oxide, wherein the layer
has a thickness from 4 nm to 8 nm;
a metal layer;
a second layer comprising zinc tin oxide, wherein the
layer has a thickness from 4 nm to 8 nm;
a second layer comprising a silicon compound, wherein
the silicon compound is chosen from silicon aluminum
oxide, silicon aluminum oxynitride, silicon oxide, silicon oxynitride, silicon nitride, silicon aluminum
nitride, and combinations thereof, and
a second radiation-cured acrylate layer;
wherein the film has an emissivity of less than 0.2, and
wherein the film has a reflected ΔL* value of less than 2 after
exposure to 7.2 MJ/m2 of total irradiance integrated over the
band 295 nm to 385 nm and time, at a black panel temperature of 70° C., and humidity of 30% when irradiated through
the coated side.

24. A film comprising the following elements immediately
adjacent to each other in the recited order:
a substrate;
a first radiation-cured acrylate layer;
a first layer comprising a silicon compound, wherein the
silicon compound is chosen from silicon aluminum
oxide, silicon aluminum oxynitride, silicon oxide, silicon oxynitride, silicon nitride, silicon aluminum
nitride, and combinations thereof, and
a first layer comprising zinc tin oxide, wherein the layer
has a thickness from 4 nm to 8 nm;
a metal layer;
a second layer comprising zinc tin oxide, wherein the
layer has a thickness from 4 nm to 8 nm;
a second layer comprising a silicon compound, wherein
the silicon compound is chosen from silicon aluminum
oxide, silicon aluminum oxynitride, silicon oxide, silicon oxynitride, silicon nitride, silicon aluminum
nitride, and combinations thereof, and
a second radiation-cured acrylate layer;
wherein the film has an emissivity of less than 0.2, and
wherein the film has a reflected Δa* value of less than 2 after
exposure to 7.2 MJ/m2 of total irradiance integrated over the
band 295 nm to 385 nm and time, at a black panel temperature of 70° C., and humidity of 30% when irradiated through
the coated side.

25. A film comprising the following elements immediately
adjacent to each other in the recited order:
a substrate;
a first radiation-cured acrylate layer;
a first layer comprising a silicon compound, wherein the
silicon compound is chosen from silicon aluminum
oxide, silicon aluminum oxynitride, silicon oxide, silicon oxynitride, silicon nitride, silicon aluminum
nitride, and combinations thereof, and
a first layer comprising zinc tin oxide, wherein the layer
has a thickness from 4 nm to 8 nm;
a metal layer;
a second layer comprising zinc tin oxide, wherein the
layer has a thickness from 4 nm to 8 nm;
a second layer comprising a silicon compound, wherein
the silicon compound is chosen from silicon aluminum
oxide, silicon aluminum oxynitride, silicon oxide, silicon oxynitride, silicon nitride, silicon aluminum
nitride, and combinations thereof, and
a second radiation-cured acrylate layer;
wherein the film has an emissivity of less than 0.2, and
wherein the film has a reflected Δb* value of less than 3 after
exposure to 7.2 MJ/m2 of total irradiance integrated over the
band 295 nm to 385 nm and time, at a black panel temperature of 70° C., and humidity of 30% when irradiated through
the coated side.

26. A film comprising the following elements immediately
adjacent to each other in the recited order:
a substrate;
a first radiation-cured acrylated layer;
a first layer comprising a silicon compound, wherein the
silicon compound is chosen from silicon aluminum
oxide, silicon aluminum oxynitride, silicon oxide, silicon oxynitride, silicon nitride, silicon aluminum
nitride, and combinations thereof, and
a first layer comprising zinc tin oxide, wherein the layer
has a thickness from 4 nm to 8 nm;
a metal layer;
a second layer comprising zinc tin oxide, wherein the
layer has a thickness from 4 nm to 8 nm;
a second layer comprising a silicon compound, wherein
the silicon compound is chosen from silicon aluminum
oxide, silicon aluminum oxynitride, silicon oxide, silicon oxynitride, silicon nitride, silicon aluminum
nitride, and combinations thereof, and
a second radiation-cured acrylate layer;
wherein the film has an emissivity of less than 0.2, and
wherein the film has a reflected ΔE* value of less than 2 after
exposure to 7.2 MJ/m2 of total irradiance integrated over the
band 295 nm to 385 nm and time, at a black panel temperature of 70° C., and humidity of 30% when irradiated through
the coated side.

27. A film comprising the following elements immediately
adjacent to each other in the recited order:
a substrate;
a first radiation-cured acrylate layer;
a first layer comprising a silicon compound, wherein the
silicon compound is chosen from silicon aluminum
oxide, silicon aluminum oxynitride, silicon oxide, silicon oxynitride, silicon nitride, silicon aluminum
nitride, and combinations thereof, and
a first layer comprising zinc tin oxide, wherein the layer
has a thickness from 4 nm to 8 nm;
a metal layer;
a second layer comprising zinc tin oxide, wherein the
layer has a thickness from 4 nm to 8 nm;

a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and a second radiation-cured acrylate layer;

wherein the film has an emissivity of less than 0.2, and wherein the film has an increase in emissivity of less than 0.02 after exposure to 7.2 MJ/m2 of total irradiance integrated over the band 295 nm to 385 nm and time, at a black panel temperature of 70° C., and humidity of 30% when irradiated through the coated side.

28. A film comprising the following elements immediately adjacent to each other in the recited order:

a substrate;

a first radiation-cured acrylate layer;

a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and a first layer comprising zinc tin oxide, wherein the layer has a thickness from 4 nm to 8 nm;

a metal layer;

a second layer comprising zinc tin oxide, wherein the layer has a thickness from 4 nm to 8 nm;

a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and a second radiation-cured acrylate layer;

wherein the film has an emissivity of less than 0.2, and wherein the film has a change in visible light transmission of less than 3 after exposure to 7.2 MJ/m2 of total irradiance integrated over the band 295 nm to 385 nm and time, at a black panel temperature of 70° C., and humidity of 30% when irradiated through the coated side.

29. A film comprising the following elements immediately adjacent to each other in the recited order:

a substrate;

a first radiation-cured acrylate layer;

a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and a first layer comprising zinc tin oxide, wherein the layer has a thickness from 4 nm to 8 nm;

a metal layer;

a second layer comprising zinc tin oxide, wherein the layer has a thickness from 4 nm to 8 nm;

a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and a second radiation-cured acrylate layer;

wherein the film has an emissivity of less than 0.2, and wherein the film has a reflected $\Delta L^*$ value of less than 3, a reflected $\Delta a^*$ value of less than 2, reflected $\Delta b^*$ value of less than 2, reflected $\Delta E^*$ value of less than 2, increase in emissivity of less than 0.02, and change in visible light transmission of less than 2 after exposure to 7.2 MJ/m2 of total irradiance integrated over the band 295 nm to 385 nm and time, at a black panel temperature of 70° C., and humidity of 30% when irradiated through the coated side.

30. A film comprising the following elements immediately adjacent to each other in the recited order:

a substrate;

a first radiation-cured acrylate layer;

a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and a first layer comprising zinc tin oxide, wherein the layer has a thickness from 4 nm to 8 nm;

a metal layer;

a second layer comprising zinc tin oxide, wherein the layer has a thickness from 4 nm to 8 nm;

a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and a second radiation-cured acrylate layer;

wherein the film has an emissivity of less than 0.2, wherein the film has reflected CIELAB parameters a* from −1 to 4, and b* from 0 to 3 and L* less than 48 before weathering, and wherein the film has a reflected $\Delta L^*$ value of less than 2 after exposure to 720 MJ/m2 of total irradiance integrated over the band 295 nm to 385 nm and time, at a black panel temperature of 70° C., and humidity of 30% when irradiated through the substrate.

31. A film comprising the following elements immediately adjacent to each other in the recited order:

a substrate;

a first radiation-cured acrylate layer;

a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and a first layer comprising zinc tin oxide, wherein the layer has a thickness from 4 nm to 8 nm;

a metal layer;

a second layer comprising zinc tin oxide, wherein the layer has a thickness from 4 nm to 8 nm;

a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and a second radiation-cured acrylate layer;

wherein the film has an emissivity of less than 0.2, wherein the film has reflected CIELAB parameters a* from −1 to 4, and b* from 0 to 3 and L* less than 48 before weathering, and wherein the film has a reflected $\Delta a^*$ value of less than 2 after exposure to 720 MJ/m2 of total irradiance integrated over the band 295 nm to 385 nm and time, at a black panel temperature of 70° C., and humidity of 30% when irradiated through the substrate.

32. A film comprising the following elements immediately adjacent to each other in the recited order:

a substrate;

a first radiation-cured acrylate layer;

a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2,
wherein the film has reflected CIELAB a* from −1 to 4, and b* from 0 to 3 and L* less than 48 before weathering, and
wherein the film has a reflected Δb* value of less than 5 after exposure to 720 MJ/m2 of total irradiance integrated over the band 295 nm to 385 nm and time, at a black panel temperature of 70° C., and humidity of 30% when irradiated through the substrate.

33. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2,
wherein the film has reflected CIELAB parameters a* from −1 to 4, and b* from 0 to 3 and L* less than 48 before weathering, and
wherein the film has a reflected ΔE* value of less than 5 after exposure to 720 MJ/m2 of total irradiance integrated over the band 295 nm to 385 nm and time, at a black panel temperature of 70° C., and humidity of 30% when irradiated through the substrate.

34. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2,
wherein the film has reflected CIELAB parameters a* from −10 to 3, and b* from 0 to 3 and L* less than 48 before weathering, and
wherein the film has an increase in emissivity of less than 0.02 after exposure to 720 MJ/m2 of total irradiance integrated over the band 295 nm to 385 nm and time, at a black panel temperature of 70° C., and humidity of 30% when irradiated through the substrate.

35. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2,
wherein the film has reflected CIELAB parameters a* from −1 to 4, and b* from 0 to 3 and L* less than 48 before weathering, and
wherein the film has a change in visible light transmission of less than 2% after exposure to 720 MJ/m2 of total irradiance integrated over the band 295 nm to 385 nm and time, at a black panel temperature of 70° C., and humidity of 30% when irradiated through the substrate.

36. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2,
wherein the film has reflected CIELAB parameters a* from −1 to 4, and b* from 0 to 3 and L* less than 48 before weathering, and wherein the film has a reflected ΔL* value of less than 2, a reflected Δa* value of less than 2, reflected Δb* value of less than 5, reflected ΔE* value of less than 5, increase in emissivity of less than 0.02, and change in visible light transmission of less than 2% after exposure to 720 MJ/m2 of total irradiance integrated over the band 295 nm to 385 nm and time, at a black panel temperature of 70° C., and humidity of 30% when irradiated through the substrate.

37. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;
wherein the film has an emissivity of less than 0.2,
wherein the film has reflected CIELAB parameters a* from −1 to 4, and b* from 0 to 3 and L* less than 48 before weathering, and
wherein the film has a reflected ΔL* value of less than 2 after exposure to 3.6 MJ/m2 of total irradiance integrated over the band 295 nm to 385 nm and time, at a black panel temperature of 70° C., and humidity of 30% when irradiated through the coated side.

38. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;
wherein the film has an emissivity of less than 0.2,
wherein the film has reflected CIELAB parameters a* from −1 to 4, and b* from 0 to 3 and L* less than 48 before weathering, and
wherein the film has a reflected Δa* value of less than 2 after exposure to 3.6 MJ/m2 of total irradiance integrated over the band 295 nm to 385 nm and time, at a black panel temperature of 70° C., and humidity of 30% when irradiated through the coated side.

39. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;
wherein the film has an emissivity of less than 0.2,
wherein the film has reflected CIELAB parameters a* from −1 to 4, and b* from 0 to 3 and L* less than 48 before weathering, and
wherein the film has a reflected Δb* value of less than 2 after exposure to 3.6 MJ/m2 of total irradiance integrated over the band 295 nm to 385 nm and time, at a black panel temperature of 70° C., and humidity of 30% when irradiated through the coated side.

40. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;
wherein the film has an emissivity of less than 0.2,
wherein the film has reflected CIELAB parameters a* from −1 to 4, and b* from 0 to 3 and L* less than 48 before weathering, and
wherein the film has a reflected ΔE* value of less than 2 after exposure to 3.6 MJ/m2 of total irradiance integrated over the band 295 nm to 385 nm and time, at a black panel temperature of 70° C., and humidity of 30% when irradiated through the coated side.

41. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2,
wherein the film has reflected CIELAB parameters a* from −1 to 4, and b* from 0 to 3 and L* less than 48, before weathering, and
wherein the film has an increase in emissivity of less than 0.02 after exposure to 3.6 MJ/m2 of total irradiance integrated over the band 295 nm to 385 nm and time, at a black panel temperature of 70° C., and humidity of 30% when irradiated through the coated side.

42. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2,
wherein the film has reflected CIELAB parameters a* from −1 to 4, and b* from 0 to 3 and L* less than 48 before weathering, and
wherein the film has a change in visible light transmission of less than 2 after exposure to 3.6 MJ/m2 of total irradiance integrated over the band 295 nm to 385 nm and time, at a black panel temperature of 70° C., and humidity of 30% when irradiated through the coated side.

43. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2,
wherein the film has reflected CIELAB parameters a* from −1 to 4, and b* from 0 to 3 and L* less than 48 before weathering, and
wherein the film has a reflected $\Delta L^*$ value of less than 2, a reflected $\Delta a^*$ value of less than 2, reflected $\Delta b^*$ value of less than 2, reflected $\Delta E^*$ value of less than 2, increase in emissivity of less than 0.02, and change in visible light transmission of less than 2 after exposure to 3.6 MJ/m2 of total irradiance integrated over the band 295 nm to 385 nm and time, at a black panel temperature of 70° C., and humidity of 30% when irradiated through the coated side.

44. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2,
wherein the film has reflected CIELAB parameters a* from −1 to 4, and b* from 0 to 3 and L* less than 48 before weathering, and
wherein the film has a reflected $\Delta L^*$ value of less than 2 after exposure to 7.2 MJ/m2 of total irradiance integrated over the band 295 nm to 385 nm and time, at a black panel temperature of 70° C., and humidity of 30% when irradiated through the coated side.

45. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and a second radiation-cured acrylate layer;

wherein the film has an emissivity of less than 0.2, wherein the film has reflected CIELAB parameters a* from −1 to 4, and b* from 0 to 3 and L* less than 48 before weathering, and wherein the film has a reflected Δa* value of less than 2 after exposure to 7.2 MJ/m2 of total irradiance integrated over the band 295 nm to 385 nm and time, at a black panel temperature of 70° C., and humidity of 30% when irradiated through the coated side.

46. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;

wherein the film has an emissivity of less than 0.2, wherein the film has reflected CIELAB parameters a* from −1 to 4, and b* from 0 to 3 and L* less than 48 before weathering, and wherein the film has a reflected Δb* value of less than 3 after exposure to 7.2 MJ/m2 of total irradiance integrated over the band 295 nm to 385 nm and time, at a black panel temperature of 70° C., and humidity of 30% when irradiated through the coated side.

47. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;

wherein the film has an emissivity of less than 0.2, wherein the film has reflected CIELAB parameters a* from −1 to 4, and b* from 0 to 3 and L* less than 48 before weathering, and wherein the film has a reflected ΔE* value of less than 2 after exposure to 7.2 MJ/m2 of total irradiance integrated over the band 295 nm to 385 nm and time, at a black panel temperature of 70° C., and humidity of 30% when irradiated through the coated side.

48. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;

wherein the film has an emissivity of less than 0.2, wherein the film has reflected CIELAB parameters a* from −1 to 4, and b* from 0 to 3 and L* less than 48 before weathering, and wherein the film has an increase in emissivity of less than 0.02 after exposure to 7.2 MJ/m2 of total irradiance integrated over the band 295 nm to 385 nm and time, at a black panel temperature of 70° C., and humidity of 30% when irradiated through the coated side.

49. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;

wherein the film has an emissivity of less than 0.2, wherein the film has reflected CIELAB parameters a* from −1 to 4, and b* from 0 to 3 and L* less than 48 before weathering, and wherein the film has a change in visible light transmission of less than 3 after exposure to 7.2 MJ/m2 of total irradiance integrated over the band 295 nm to 385 nm and time, at a black panel temperature of 70° C., and humidity of 30% when irradiated through the coated side.

50. A film comprising the following elements immediately adjacent to each other in the recited order:
- a substrate;
- a first radiation-cured acrylate layer;
- a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
- a first layer comprising zinc tin oxide, wherein the layer has a thickness from 4 nm to 8 nm;
- a metal layer;
- a second layer comprising zinc tin oxide, wherein the layer has a thickness from 4 nm to 8 nm;
- a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
- a second radiation-cured acrylate layer;

wherein the film has an emissivity of less than 0.2,
wherein the film has reflected CIELAB parameters a* from −1 to 4, and b* from 0 to 3 and L* less than 48 before weathering, and
wherein the film has a reflected ΔL* value of less than 3, a reflected Δa* value of less than 2, reflected Δb* value of less than 2, reflected ΔE* value of less than 2, increase in emissivity of less than 0.02, and change in visible light transmission of less than 2 after exposure to 7.2 MJ/m2 of total irradiance integrated over the band 295 nm to 385 nm and time, at a black panel temperature of 70° C., and humidity of 30% when irradiated through the coated side.

51. A film comprising the following elements immediately adjacent to each other in the recited order:
- a substrate;
- a first radiation-cured acrylate layer;
- a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
- a first layer comprising zinc tin oxide, wherein the layer has a thickness from 4 nm to 8 nm;
- a metal layer;
- a second layer comprising zinc tin oxide, wherein the layer has a thickness from 4 nm to 8 nm;
- a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
- a second radiation-cured acrylate layer;

wherein the film has an emissivity of less than 0.2
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and
wherein the film has a reflected ΔL* value of less than 2 after exposure to 720 MJ/m2 of total irradiance integrated over the band 295 nm to 385 nm and time, at a black panel temperature of 70° C., and humidity of 30% when irradiated through the substrate.

52. A film comprising the following elements immediately adjacent to each other in the recited order:
- a substrate;
- a first radiation-cured acrylate layer;
- a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
- a first layer comprising zinc tin oxide, wherein the layer has a thickness from 4 nm to 8 nm;
- a metal layer;
- a second layer comprising zinc tin oxide, wherein the layer has a thickness from 4 nm to 8 nm;
- a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
- a second radiation-cured acrylate layer;

wherein the film has an emissivity of less than 0.2
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and
wherein the film has a reflected Δa* value of less than 2 after exposure to 720 MJ/m2 of total irradiance integrated over the band 295 nm to 385 nm and time, at a black panel temperature of 70° C., and humidity of 30% when irradiated through the substrate.

53. A film comprising the following elements immediately adjacent to each other in the recited order:
- a substrate;
- a first radiation-cured acrylate layer;
- a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
- a first layer comprising zinc tin oxide, wherein the layer has a thickness from 4 nm to 8 nm;
- a metal layer;
- a second layer comprising zinc tin oxide, wherein the layer has a thickness from 4 nm to 8 nm;
- a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
- a second radiation-cured acrylate layer;

wherein the film has an emissivity of less than 0.2
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and
wherein the film has a reflected Δb* value of less than 5 after exposure to 720 MJ/m2 of total irradiance integrated over the band 295 nm to 385 nm and time, at a black panel temperature of 70° C., and humidity of 30% when irradiated through the substrate.

54. A film comprising the following elements immediately adjacent to each other in the recited order:
a substrate;
a first radiation-cured acrylated layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and
wherein the film has a reflected ΔE* value of less than 5 after exposure to 720 MJ/m2 of total irradiance integrated over the band 295 nm to 385 nm and time, at a black panel temperature of 70° C., and humidity of 30% when irradiated through the substrate.

55. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and
wherein the film has an increase in emissivity of less than 0.02 after exposure to 720 MJ/m2 of total irradiance integrated over the band 295 nm to 385 nm and time, at a black panel temperature of 70° C., and humidity of 30% when irradiated through the substrate.

56. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and
wherein the film has a change in visible light transmission of less than 2% after exposure to 720 MJ/m2 of total irradiance integrated over the band 295 nm to 385 nm and time, at a black panel temperature of 70° C., and humidity of 30% when irradiated through the substrate.

57. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and
wherein the film has a reflected ΔL* value of less than 2, a reflected Δa* value of less than 2, reflected Δb* value of less than 5, reflected ΔE* value of less than 5, increase in emissivity of less than 0.02, and change in visible light transmission of less than 2% after exposure to 720 MJ/m2 of total irradiance integrated over the band 295 nm to 385 nm and time, at a black panel temperature of 70° C., and humidity of 30% when irradiated through the substrate.

58. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;
wherein the film has an emissivity of less than 0.2
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and
wherein the film has a reflected $\Delta L^*$ value of less than 2 after exposure to 3.6 MJ/m2 of total irradiance integrated over the band 295 nm to 385 nm and time, at a black panel temperature of 70° C., and humidity of 30% when irradiated through the coated side.

59. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;
wherein the film has an emissivity of less than 0.2
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and
wherein the film has a reflected $\Delta a^*$ value of less than 2 after exposure to 3.6 MJ/m2 of total irradiance integrated over the band 295 nm to 385 nm and time, at a black panel temperature of 70° C., and humidity of 30% when irradiated through the coated side.

60. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;
wherein the film has an emissivity of less than 0.2
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and
wherein the film has a reflected $\Delta b^*$ value of less than 2 after exposure to 3.6 MJ/m2 of total irradiance integrated over the band 295 nm to 385 nm and time, at a black panel temperature of 70° C., and humidity of 30% when irradiated through the coated side.

61. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;
wherein the film has an emissivity of less than 0.2
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and
wherein the film has a reflected $\Delta E^*$ value of less than 2 after exposure to 3.6 MJ/m2 of total irradiance integrated over the band 295 nm to 385 nm and time, at a black panel temperature of 70° C., and humidity of 30% when irradiated through the coated side.

62. A film comprising the following elements immediately adjacent to each other in the recited order:
    a substrate;
    a first radiation-cured acrylate layer;
    a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
    a first layer comprising zinc tin oxide, wherein the layer has a thickness from 4 nm to 8 nm;
    a metal layer;
    a second layer comprising zinc tin oxide, wherein the layer has a thickness from 4 nm to 8 nm;
    a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
    a second radiation-cured acrylate layer;
wherein the film has an emissivity of less than 0.2
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and
wherein the film has an increase in emissivity of less than 0.02 after exposure to 3.6 MJ/m2 of total irradiance integrated over the band 295 nm to 385 nm and time, at a black panel temperature of 70° C., and humidity of 30% when irradiated through the coated side.

63. A film comprising the following elements immediately adjacent to each other in the recited order:
    a substrate;
    a first radiation-cured acrylated layer;
    a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
    a first layer comprising zinc tin oxide, wherein the layer has a thickness from 4 nm to 8 nm;
    a metal layer;
    a second layer comprising zinc tin oxide, wherein the layer has a thickness from 4 nm to 8 nm;
    a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
    a second radiation-cured acrylate layer;
wherein the film has an emissivity of less than 0.2
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and
wherein the film has a change in visible light transmission of less than 2 after exposure to 3.6 MJ/m2 of total irradiance integrated over the band 295 nm to 385 nm and time, at a black panel temperature of 70° C., and humidity of 30% when irradiated through the coated side.

64. A film comprising the following elements immediately adjacent to each other in the recited order:
    a substrate;
    a first radiation-cured acrylate layer;
    a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
    a first layer comprising zinc tin oxide, wherein the layer has a thickness from 4 nm to 8 nm;
    a metal layer;
    a second layer comprising zinc tin oxide, wherein the layer has a thickness from 4 nm to 8 nm;
    a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
    a second radiation-cured acrylate layer;
wherein the film has an emissivity of less than 0.2
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and
wherein the film has a reflected ΔL* value of less than 2, a reflected Δa* value of less than 2, reflected Δb* value of less than 2, reflected ΔE* value of less than 2, increase in emissivity of less than 0.02, and change in visible light transmission of less than 2 after exposure to 3.6 MJ/m2 of total irradiance integrated over the band 295 nm to 385 nm and time, at a black panel temperature of 70° C., and humidity of 30% when irradiated through the coated side.

65. A film comprising the following elements immediately adjacent to each other in the recited order:
    a substrate;
    a first radiation-cured acrylate layer;
    a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
    a first layer comprising zinc tin oxide, wherein the layer has a thickness from 4 nm to 8 nm;
    a metal layer;
    a second layer comprising zinc tin oxide, wherein the layer has a thickness from 4 nm to 8 nm;
    a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
    a second radiation-cured acrylate layer;
wherein the film has an emissivity of less than 0.2
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and wherein the film has a reflected ΔL* value of less than 2 after exposure to 7.2 MJ/m2 of total irradiance integrated over the band 295 nm to 385 nm and time, at a black panel temperature of 70° C., and humidity of 30% when irradiated through the coated side.

66. A film comprising the following elements immediately adjacent to each other in the recited order:
    a substrate;
    a first radiation-cured acrylate layer;
    a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
    a first layer comprising zinc tin oxide, wherein the layer has a thickness from 4 nm to 8 nm;
    a metal layer;
    a second layer comprising zinc tin oxide, wherein the layer has a thickness from 4 nm to 8 nm;
    a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
    a second radiation-cured acrylate layer;
wherein the film has an emissivity of less than 0.2
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and
wherein the film has a reflected Δa* value of less than 2 after exposure to 7.2 MJ/m2 of total irradiance integrated over the band 295 nm to 385 nm and time, at a black panel temperature of 70° C., and humidity of 30% when irradiated through the coated side.

67. A film comprising the following elements immediately adjacent to each other in the recited order:
    a substrate;
    a first radiation-cured acrylate layer;
    a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
    a first layer comprising zinc tin oxide, wherein the layer has a thickness from 4 nm to 8 nm;
    a metal layer;
    a second layer comprising zinc tin oxide, wherein the layer has a thickness from 4 nm to 8 nm;
    a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
    a second radiation-cured acrylate layer;
wherein the film has an emissivity of less than 0.2
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and wherein the film has a reflected Δb* value of less than 3 after exposure to 7.2 MJ/m2 of total irradiance integrated over the band 295 nm to 385 nm and time, at a black panel temperature of 70° C., and humidity of 30% when irradiated through the coated side.

68. A film comprising the following elements immediately adjacent to each other in the recited order:
    a substrate;
    a first radiation-cured acrylate layer;
    a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
    a first layer comprising zinc tin oxide, wherein the layer has a thickness from 4 nm to 8 nm;
    a metal layer;
    a second layer comprising zinc tin oxide, wherein the layer has a thickness from 4 nm to 8 nm;
    a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
    a second radiation-cured acrylate layer;
wherein the film has an emissivity of less than 0.2
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and
wherein the film has a reflected ΔE* value of less than 2 after exposure to 7.2 MJ/m2 of total irradiance integrated over the band 295 nm to 385 nm and time, at a black panel temperature of 70° C., and humidity of 30% when irradiated through the coated side.

69. A film comprising the following elements immediately adjacent to each other in the recited order:
    a substrate;
    a first radiation-cured acrylate layer;
    a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
    a first layer comprising zinc tin oxide, wherein the layer has a thickness from 4 nm to 8 nm;
    a metal layer;
    a second layer comprising zinc tin oxide, wherein the layer has a thickness from 4 nm to 8 nm;
    a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
    a second radiation-cured acrylate layer;
wherein the film has an emissivity of less than 0.2
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and wherein the film has an increase in emissivity of less than 0.02 after exposure to 7.2 MJ/m2 of total irradiance integrated over the band 295 nm to 385 nm and time, at a black panel temperature of 70° C., and humidity of 30% when irradiated through the coated side.

70. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;
wherein the film has an emissivity of less than 0.2
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and
wherein the film has a change in visible light transmission of less than 3 after exposure to 7.2 MJ/m2 of total irradiance integrated over the band 295 nm to 385 nm and time, at a black panel temperature of 70° C., and humidity of 30% when irradiated through the coated side.

71. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;
wherein the film has an emissivity of less than 0.2
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and
wherein the film has a reflected $\Delta L^*$ value of less than 3, a reflected $\Delta a^*$ value of less than 2, reflected $\Delta b^*$ value of less than 2, reflected $\Delta E^*$ value of less than 2, increase in emissivity of less than 0.02, and change in visible light transmission of less than 2 after exposure to 7.2 MJ/m2 of total irradiance integrated over the band 295 nm to 385 nm and time, at a black panel temperature of 70° C., and humidity of 30% when irradiated through the coated side.

72. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;
wherein the film has an emissivity of less than 0.2,
wherein the film has reflected CIELAB parameters a* from −1 to 4, and b* from 0 to 3 and L* less than 48 before weathering,
wherein the sum of the thickness of the first layer comprising a silicon compound plus the thickness of the first layer comprising zinc tin oxide is from 15 nm to 30 nm, and
wherein the sum of the thickness of the second layer comprising a silicon compound plus the thickness of the second layer comprising zinc tin oxide is from 9 nm to 15 nm, and
wherein the film has a reflected $\Delta L^*$ value of less than 2 after exposure to 720 MJ/m2 of total irradiance integrated over the band 295 nm to 385 nm and time, at a black panel temperature of 70° C., and humidity of 30% when irradiated through the substrate.

73. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and a second radiation-cured acrylate layer;

wherein the film has an emissivity of less than 0.2, wherein the film has reflected CIELAB parameters a* from −1 to 4, and b* from 0 to 3 and L* less than 48 before weathering, wherein the sum of the thickness of the first layer comprising a silicon compound plus the thickness of the first layer comprising zinc tin oxide is from 15 nm to 30 nm, and wherein the sum of the thickness of the second layer comprising a silicon compound plus the thickness of the second layer comprising zinc tin oxide is from 9 nm to 15 nm, and wherein the film has a reflected Δa* value of less than 2 after exposure to 720 MJ/m2 of total irradiance integrated over the band 295 nm to 385 nm and time, at a black panel temperature of 70° C., and humidity of 30% when irradiated through the substrate.

74. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;

wherein the film has an emissivity of less than 0.2, wherein the film has reflected CIELAB parameters a* from −1 to 4, and b* from 0 to 3 and L* less than 48 before weathering, wherein the sum of the thickness of the first layer comprising a silicon compound plus the thickness of the first layer comprising zinc tin oxide is from 15 nm to 30 nm, and wherein the sum of the thickness of the second layer comprising a silicon compound plus the thickness of the second layer comprising zinc tin oxide is from 9 nm to 15 nm, and wherein the film has a reflected Δb* value of less than 5 after exposure to 720 MJ/m2 of total irradiance integrated over the band 295 nm to 385 nm and time, at a black panel temperature of 70° C., and humidity of 30% when irradiated through the substrate.

75. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;

wherein the film has an emissivity of less than 0.2, wherein the film has reflected CIELAB parameters a* from −1 to 4, and b* from 0 to 3 and L* less than 48 before weathering, wherein the sum of the thickness of the first layer comprising a silicon compound plus the thickness of the first layer comprising zinc tin oxide is from 15 nm to 30 nm, and wherein the sum of the thickness of the second layer comprising a silicon compound plus the thickness of the second layer comprising zinc tin oxide is from 9 nm to 15 nm, and wherein the film has a reflected ΔE* value of less than 5 after exposure to 720 MJ/m2 of total irradiance integrated over the band 295 nm to 385 nm and time, at a black panel temperature of 70° C., and humidity of 30% when irradiated through the substrate.

76. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;

wherein the film has an emissivity of less than 0.2, wherein the film has reflected CIELAB parameters a* from −1 to 4, and b* from 0 to 3 and L* less than 48 before weathering, wherein the sum of the thickness of the first layer comprising a silicon compound plus the thickness of the first layer comprising zinc tin oxide is from 15 nm to 30 nm, and wherein the sum of the thickness of the second layer comprising a silicon compound plus the thickness of the second layer comprising zinc tin oxide is from 9 nm to 15 nm, and wherein the film has an increase in emissivity of less than 0.02 after exposure to 720 MJ/m2 of total irradiance integrated over the band 295 nm to 385 nm and time, at a black panel temperature of 70° C., and humidity of 30% when irradiated through the substrate.

77. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2,
wherein the film has reflected CIELAB parameters a* from −1 to 4, and b* from 0 to 3 and L* less than 48 before weathering,
wherein the sum of the thickness of the first layer comprising a silicon compound plus the thickness of the first layer comprising zinc tin oxide is from 15 nm to 30 nm, and
wherein the sum of the thickness of the second layer comprising a silicon compound plus the thickness of the second layer comprising zinc tin oxide is from 9 nm to 15 nm, and
wherein the film has a change in visible light transmission of less than 2% after exposure to 720 MJ/m2 of total irradiance integrated over the band 295 nm to 385 nm and time, at a black panel temperature of 70° C., and humidity of 30% when irradiated through the substrate.

78. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2,
wherein the film has reflected CIELAB parameters a* from −1 to 4, and b* from 0 to 3 and L* less than 48 before weathering,
wherein the sum of the thickness of the first layer comprising a silicon compound plus the thickness of the first layer comprising zinc tin oxide is from 15 nm to 30 nm, and
wherein the sum of the thickness of the second layer comprising a silicon compound plus the thickness of the second layer comprising zinc tin oxide is from 9 nm to 15 nm, and
wherein the film has a reflected ΔL* value of less than 2, a reflected Δa* value of less than 2, reflected Δb* value of less than 5, reflected ΔE* value of less than 5, increase in emissivity of less than 0.02, and change in visible light transmission of less than 2% after exposure to 720 MJ/m2 of total irradiance integrated over the band 295 nm to 385 nm and time, at a black panel temperature of 70° C., and humidity of 30% when irradiated through the substrate.

79. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2,
wherein the film has reflected CIELAB parameters a* from −1 to 4, and b* from 0 to 3 and L* less than 48 before weathering,
wherein the sum of the thickness of the first layer comprising a silicon compound plus the thickness of the first layer comprising zinc tin oxide is from 15 nm to 30 nm, and
wherein the sum of the thickness of the second layer comprising a silicon compound plus the thickness of the second layer comprising zinc tin oxide is from 9 nm to 15 nm, and
wherein the film has a reflected ΔL* value of less than 2 after exposure to 3.6 MJ/m2 of total irradiance integrated over the band 295 nm to 385 nm and time, at a black panel temperature of 70° C., and humidity of 30% when irradiated through the coated side.

80. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and a second radiation-cured acrylate layer;

wherein the film has an emissivity of less than 0.2, wherein the film has reflected CIELAB parameters a* from −1 to 4, and b* from 0 to 3 and L* less than 48 before weathering, wherein the sum of the thickness of the first layer comprising a silicon compound plus the thickness of the first layer comprising zinc tin oxide is from 15 nm to 30 nm, and wherein the sum of the thickness of the second layer comprising a silicon compound plus the thickness of the second layer comprising zinc tin oxide is from 9 nm to 15 nm, and wherein the film has a reflected Δa* value of less than 2 after exposure to 3.6 MJ/m2 of total irradiance integrated over the band 295 nm to 385 nm and time, at a black panel temperature of 70° C., and humidity of 30% when irradiated through the coated side.

81. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;
wherein the film has an emissivity of less than 0.2,
wherein the film has Reflected CIELAB parameter a* from −1 to 4, and b* from 0 to 3 and L* less than 48 before weathering,
wherein the sum of the thickness of the first layer comprising a silicon compound plus the thickness of the first layer comprising zinc tin oxide is from 15 nm to 30 nm, and
wherein the sum of the thickness of the second layer comprising a silicon compound plus the thickness of the second layer comprising zinc tin oxide is from 9 nm to 15 nm, and
wherein the film has a reflected Δb* value of less than 2 after exposure to 3.6 MJ/m2 of total irradiance integrated over the band 295 nm to 385 nm and time, at a black panel temperature of 70° C., and humidity of 30% when irradiated through the coated side.

82. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;
wherein the film has an emissivity of less than 0.2,
wherein the film has reflected CIELAB parameters a* from −1 to 4, and b* from 0 to 3 and L* less than 48 before weathering,
wherein the sum of the thickness of the first layer comprising a silicon compound plus the thickness of the first layer comprising zinc tin oxide is from 15 nm to 30 nm, and
wherein the sum of the thickness of the second layer comprising a silicon compound plus the thickness of the second layer comprising zinc tin oxide is from 9 nm to 15 nm, and
wherein the film has a reflected ΔE* value of less than 2 after exposure to 3.6 MJ/m2 of total irradiance integrated over the band 295 nm to 385 nm and time, at a black panel temperature of 70° C., and humidity of 30% when irradiated through the coated side.

83. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;
wherein the film has an emissivity of less than 0.2,
wherein the film has reflected CIELAB parameters a* from −1 to 4, and b* from 0 to 3 and L* less than 48 before weathering,
wherein the sum of the thickness of the first layer comprising a silicon compound plus the thickness of the first layer comprising zinc tin oxide is from 15 nm to 30 nm, and
wherein the sum of the thickness of the second layer comprising a silicon compound plus the thickness of the second layer comprising zinc tin oxide is from 9 nm to 15 nm, and
wherein the film has an increase in emissivity of less than 0.02 after exposure to 3.6 MJ/m2 of total irradiance integrated over the band 295 nm to 385 nm and time, at a black panel temperature of 70° C., and humidity of 30% when irradiated through the coated side.

84. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2,
wherein the film has reflected CIELAB parameters a* from −1 to 4, and b* from 0 to 3 and L* less than 48 before weathering,
wherein the sum of the thickness of the first layer comprising a silicon compound plus the thickness of the first layer comprising zinc tin oxide is from 15 nm to 30 nm, and
wherein the sum of the thickness of the second layer comprising a silicon compound plus the thickness of the second layer comprising zinc tin oxide is from 9 nm to 15 nm, and
wherein the film has a change in visible light transmission of less than 2 after exposure to 3.6 MJ/m2 of total irradiance integrated over the band 295 nm to 385 nm and time, at a black panel temperature of 70° C., and humidity of 30% when irradiated through the coated side.

85. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2,
wherein the film has reflected CIELAB parameters a* from −1 to 4, and b* from 0 to 3 and L* less than 48 before weathering,
wherein the sum of the thickness of the first layer comprising a silicon compound plus the thickness of the first layer comprising zinc tin oxide is from 15 nm to 30 nm, and
wherein the sum of the thickness of the second layer comprising a silicon compound plus the thickness of the second layer comprising zinc tin oxide is from 9 nm to 15 nm, and
wherein the film has a reflected ΔL* value of less than 2, a reflected Δa* value of less than 2, reflected Δb* value of less than 2, reflected ΔE* value of less than 2, increase in emissivity of less than 0.02, and change in visible light transmission of less than 2 after exposure to 3.6 MJ/m2 of total irradiance integrated over the band 295 nm to 385 nm and time, at a black panel temperature of 70° C., and humidity of 30% when irradiated through the coated side.

86. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2,
wherein the film has reflected CIELAB parameters a* from −1 to 4, and b* from 0 to 3 and L* less than 48 before weathering,
wherein the sum of the thickness of the first layer comprising a silicon compound plus the thickness of the first layer comprising zinc tin oxide is from 15 nm to 30 nm, and
wherein the sum of the thickness of the second layer comprising a silicon compound plus the thickness of the second layer comprising zinc tin oxide is from 9 nm to 15 nm, and
wherein the film has a reflected ΔL* value of less than 2 after exposure to 7.2 MJ/m2 of total irradiance integrated over the band 295 nm to 385 nm and time, at a black panel temperature of 70° C., and humidity of 30% when irradiated through the coated side.

87. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and a second radiation-cured acrylate layer;

wherein the film has an emissivity of less than 0.2, wherein the film has reflected CIELAB parameters a* from −1 to 4, and b* from 0 to 3 and L* less than 48 before weathering, wherein the sum of the thickness of the first layer comprising a silicon compound plus the thickness of the first layer comprising zinc tin oxide is from 15 nm to 30 nm, and wherein the sum of the thickness of the second layer comprising a silicon compound plus the thickness of the second layer comprising zinc tin oxide is from 9 nm to 15 nm, and wherein the film has a reflected Δa* value of less than 2 after exposure to 7.2 MJ/m2 of total irradiance integrated over the band 295 nm to 385 nm and time, at a black panel temperature of 70° C., and humidity of 30% when irradiated through the coated side.

88. A film comprising the following elements immediately adjacent to each other in the recited order:

a substrate;

a first radiation-cured acrylate layer;

a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and a first layer comprising zinc tin oxide, wherein the layer has a thickness from 4 nm to 8 nm;

a metal layer;

a second layer comprising zinc tin oxide, wherein the layer has a thickness from 4 nm to 8 nm;

a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and a second radiation-cured acrylate layer;

wherein the film has an emissivity of less than 0.2, wherein the film has reflected CIELAB parameters a* from −1 to 4, and b* from 0 to 3 and L* less than 48 before weathering, wherein the sum of the thickness of the first layer comprising a silicon compound plus the thickness of the first layer comprising zinc tin oxide is from 15 nm to 30 nm, and wherein the sum of the thickness of the second layer comprising a silicon compound plus the thickness of the second layer comprising zinc tin oxide is from 9 nm to 15 nm, and wherein the film has a reflected Δb* value of less than 3 after exposure to 7.2 MJ/m2 of total irradiance integrated over the band 295 nm to 385 nm and time, at a black panel temperature of 70° C., and humidity of 30% when irradiated through the coated side.

89. A film comprising the following elements immediately adjacent to each other in the recited order:

a substrate;

a first radiation-cured acrylate layer;

a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and a first layer comprising zinc tin oxide, wherein the layer has a thickness from 4 nm to 8 nm;

a metal layer;

a second layer comprising zinc tin oxide, wherein the layer has a thickness from 4 nm to 8 nm;

a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and a second radiation-cured acrylate layer;

wherein the film has an emissivity of less than 0.2, wherein the film has reflected CIELAB parameters a* from −1 to 4, and b* from 0 to 3 and L* less than 48 before weathering, wherein the sum of the thickness of the first layer comprising a silicon compound plus the thickness of the first layer comprising zinc tin oxide is from 15 nm to 30 nm, and wherein the sum of the thickness of the second layer comprising a silicon compound plus the thickness of the second layer comprising zinc tin oxide is from 9 nm to 15 nm, and wherein the film has a reflected ΔE* value of less than 2 after exposure to 7.2 MJ/m2 of total irradiance integrated over the band 295 nm to 385 nm and time, at a black panel temperature of 70° C., and humidity of 30% when irradiated through the coated side.

90. A film comprising the following elements immediately adjacent to each other in the recited order:

a substrate;

a first radiation-cured acrylate layer;

a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and a first layer comprising zinc tin oxide, wherein the layer has a thickness from 4 nm to 8 nm;

a metal layer;

a second layer comprising zinc tin oxide, wherein the layer has a thickness from 4 nm to 8 nm;

a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and a second radiation-cured acrylate layer;

wherein the film has an emissivity of less than 0.2, wherein the film has reflected CIELAB parameters a* from −1 to 4, and b* from 0 to 3 and L* less than 48 before weathering, wherein the sum of the thickness of the first layer comprising a silicon compound plus the thickness of the first layer comprising zinc tin oxide is from 15 nm to 30 nm, and wherein the sum of the thickness of the second layer comprising a silicon compound plus the thickness of the second layer comprising zinc tin oxide is from 9 nm to 15 nm, and wherein the film has an increase in emissivity of less than 0.02 after exposure to 7.2 MJ/m2 of total irradiance integrated over the band 295 nm to 385 nm and time, at a black panel temperature of 70° C., and humidity of 30% when irradiated through the coated side.

91. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2,
wherein the film has reflected CIELAB parameters a* from −1 to 4, and b* from 0 to 3 and L* less than 48 before weathering,
wherein the sum of the thickness of the first layer comprising a silicon compound plus the thickness of the first layer comprising zinc tin oxide is from 15 nm to 30 nm, and
wherein the sum of the thickness of the second layer comprising a silicon compound plus the thickness of the second layer comprising zinc tin oxide is from 9 nm to 15 nm, and
wherein the film has a change in visible light transmission of less than 3 after exposure to 7.2 MJ/m2 of total irradiance integrated over the band 295 nm to 385 nm and time, at a black panel temperature of 70° C., and humidity of 30% when irradiated through the coated side.

92. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2,
wherein the film has reflected CIELAB parameters a* from −1 to 4, and b* from 0 to 3 and L* less than 48 before weathering,
wherein the sum of the thickness of the first layer comprising a silicon compound plus the thickness of the first layer comprising zinc tin oxide is from 15 nm to 30 nm, and
wherein the sum of the thickness of the second layer comprising a silicon compound plus the thickness of the second layer comprising zinc tin oxide is from 9 nm to 15 nm, and
wherein the film has a reflected ΔL* value of less than 3, a reflected Δa* value of less than 2, reflected Δb* value of less than 2, reflected ΔE* value of less than 2, increase in emissivity of less than 0.02, and change in visible light transmission of less than 2 after exposure to 7.2 MJ/m2 of total irradiance integrated over the band 295 nm to 385 nm and time, at a black panel temperature of 70° C., and humidity of 30% when irradiated through the coated side.

93. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2
wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 10 nm to 20 nm, and
wherein the film has a reflected ΔL* value of less than 2 after exposure to 720 MJ/m2 of total irradiance integrated over the band 295 nm to 385 nm and time, at a black panel temperature of 70° C., and humidity of 30% when irradiated through the substrate.

94. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2
wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 10 nm to 20 nm, and wherein the film has a reflected Δa* value of less than 2 after exposure to 720 MJ/m2 of total irradiance integrated over the band 295 nm to 385 nm and time, at a black panel temperature of 70° C., and humidity of 30% when irradiated through the substrate.

95. A film comprising the following elements immediately adjacent to each other in the recited order:
    a substrate;
    a first radiation-cured acrylate layer;
    a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
    a first layer comprising zinc tin oxide, wherein the layer has a thickness from 4 nm to 8 nm;
    a metal layer;
    a second layer comprising zinc tin oxide, wherein the layer has a thickness from 4 nm to 8 nm;
    a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
    a second radiation-cured acrylate layer;
    wherein the film has an emissivity of less than 0.2
    wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 10 nm to 20 nm, and wherein the film has a reflected Δb* value of less than 5 after exposure to 720 MJ/m2 of total irradiance integrated over the band 295 nm to 385 nm and time, at a black panel temperature of 70° C., and humidity of 30% when irradiated through the substrate.

96. A film comprising the following elements immediately adjacent to each other in the recited order:
    a substrate;
    a first radiation-cured acrylate layer;
    a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
    a first layer comprising zinc tin oxide, wherein the layer has a thickness from 4 nm to 8 nm;
    a metal layer;
    a second layer comprising zinc tin oxide, wherein the layer has a thickness from 4 nm to 8 nm;
    a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
    a second radiation-cured acrylate layer;
    wherein the film has an emissivity of less than 0.2
    wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 10 nm to 20 nm, and wherein the film has a reflected ΔE* value of less than 5 after exposure to 720 MJ/m2 of total irradiance integrated over the band 295 nm to 385 nm and time, at a black panel temperature of 70° C., and humidity of 30% when irradiated through the substrate.

97. A film comprising the following elements immediately adjacent to each other in the recited order:
    a substrate;
    a first radiation-cured acrylate layer;
    a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
    a first layer comprising zinc tin oxide, wherein the layer has a thickness from 4 nm to 8 nm;
    a metal layer;
    a second layer comprising zinc tin oxide, wherein the layer has a thickness from 4 nm to 8 nm;
    a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
    a second radiation-cured acrylate layer;
    wherein the film has an emissivity of less than 0.2
    wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 10 nm to 20 nm, and wherein the film has an increase in emissivity of less than 0.02 after exposure to 720 MJ/m2 of total irradiance integrated over the band 295 nm to 385 nm and time, at a black panel temperature of 70° C., and humidity of 30% when irradiated through the substrate.

98. A film comprising the following elements immediately adjacent to each other in the recited order:
    a substrate;
    a first radiation-cured acrylate layer;
    a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
    a first layer comprising zinc tin oxide, wherein the layer has a thickness from 4 nm to 8 nm;
    a metal layer;
    a second layer comprising zinc tin oxide, wherein the layer has a thickness from 4 nm to 8 nm;
    a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
    a second radiation-cured acrylate layer;
    wherein the film has an emissivity of less than 0.2
    wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 10 nm to 20 nm, and wherein the film has a change in visible light transmission of less than 2% after exposure to 720 MJ/m2 of total irradiance integrated over the band 295 nm to 385 nm and time, at a black panel temperature of 70° C., and humidity of 30% when irradiated through the substrate.

99. A film comprising the following elements immediately adjacent to each other in the recited order:
- a substrate;
- a first radiation-cured acrylate layer;
- a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
- a first layer comprising zinc tin oxide, wherein the layer has a thickness from 4 nm to 8 nm;
- a metal layer;
- a second layer comprising zinc tin oxide, wherein the layer has a thickness from 4 nm to 8 nm;
- a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
- a second radiation-cured acrylate layer;

wherein the film has an emissivity of less than 0.2 wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 10 nm to 20 nm, and wherein the film has a reflected $\Delta L^*$ value of less than 2, a reflected $\Delta a^*$ value of less than 2, reflected $\Delta b^*$ value of less than 5, reflected $\Delta E^*$ value of less than 5, increase in emissivity of less than 0.02, and change in visible light transmission of less than 2% after exposure to 720 MJ/m2 of total irradiance integrated over the band 295 nm to 385 nm and time, at a black panel temperature of 70° C., and humidity of 30% when irradiated through the substrate.

100. A film comprising the following elements immediately adjacent to each other in the recited order:
- a substrate;
- a first radiation-cured acrylate layer;
- a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
- a first layer comprising zinc tin oxide, wherein the layer has a thickness from 4 nm to 8 nm;
- a metal layer;
- a second layer comprising zinc tin oxide, wherein the layer has a thickness from 4 nm to 8 nm;
- a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
- a second radiation-cured acrylate layer;

wherein the film has an emissivity of less than 0.2 wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 10 nm to 20 nm, and wherein the film has a reflected $\Delta L^*$ value of less than 2 after exposure to 3.6 MJ/m2 of total irradiance integrated over the band 295 nm to 385 nm and time, at a black panel temperature of 70° C., and humidity of 30% when irradiated through the coated side.

101. A film comprising the following elements immediately adjacent to each other in the recited order:
- a substrate;
- a first radiation-cured acrylate layer;
- a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
- a first layer comprising zinc tin oxide, wherein the layer has a thickness from 4 nm to 8 nm;
- a metal layer;
- a second layer comprising zinc tin oxide, wherein the layer has a thickness from 4 nm to 8 nm;
- a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
- a second radiation-cured acrylate layer;

wherein the film has an emissivity of less than 0.2 wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 10 nm to 20 nm, and wherein the film has a reflected $\Delta a^*$ value of less than 2 after exposure to 3.6 MJ/m2 of total irradiance integrated over the band 295 nm to 385 nm and time, at a black panel temperature of 70° C., and humidity of 30% when irradiated through the coated side.

102. A film comprising the following elements immediately adjacent to each other in the recited order:
- a substrate;
- a first radiation-cured acrylate layer;
- a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
- a first layer comprising zinc tin oxide, wherein the layer has a thickness from 4 nm to 8 nm;
- a metal layer;
- a second layer comprising zinc tin oxide, wherein the layer has a thickness from 4 nm to 8 nm;
- a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
- a second radiation-cured acrylate layer;

wherein the film has an emissivity of less than 0.2 wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 10 nm to 20 nm, and wherein the film has a reflected $\Delta b^*$ value of less than 2 after exposure to 3.6 MJ/m2 of total irradiance integrated over the band 295 nm to 385 nm and time, at a black panel temperature of 70° C., and humidity of 30% when irradiated through the coated side.

103. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;
wherein the film has an emissivity of less than 0.2
wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 10 nm to 20 nm, and wherein the film has a reflected ΔE* value of less than 2 after exposure to 3.6 MJ/m2 of total irradiance integrated over the band 295 nm to 385 nm and time, at a black panel temperature of 70° C., and humidity of 30% when irradiated through the coated side.

104. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;
wherein the film has an emissivity of less than 0.2
wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 10 nm to 20 nm, and wherein the film has an increase in emissivity of less than 0.02 after exposure to 3.6 MJ/m2 of total irradiance integrated over the band 295 nm to 385 nm and time, at a black panel temperature of 70° C., and humidity of 30% when irradiated through the coated side.

105. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;
wherein the film has an emissivity of less than 0.2
wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 10 nm to 20 nm, and wherein the film has a change in visible light transmission of less than 2 after exposure to 3.6 MJ/m2 of total irradiance integrated over the band 295 nm to 385 nm and time, at a black panel temperature of 70° C., and humidity of 30% when irradiated through the coated side.

106. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;
wherein the film has an emissivity of less than 0.2
wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 10 nm to 20 nm, and wherein the film has a reflected ΔL* value of less than 2, a reflected Δa* value of less than 2, reflected Δb* value of less than 2, reflected ΔE* value of less than 2, increase in emissivity of less than 0.02, and change in visible light transmission of less than 2 after exposure to 3.6 MJ/m2 of total irradiance integrated over the band 295 nm to 385 nm and time, at a black panel temperature of 70° C., and humidity of 30% when irradiated through the coated side.

107. A film comprising the following elements immediately adjacent to each other in the recited order:
- a substrate;
- a first radiation-cured acrylate layer;
- a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
- a first layer comprising zinc tin oxide, wherein the layer has a thickness from 4 nm to 8 nm;
- a metal layer;
- a second layer comprising zinc tin oxide, wherein the layer has a thickness from 4 nm to 8 nm;
- a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
- a second radiation-cured acrylate layer;

wherein the film has an emissivity of less than 0.2 wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 10 nm to 20 nm, and wherein the film has a reflected $\Delta L^*$ value of less than 2 after exposure to 7.2 MJ/m2 of total irradiance integrated over the band 295 nm to 385 nm and time, at a black panel temperature of 70° C., and humidity of 30% when irradiated through the coated side.

108. A film comprising the following elements immediately adjacent to each other in the recited order:
- a substrate;
- a first radiation-cured acrylate layer;
- a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
- a first layer comprising zinc tin oxide, wherein the layer has a thickness from 4 nm to 8 nm;
- a metal layer;
- a second layer comprising zinc tin oxide, wherein the layer has a thickness from 4 nm to 8 nm;
- a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
- a second radiation-cured acrylate layer;

wherein the film has an emissivity of less than 0.2 wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 10 nm to 20 nm, and wherein the film has a reflected $\Delta a^*$ value of less than 2 after exposure to 7.2 MJ/m2 of total irradiance integrated over the band 295 nm to 385 nm and time, at a black panel temperature of 70° C., and humidity of 30% when irradiated through the coated side.

109. A film comprising the following elements immediately adjacent to each other in the recited order:
- a substrate;
- a first radiation-cured acrylate layer;
- a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
- a first layer comprising zinc tin oxide, wherein the layer has a thickness from 4 nm to 8 nm;
- a metal layer;
- a second layer comprising zinc tin oxide, wherein the layer has a thickness from 4 nm to 8 nm;
- a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
- a second radiation-cured acrylate layer;

wherein the film has an emissivity of less than 0.2 wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 10 nm to 20 nm, and wherein the film has a reflected $\Delta b^*$ value of less than 3 after exposure to 7.2 MJ/m2 of total irradiance integrated over the band 295 nm to 385 nm and time, at a black panel temperature of 70° C., and humidity of 30% when irradiated through the coated side.

110. A film comprising the following elements immediately adjacent to each other in the recited order:
- a substrate;
- a first radiation-cured acrylate layer;
- a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
- a first layer comprising zinc tin oxide, wherein the layer has a thickness from 4 nm to 8 nm;
- a metal layer;
- a second layer comprising zinc tin oxide, wherein the layer has a thickness from 4 nm to 8 nm;
- a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
- a second radiation-cured acrylate layer;

wherein the film has an emissivity of less than 0.2 wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 10 nm to 20 nm, and wherein the film has a reflected $\Delta E^*$ value of less than 2 after exposure to 7.2 MJ/m2 of total irradiance integrated over the band 295 nm to 385 nm and time, at a black panel temperature of 70° C., and humidity of 30% when irradiated through the coated side.

111. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;
wherein the film has an emissivity of less than 0.2
wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 10 nm to 20 nm, and wherein the film has an increase in emissivity of less than 0.02 after exposure to 7.2 MJ/m2 of total irradiance integrated over the band 295 nm to 385 nm and time, at a black panel temperature of 70° C., and humidity of 30% when irradiated through the coated side.

112. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;
wherein the film has an emissivity of less than 0.2
wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 10 nm to 20 nm, and wherein the film has a change in visible light transmission of less than 3 after exposure to 7.2 MJ/m2 of total irradiance integrated over the band 295 nm to 385 nm and time, at a black panel temperature of 70° C., and humidity of 30% when irradiated through the coated side.

113. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;
wherein the film has an emissivity of less than 0.2
wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 10 nm to 20 nm, and wherein the film has a reflected $\Delta L^*$ value of less than 3, a reflected $\Delta a^*$ value of less than 2, reflected $\Delta b^*$ value of less than 2, reflected $\Delta E^*$ value of less than 2, increase in emissivity of less than 0.02, and change in visible light transmission of less than 2 after exposure to 7.2 MJ/m2 of total irradiance integrated over the band 295 nm to 385 nm and time, at a black panel temperature of 70° C., and humidity of 30% when irradiated through the coated side.

114. A film comprising the following elements immediately adjacent to each other in the recited order:
   a substrate;
   a first radiation-cured acrylated layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;
wherein the film has an emissivity of less than 0.2
wherein the film has reflected CIELAB parameters a* from −1 to 4, and b* from 0 to 3 and L* less than 48 before weathering, and
wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 10 nm to 20 nm, and wherein the film has a reflected $\Delta L^*$ value of less than 2 after exposure to 720 MJ/m2 of total irradiance integrated over the band 295 nm to 385 nm and time, at a black panel temperature of 70° C., and humidity of 30% when irradiated through the substrate.

115. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;
wherein the film has an emissivity of less than 0.2
wherein the film has reflected CIELAB parameters $a^*$ from −1 to 4, and $b^*$ from 0 to 3 and $L^*$ less than 48 before weathering, and
wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 10 nm to 20 nm, and wherein the film has a reflected $\Delta a^*$ value of less than 2 after exposure to 720 MJ/m2 of total irradiance integrated over the band 295 nm to 385 nm and time, at a black panel temperature of 70° C., and humidity of 30% when irradiated through the substrate.

116. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;
wherein the film has an emissivity of less than 0.2
wherein the film has reflected CIELAB parameters $a^*$ from −1 to 4, and $b^*$ from 0 to 3 and $L^*$ less than 48 before weathering, and
wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 10 nm to 20 nm, and wherein the film has a reflected $\Delta b^*$ value of less than 5 after exposure to 720 MJ/m2 of total irradiance integrated over the band 295 nm to 385 nm and time, at a black panel temperature of 70° C., and humidity of 30% when irradiated through the substrate.

117. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;
wherein the film has an emissivity of less than 0.2
wherein the film has reflected CIELAB parameters $a^*$ from −1 to 4, and $b^*$ from 0 to 3 and $L^*$ less than 48 before weathering, and
wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 10 nm to 20 nm, and wherein the film has a reflected $\Delta E^*$ value of less than 5 after exposure to 720 MJ/m2 of total irradiance integrated over the band 295 nm to 385 nm and time, at a black panel temperature of 70° C., and humidity of 30% when irradiated through the substrate.

118. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;
wherein the film has an emissivity of less than 0.2
wherein the film has reflected CIELAB parameters $a^*$ from −1 to 4, and $b^*$ from 0 to 3 and $L^*$ less than 48 before weathering, and wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 10 nm to 20 nm, and wherein the film has an increase in emissivity of less than 0.02 after exposure to 720 MJ/m2 of total irradiance integrated over the band 295 nm to 385 nm and time, at a black panel temperature of 70° C., and humidity of 30% when irradiated through the substrate.

119. A film comprising the following elements immediately adjacent to each other in the recited order:
- a substrate;
- a first radiation-cured acrylate layer;
- a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
- a first layer comprising zinc tin oxide, wherein the layer has a thickness from 4 nm to 8 nm;
- a metal layer;
- a second layer comprising zinc tin oxide, wherein the layer has a thickness from 4 nm to 8 nm;
- a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
- a second radiation-cured acrylate layer;

wherein the film has an emissivity of less than 0.2
wherein the film has reflected CIELAB parameters a* from −1 to 4, and b* from 0 to 3 and L* less than 48 before weathering, and
wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 10 nm to 20 nm, and wherein the film has a change in visible light transmission of less than 2% after exposure to 720 MJ/m2 of total irradiance integrated over the band 295 nm to 385 nm and time, at a black panel temperature of 70° C., and humidity of 30% when irradiated through the substrate.

120. A film comprising the following elements immediately adjacent to each other in the recited order:
- a substrate;
- a first radiation-cured acrylated layer;
- a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
- a first layer comprising zinc tin oxide, wherein the layer has a thickness from 4 nm to 8 nm;
- a metal layer;
- a second layer comprising zinc tin oxide, wherein the layer has a thickness from 4 nm to 8 nm;
- a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
- a second radiation-cured acrylate layer;

wherein the film has an emissivity of less than 0.2
wherein the film has reflected CIELAB parameters a* from −1 to 4, and b* from 0 to 3 and L* less than 48 before weathering, and
wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 10 nm to 20 nm, and wherein the film has a reflected ΔL* value of less than 2, a reflected Δa* value of less than 2, reflected Δb* value of less than 5, reflected ΔE* value of less than 5, increase in emissivity of less than 0.02, and change in visible light transmission of less than 2% after exposure to 720 MJ/m2 of total irradiance integrated over the band 295 nm to 385 nm and time, at a black panel temperature of 70° C., and humidity of 30% when irradiated through the substrate.

121. A film comprising the following elements immediately adjacent to each other in the recited order:
- a substrate;
- a first radiation-cured acrylate layer;
- a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
- a first layer comprising zinc tin oxide, wherein the layer has a thickness from 4 nm to 8 nm;
- a metal layer;
- a second layer comprising zinc tin oxide, wherein the layer has a thickness from 4 nm to 8 nm;
- a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
- a second radiation-cured acrylate layer;

wherein the film has an emissivity of less than 0.2
wherein the film has reflected CIELAB parameters a* from −1 to 4, and b* from 0 to 3 and L* less than 48 before weathering, and
wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 10 nm to 20 nm, and wherein the film has a reflected ΔL* value of less than 2 after exposure to 3.6 MJ/m2 of total irradiance integrated over the band 295 nm to 385 nm and time, at a black panel temperature of 70° C., and humidity of 30% when irradiated through the coated side.

122. A film comprising the following elements immediately adjacent to each other in the recited order:
- a substrate;
- a first radiation-cured acrylate layer;
- a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;

wherein the film has an emissivity of less than 0.2
less than 48 v, and
wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 10 nm to 20 nm, and wherein the film has a reflected Δa* value of less than 2 after exposure to 3.6 MJ/m2 of total irradiance integrated over the band 295 nm to 385 nm and time, at a black panel temperature of 70° C., and humidity of 30% when irradiated through the coated side.

123. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;

wherein the film has an emissivity of less than 0.2
wherein the film has reflected CIELAB parameters a* from −1 to 4, and b* from 0 to 3 and L* less than 48 before weathering, and
wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 10 nm to 20 nm, and wherein the film has a reflected Δb* value of less than 2 after exposure to 3.6 MJ/m2 of total irradiance integrated over the band 295 nm to 385 nm and time, at a black panel temperature of 70° C., and humidity of 30% when irradiated through the coated side.

124. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;

wherein the film has an emissivity of less than 0.2
wherein the film has reflected CIELAB parameters a* from −1 to 4, and b* from 0 to 3 and L* less than 48 before weathering, and
wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 10 nm to 20 nm, and wherein the film has a reflected ΔE* value of less than 2 after exposure to 3.6 MJ/m2 of total irradiance integrated over the band 295 nm to 385 nm and time, at a black panel temperature of 70° C., and humidity of 30% when irradiated through the coated side.

125. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;

wherein the film has an emissivity of less than 0.2
wherein the film has reflected CIELAB parameters a* from −1 to 4, and b* from 0 to 3 and L* less than 48 before weathering, and
wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 10 nm to 20 nm, and wherein the film has an increase in emissivity of less than 0.02 after exposure to 3.6 MJ/m2 of total irradiance integrated over the band 295 nm to 385 nm and time, at a black panel temperature of 70° C., and humidity of 30% when irradiated through the coated side.

126. A film comprising the following elements immediately adjacent to each other in the recited order:
  a substrate;
  a first radiation-cured acrylate layer;
  a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
  a first layer comprising zinc tin oxide, wherein the layer has a thickness from 4 nm to 8 nm;
  a metal layer;
  a second layer comprising zinc tin oxide, wherein the layer has a thickness from 4 nm to 8 nm;
  a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
  a second radiation-cured acrylate layer;
wherein the film has an emissivity of less than 0.2
wherein the film has reflected CIELAB parameters a* from −1 to 4, and b* from 0 to 3 and L* less than 48 before weathering, and
wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 10 nm to 20 nm, and wherein the film has a change in visible light transmission of less than 2 after exposure to 3.6 MJ/m2 of total irradiance integrated over the band 295 nm to 385 nm and time, at a black panel temperature of 70° C., and humidity of 30% when irradiated through the coated side.

127. A film comprising the following elements immediately adjacent to each other in the recited order:
  a substrate;
  a first radiation-cured acrylate layer;
  a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
  a first layer comprising zinc tin oxide, wherein the layer has a thickness from 4 nm to 8 nm;
  a metal layer;
  a second layer comprising zinc tin oxide, wherein the layer has a thickness from 4 nm to 8 nm;
  a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
  a second radiation-cured acrylate layer;
wherein the film has an emissivity of less than 0.2
wherein the film has reflected CIELAB parameters a* from −1 to 4, and b* from 0 to 3 and L* less than 48 before weathering, and
wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 10 nm to 20 nm, and wherein the film has a reflected ΔL* value of less than 2, a reflected Δa* value of less than 2, reflected Δb* value of less than 2, reflected ΔE* value of less than 2, increase in emissivity of less than 0.02, and change in visible light transmission of less than 2 after exposure to 3.6 MJ/m2 of total irradiance integrated over the band 295 nm to 385 nm and time, at a black panel temperature of 70° C., and humidity of 30% when irradiated through the coated side.

128. A film comprising the following elements immediately adjacent to each other in the recited order:
  a substrate;
  a first radiation-cured acrylate layer;
  a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
  a first layer comprising zinc tin oxide, wherein the layer has a thickness from 4 nm to 8 nm;
  a metal layer;
  a second layer comprising zinc tin oxide, wherein the layer has a thickness from 4 nm to 8 nm;
  a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
  a second radiation-cured acrylate layer;
wherein the film has an emissivity of less than 0.2
wherein the film has reflected CIELAB parameters a* from −1 to 4, and b* from 0 to 3 and L* less than 48 before weathering, and
wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 10 nm to 20 nm, and wherein the film has a reflected ΔL* value of less than 2 after exposure to 7.2 MJ/m2 of total irradiance integrated over the band 295 nm to 385 nm and time, at a black panel temperature of 70° C., and humidity of 30% when irradiated through the coated side.

129. A film comprising the following elements immediately adjacent to each other in the recited order:
  a substrate;
  a first radiation-cured acrylate layer;
  a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
  a first layer comprising zinc tin oxide, wherein the layer has a thickness from 4 nm to 8 nm;
  a metal layer;
  a second layer comprising zinc tin oxide, wherein the layer has a thickness from 4 nm to 8 nm;
  a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
  a second radiation-cured acrylate layer;
wherein the film has an emissivity of less than 0.2
wherein the film has reflected CIELAB parameters a* from −1 to 4, and b* from 0 to 3 and L* less than 48 before weathering, and
wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 10 nm to 20 nm, and wherein the film has a reflected Δa* value of less than 2 after exposure to 7.2 MJ/m2 of total irradiance integrated over the band 295 nm to 385 nm and time, at a black panel temperature of 70° C., and humidity of 30% when irradiated through the coated side.

130. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;
wherein the film has an emissivity of less than 0.2
wherein the film has reflected CIELAB parameters a* from −1 to 4, and b* from 0 to 3 and L* less than 48 before weathering, and
wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 10 nm to 20 nm, and wherein the film has a reflected Δb* value of less than 3 after exposure to 7.2 MJ/m2 of total irradiance integrated over the band 295 nm to 385 nm and time, at a black panel temperature of 70° C., and humidity of 30% when irradiated through the coated side.

131. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;
wherein the film has an emissivity of less than 0.2
wherein the film has reflected CIELAB parameters a* from −1 to 4, and b* from 0 to 3 and L* less than 48 before weathering, and
wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 10 nm to 20 nm, and wherein the film has a reflected ΔE* value of less than 2 after exposure to 7.2 MJ/m2 of total irradiance integrated over the band 295 nm to 385 nm and time, at a black panel temperature of 70° C., and humidity of 30% when irradiated through the coated side.

132. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;
wherein the film has an emissivity of less than 0.2
wherein the film has reflected CIELAB parameters a* from −1 to 4, and b* from 0 to 3 and L* less than 48 before weathering, and
wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 10 nm to 20 nm, and wherein the film has an increase in emissivity of less than 0.02 after exposure to 7.2 MJ/m2 of total irradiance integrated over the band 295 nm to 385 nm and time, at a black panel temperature of 70° C., and humidity of 30% when irradiated through the coated side.

133. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2
wherein the film has reflected CIELAB parameters a* from −1 to 4, and b* from 0 to 3 and L* less than 48 before weathering, and
wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 10 nm to 20 nm, and
wherein the film has a change in visible light transmission of less than 3 after exposure to 7.2 MJ/m2 of total irradiance integrated over the band 295 nm to 385 nm and time, at a black panel temperature of 70° C., and humidity of 30% when irradiated through the coated side.

134. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2
wherein the film has reflected CIELAB parameters a* from −1 to 4, and b* from 0 to 3 and L* less than 48 before weathering, and
wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 10 nm to 20 nm, and
wherein the film has a reflected ΔL* value of less than 3, a reflected Δa* value of less than 2, reflected Δb* value of less than 2, reflected ΔE* value of less than 2, increase in emissivity of less than 0.02, and change in visible light transmission of less than 2 after exposure to 7.2 MJ/m2 of total irradiance integrated over the band 295 nm to 385 nm and time, at a black panel temperature of 70° C., and humidity of 30% when irradiated through the coated side.

135. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and
wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm, and
wherein the film has a reflected ΔL* value of less than 2 after exposure to 720 MJ/m2 of total irradiance integrated over the band 295 nm to 385 nm and time, at a black panel temperature of 70° C., and humidity of 30% when irradiated through the substrate.

136. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm, and wherein the film has a reflected Δa* value of less than 2 after exposure to 720 MJ/m2 of total irradiance integrated over the band 295 nm to 385 nm and time, at a black panel temperature of 70° C., and humidity of 30% when irradiated through the substrate.

137. A film comprising the following elements immediately adjacent to each other in the recited order:
  a substrate;
  a first radiation-cured acrylate layer;
  a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
  a first layer comprising zinc tin oxide, wherein the layer has a thickness from 4 nm to 8 nm;
  a metal layer;
  a second layer comprising zinc tin oxide, wherein the layer has a thickness from 4 nm to 8 nm;
  a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
  a second radiation-cured acrylate layer;
wherein the film has an emissivity of less than 0.2
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and
wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm, and
wherein the film has a reflected Δb* value of less than 5 after exposure to 720 MJ/m2 of total irradiance integrated over the band 295 nm to 385 nm and time, at a black panel temperature of 70° C., and humidity of 30% when irradiated through the substrate.

138. A film comprising the following elements immediately adjacent to each other in the recited order:
  a substrate;
  a first radiation-cured acrylate layer;
  a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
  a first layer comprising zinc tin oxide, wherein the layer has a thickness from 4 nm to 8 nm;
  a metal layer;
  a second layer comprising zinc tin oxide, wherein the layer has a thickness from 4 nm to 8 nm;
  a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
  a second radiation-cured acrylate layer;
wherein the film has an emissivity of less than 0.2
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and
wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm, and
wherein the film has a reflected ΔE* value of less than 5 after exposure to 720 MJ/m2 of total irradiance integrated over the band 295 nm to 385 nm and time, at a black panel temperature of 70° C., and humidity of 30% when irradiated through the substrate.

139. A film comprising the following elements immediately adjacent to each other in the recited order:
  a substrate;
  a first radiation-cured acrylate layer;
  a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
  a first layer comprising zinc tin oxide, wherein the layer has a thickness from 4 nm to 8 nm;
  a metal layer;
  a second layer comprising zinc tin oxide, wherein the layer has a thickness from 4 nm to 8 nm;
  a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
  a second radiation-cured acrylate layer;
wherein the film has an emissivity of less than 0.2
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and
wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm, and
wherein the film has an increase in emissivity of less than 0.02 after exposure to 720 MJ/m2 of total irradiance integrated over the band 295 nm to 385 nm and time, at a black panel temperature of 70° C., and humidity of 30% when irradiated through the substrate.

140. A film comprising the following elements immediately adjacent to each other in the recited order:
  a substrate;
  a first radiation-cured acrylated layer;
  a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and a first layer comprising zinc tin oxide, wherein the layer has a thickness from 4 nm to 8 nm;

a metal layer;

a second layer comprising zinc tin oxide, wherein the layer has a thickness from 4 nm to 8 nm;

a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and a second radiation-cured acrylate layer;

wherein the film has an emissivity of less than 0.2 wherein the sum of the thickness of the first layer comprising a silicon compound plus the thickness of the first layer comprising zinc tin oxide is from 15 nm to 30 nm, wherein the sum of the thickness of the second layer comprising a silicon compound plus the thickness of the second layer comprising zinc tin oxide is from 9 nm to 15 nm, and wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm, and wherein the film has a change in visible light transmission of less than 2% after exposure to 720 MJ/m2 of total irradiance integrated over the band 295 nm to 385 nm and time, at a black panel temperature of 70° C., and humidity of 30% when irradiated through the substrate.

141. A film comprising the following elements immediately adjacent to each other in the recited order:

a substrate;

a first radiation-cured acrylate layer;

a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and a first layer comprising zinc tin oxide, wherein the layer has a thickness from 4 nm to 8 nm;

a metal layer;

a second layer comprising zinc tin oxide, wherein the layer has a thickness from 4 nm to 8 nm;

a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and a second radiation-cured acrylate layer;

wherein the film has an emissivity of less than 0.2 wherein the sum of the thickness of the first layer comprising a silicon compound plus the thickness of the first layer comprising zinc tin oxide is from 15 nm to 30 nm, wherein the sum of the thickness of the second layer comprising a silicon compound plus the thickness of the second layer comprising zinc tin oxide is from 9 nm to 15 nm, and wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm, and wherein the film has a reflected $\Delta L^*$ value of less than 2, a reflected $\Delta a^*$ value of less than 2, reflected $\Delta b^*$ value of less than 5, reflected $\Delta E^*$ value of less than 5, increase in emissivity of less than 0.02, and change in visible light transmission of less than 2% after exposure to 720 MJ/m2 of total irradiance integrated over the band 295 nm to 385 nm and time, at a black panel temperature of 70° C., and humidity of 30% when irradiated through the substrate.

142. A film comprising the following elements immediately adjacent to each other in the recited order:

a substrate;

a first radiation-cured acrylate layer;

a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and a first layer comprising zinc tin oxide, wherein the layer has a thickness from 4 nm to 8 nm;

a metal layer;

a second layer comprising zinc tin oxide, wherein the layer has a thickness from 4 nm to 8 nm;

a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and a second radiation-cured acrylate layer;

wherein the film has an emissivity of less than 0.2 wherein the sum of the thickness of the first layer comprising a silicon compound plus the thickness of the first layer comprising zinc tin oxide is from 15 nm to 30 nm, wherein the sum of the thickness of the second layer comprising a silicon compound plus the thickness of the second layer comprising zinc tin oxide is from 9 nm to 15 nm, and wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm, and wherein the film has a reflected $\Delta L^*$ value of less than 2 after exposure to 3.6 MJ/m2 of total irradiance integrated over the band 295 nm to 385 nm and time, at a black panel temperature of 70° C., and humidity of 30% when irradiated through the coated side.

143. A film comprising the following elements immediately adjacent to each other in the recited order:

a substrate;

a first radiation-cured acrylate layer;

a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and a first layer comprising zinc tin oxide, wherein the layer has a thickness from 4 nm to 8 nm;

a metal layer;

a second layer comprising zinc tin oxide, wherein the layer has a thickness from 4 nm to 8 nm;

a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and a second radiation-cured acrylate layer;

wherein the film has an emissivity of less than 0.2 wherein the sum of the thickness of the first layer comprising a silicon compound plus the thickness of the first layer comprising zinc tin oxide is from 15 nm to 30 nm, wherein the sum of the thickness of the second layer comprising a silicon compound plus the thickness of the second layer comprising zinc tin oxide is from 9 nm to 15 nm, and wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm, and wherein the film has a reflected Δa* value of less than 2 after exposure to 3.6 MJ/m2 of total irradiance integrated over the band 295 nm to 385 nm and time, at a black panel temperature of 70° C., and humidity of 30% when irradiated through the coated side.

144. A film comprising the following elements immediately adjacent to each other in the recited order:
    a substrate;
    a first radiation-cured acrylate layer;
    a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
    a first layer comprising zinc tin oxide, wherein the layer has a thickness from 4 nm to 8 nm;
    a metal layer;
    a second layer comprising zinc tin oxide, wherein the layer has a thickness from 4 nm to 8 nm;
    a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
    a second radiation-cured acrylate layer;
wherein the film has an emissivity of less than 0.2
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and
wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm, and
wherein the film has a reflected Δb* value of less than 2 after exposure to 3.6 MJ/m2 of total irradiance integrated over the band 295 nm to 385 nm and time, at a black panel temperature of 70° C., and humidity of 30% when irradiated through the coated side.

145. A film comprising the following elements immediately adjacent to each other in the recited order:
    a substrate;
    a first radiation-cured acrylate layer;
    a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
    a first layer comprising zinc tin oxide, wherein the layer has a thickness from 4 nm to 8 nm;
    a metal layer;
    a second layer comprising zinc tin oxide, wherein the layer has a thickness from 4 nm to 8 nm;
    a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
    a second radiation-cured acrylate layer;
wherein the film has an emissivity of less than 0.2
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and
wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm, and
wherein the film has a reflected ΔE* value of less than 2 after exposure to 3.6 MJ/m2 of total irradiance integrated over the band 295 nm to 385 nm and time, at a black panel temperature of 70° C., and humidity of 30% when irradiated through the coated side.

146. A film comprising the following elements immediately adjacent to each other in the recited order:
    a substrate;
    a first radiation-cured acrylate layer;
    a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
    a first layer comprising zinc tin oxide, wherein the layer has a thickness from 4 nm to 8 nm;
    a metal layer;
    a second layer comprising zinc tin oxide, wherein the layer has a thickness from 4 nm to 8 nm;
    a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
    a second radiation-cured acrylate layer;
wherein the film has an emissivity of less than 0.2
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm, and wherein the film has an increase in emissivity of less than 0.02 after exposure to 3.6 MJ/m2 of total irradiance integrated over the band 295 nm to 385 nm and time, at a black panel temperature of 70° C., and humidity of 30% when irradiated through the coated side.

147. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and
wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm, and
wherein the film has a change in visible light transmission of less than 2 after exposure to 3.6 MJ/m2 of total irradiance integrated over the band 295 nm to 385 nm and time, at a black panel temperature of 70° C., and humidity of 30% when irradiated through the coated side.

148. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and
wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm, and
wherein the film has a reflected $\Delta L^*$ value of less than 2, a reflected $\Delta a^*$ value of less than 2, reflected $\Delta b^*$ value of less than 2, reflected $\Delta E^*$ value of less than 2, increase in emissivity of less than 0.02, and change in visible light transmission of less than 2 after exposure to 3.6 MJ/m2 of total irradiance integrated over the band 295 nm to 385 nm and time, at a black panel temperature of 70° C., and humidity of 30% when irradiated through the coated side.

149. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and
wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm, and
wherein the film has a reflected $\Delta L^*$ value of less than 2 after exposure to 7.2 MJ/m2 of total irradiance integrated over the band 295 nm to 385 nm and time, at a black panel temperature of 70° C., and humidity of 30% when irradiated through the coated side.

150. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and
wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm, and
wherein the film has a reflected Δa* value of less than 2 after exposure to 7.2 MJ/m2 of total irradiance integrated over the band 295 nm to 385 nm and time, at a black panel temperature of 70° C., and humidity of 30% when irradiated through the coated side.

151. A film comprising the following elements immediately adjacent to each other in the recited order:
a substrate;
a first radiation-cured acrylated layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and
wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm, and
wherein the film has a reflected Δb* value of less than 3 after exposure to 7.2 MJ/m2 of total irradiance integrated over the band 295 nm to 385 nm and time, at a black panel temperature of 70° C., and humidity of 30% when irradiated through the coated side.

152. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and
wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm, and
wherein the film has a reflected ΔE* value of less than 2 after exposure to 7.2 MJ/m2 of total irradiance integrated over the band 295 nm to 385 nm and time, at a black panel temperature of 70° C., and humidity of 30% when irradiated through the coated side.

153. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and a second radiation-cured acrylate layer;

wherein the film has an emissivity of less than 0.2 wherein the sum of the thickness of the first layer comprising a silicon compound plus the thickness of the first layer comprising zinc tin oxide is from 15 nm to 30 nm, wherein the sum of the thickness of the second layer comprising a silicon compound plus the thickness of the second layer comprising zinc tin oxide is from 9 nm to 15 nm, and wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm, and wherein the film has an increase in emissivity of less than 0.02 after exposure to 7.2 MJ/m2 of total irradiance integrated over the band 295 nm to 385 nm and time, at a black panel temperature of 70° C., and humidity of 30% when irradiated through the coated side.

154. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;

wherein the film has an emissivity of less than 0.2 wherein the sum of the thickness of the first layer comprising a silicon compound plus the thickness of the first layer comprising zinc tin oxide is from 15 nm to 30 nm, wherein the sum of the thickness of the second layer comprising a silicon compound plus the thickness of the second layer comprising zinc tin oxide is from 9 nm to 15 nm, and wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm, and wherein the film has a change in visible light transmission of less than 3 after exposure to 7.2 MJ/m2 of total irradiance integrated over the band 295 nm to 385 nm and time, at a black panel temperature of 70° C., and humidity of 30% when irradiated through the coated side.

155. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;

wherein the film has an emissivity of less than 0.2 wherein the sum of the thickness of the first layer comprising a silicon compound plus the thickness of the first layer comprising zinc tin oxide is from 15 nm to 30 nm, wherein the sum of the thickness of the second layer comprising a silicon compound plus the thickness of the second layer comprising zinc tin oxide is from 9 nm to 15 nm, and wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm, and wherein the film has a reflected ΔL* value of less than 3, a reflected Δa* value of less than 2, reflected Δb* value of less than 2, reflected ΔE* value of less than 2, increase in emissivity of less than 0.02, and change in visible light transmission of less than 2 after exposure to 7.2 MJ/m2 of total irradiance integrated over the band 295 nm to 385 nm and time, at a black panel temperature of 70° C., and humidity of 30% when irradiated through the coated side.

156. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;

wherein the film has an emissivity of less than 0.2, wherein the film has reflected CIELAB parameter a* from −1 to 4, and b* from 0 to 3 and L* less than 48 before weathering, wherein the sum of the thickness of the first layer comprising a silicon compound plus the thickness of the first layer comprising zinc tin oxide is from 15 nm to 30 nm, wherein the sum of the thickness of the second layer comprising a silicon compound plus the thickness of the second layer comprising zinc tin oxide is from 9 nm to 15 nm, and wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm, and wherein the film has a reflected ΔL* value of less than 2 after exposure to 720 MJ/m2 of total irradiance integrated over the band 295 nm to 385 nm and time, at a black panel temperature of 70° C., and humidity of 30% when irradiated through the substrate.

157. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2,
wherein the film has reflected CIELAB parameter a* from −1 to 4, and b* from 0 to 3 and L* less than 48 before weathering,
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and
wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm, and
wherein the film has a reflected Δa* value of less than 2 after exposure to 720 MJ/m2 of total irradiance integrated over the band 295 nm to 385 nm and time, at a black panel temperature of 70° C., and humidity of 30% when irradiated through the substrate.

158. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2,
wherein the film has reflected CIELAB parameters a* from −1 to 4, and b* from 0 to 3 and L* less than 48 before weathering,
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and
wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm, and
wherein the film has a reflected Δb* value of less than 5 after exposure to 720 MJ/m2 of total irradiance integrated over the band 295 nm to 385 nm and time, at a black panel temperature of 70° C., and humidity of 30% when irradiated through the substrate.

159. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2,
wherein the film has reflected CIELAB parameters a* from −1 to 4, and b* from 0 to 3 and L* less than 48 before weathering,
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and
wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm, and
wherein the film has a reflected ΔE* value of less than 5 after exposure to 720 MJ/m2 of total irradiance integrated over the band 295 nm to 385 nm and time, at a black panel temperature of 70° C., and humidity of 30% when irradiated through the substrate.

160. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;
   wherein the film has an emissivity of less than 0.2,
   wherein the film has reflected CIELAB parameters a* from −1 to 4, and b* from 0 to 3 and L* less than 48 before weathering,
   wherein the sum of the thickness of the first layer comprising a silicon compound plus the thickness of the first layer comprising zinc tin oxide is from 15 nm to 30 nm,
   wherein the sum of the thickness of the second layer comprising a silicon compound plus the thickness of the second layer comprising zinc tin oxide is from 9 nm to 15 nm, and
   wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm, and
   wherein the film has an increase in emissivity of less than 0.02 after exposure to 720 MJ/m2 of total irradiance integrated over the band 295 nm to 385 nm and time, at a black panel temperature of 70° C., and humidity of 30% when irradiated through the substrate.

161. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;
   wherein the film has an emissivity of less than 0.2,
   wherein the film has reflected CIELAB parameters a* from −1 to 4, and b* from 0 to 3 and L* less than 48 before weathering,
   wherein the sum of the thickness of the first layer comprising a silicon compound plus the thickness of the first layer comprising zinc tin oxide is from 15 nm to 30 nm,
   wherein the sum of the thickness of the second layer comprising a silicon compound plus the thickness of the second layer comprising zinc tin oxide is from 9 nm to 15 nm, and
   wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm, and
   wherein the film has a change in visible light transmission of less than 2% after exposure to 720 MJ/m2 of total irradiance integrated over the band 295 nm to 385 nm and time, at a black panel temperature of 70° C., and humidity of 30% when irradiated through the substrate.

162. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;
   wherein the film has an emissivity of less than 0.2,
   wherein the film has reflected CIELAB parameters a* from −1 to 4, and b* from 0 to 3 and L* less than 48 before weathering,
   wherein the sum of the thickness of the first layer comprising a silicon compound plus the thickness of the first layer comprising zinc tin oxide is from 15 nm to 30 nm,
   wherein the sum of the thickness of the second layer comprising a silicon compound plus the thickness of the second layer comprising zinc tin oxide is from 9 nm to 15 nm, and
   wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm, and
   wherein the film has a reflected $\Delta L^*$ value of less than 2, a reflected $\Delta a^*$ value of less than 2, reflected $\Delta b^*$ value of less than 5, reflected $\Delta E^*$ value of less than 5, increase in emissivity of less than 0.02, and change in visible light transmission of less than 2% after exposure to 720 MJ/m2 of total irradiance integrated over the band 295 nm to 385 nm and time, at a black panel temperature of 70° C., and humidity of 30% when irradiated through the substrate.

163. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2,
wherein the film has reflected CIELAB parameters a* from −1 to 4, and b* from 0 to 3 and L* less than 48 before weathering,
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and
wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm, and
wherein the film has a reflected ΔL* value of less than 2 after exposure to 3.6 MJ/m2 of total irradiance integrated over the band 295 nm to 385 nm and time, at a black panel temperature of 70° C., and humidity of 30% when irradiated through the coated side.

164. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2,
wherein the film has reflected CIELAB parameters a* from −1 to 4, and b* from 0 to 3 and L* less than 48 before weathering,
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and
wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm, and
wherein the film has a reflected Δa* value of less than 2 after exposure to 3.6 MJ/m2 of total irradiance integrated over the band 295 nm to 385 nm and time, at a black panel temperature of 70° C., and humidity of 30% when irradiated through the coated side.

165. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2,
wherein the film has reflected CIELAB parameters a* from −1 to 4, and b* from 0 to 3 and L* less than 48 before weathering,
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and
wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm, and
wherein the film has a reflected Δb* value of less than 2 after exposure to 3.6 MJ/m2 of total irradiance integrated over the band 295 nm to 385 nm and time, at a black panel temperature of 70° C., and humidity of 30% when irradiated through the coated side.

166. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;
   wherein the film has an emissivity of less than 0.2,
   wherein the film has reflected CIELAB parameters a* from −1 to 4, and b* from 0 to 3 and L* less than 48 before weathering,
   wherein the sum of the thickness of the first layer comprising a silicon compound plus the thickness of the first layer comprising zinc tin oxide is from 15 nm to 30 nm,
   wherein the sum of the thickness of the second layer comprising a silicon compound plus the thickness of the second layer comprising zinc tin oxide is from 9 nm to 15 nm, and
   wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm, and
   wherein the film has a reflected ΔE* value of less than 2 after exposure to 3.6 MJ/m2 of total irradiance integrated over the band 295 nm to 385 nm and time, at a black panel temperature of 70° C., and humidity of 30% when irradiated through the coated side.

167. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;
   wherein the film has an emissivity of less than 0.2,
   wherein the film has reflected CIELAB parameters a* from −1 to 4, and b* from 0 to 3 and L* less than 48 before weathering,
   wherein the sum of the thickness of the first layer comprising a silicon compound plus the thickness of the first layer comprising zinc tin oxide is from 15 nm to 30 nm,
   wherein the sum of the thickness of the second layer comprising a silicon compound plus the thickness of the second layer comprising zinc tin oxide is from 9 nm to 15 nm, and
   wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm, and
   wherein the film has an increase in emissivity of less than 0.02 after exposure to 3.6 MJ/m2 of total irradiance integrated over the band 295 nm to 385 nm and time, at a black panel temperature of 70° C., and humidity of 30% when irradiated through the coated side.

168. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;
   wherein the film has an emissivity of less than 0.2,
   wherein the film has Reflected CIELAB parameter a* from −1 to 4, and b* from 0 to 3 and L* less than 48 before weathering,
   wherein the sum of the thickness of the first layer comprising a silicon compound plus the thickness of the first layer comprising zinc tin oxide is from 15 nm to 30 nm,
   wherein the sum of the thickness of the second layer comprising a silicon compound plus the thickness of the second layer comprising zinc tin oxide is from 9 nm to 15 nm, and
   wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm, and
   wherein the film has a change in visible light transmission of less than 2 after exposure to 3.6 MJ/m2 of total irradiance integrated over the band 295 nm to 385 nm and time, at a black panel temperature of 70° C., and humidity of 30% when irradiated through the coated side.

169. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2,
wherein the film has Reflected CIELAB parameter a* from −1 to 4, and b* from 0 to 3 and L* less than 48 before weathering,
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and
wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm, and
wherein the film has a reflected ΔL* value of less than 2, a reflected Δa* value of less than 2, reflected Δb* value of less than 2, reflected ΔE* value of less than 2, increase in emissivity of less than 0.02, and change in visible light transmission of less than 2 after exposure to 3.6 MJ/m2 of total irradiance integrated over the band 295 nm to 385 nm and time, at a black panel temperature of 70° C., and humidity of 30% when irradiated through the coated side.

170. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2,
wherein the film has reflected CIELAB parameters a* from −1 to 4, and b* from 0 to 3 and L* less than 48 before weathering,
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and
wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm, and
wherein the film has a reflected ΔL* value of less than 2 after exposure to 7.2 MJ/m2 of total irradiance integrated over the band 295 nm to 385 nm and time, at a black panel temperature of 70° C., and humidity of 30% when irradiated through the coated side.

171. A film comprising the following elements immediately adjacent to each other in the recited order:
a substrate;
a first radiation-cured acrylate layer;
a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a first layer comprising zinc tin oxide, wherein the layer has a thickness from 4 nm to 8 nm;
a metal layer;
a second layer comprising zinc tin oxide, wherein the layer has a thickness from 4 nm to 8 nm;
a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
a second radiation-cured acrylate layer;
wherein the film has an emissivity of less than 0.2,
wherein the film has reflected CIELAB parameters a* from −1 to 4, and b* from 0 to 3 and L* less than 48 before weathering,
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and
wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm, and
wherein the film has a reflected Δa* value of less than 2 after exposure to 7.2 MJ/m2 of total irradiance integrated over the band 295 nm to 385 nm and time, at a black panel temperature of 70° C., and humidity of 30% when irradiated through the coated side.

172. A film comprising the following elements immediately adjacent to each other in the recited order:
- a substrate;
- a first radiation-cured acrylate layer;
- a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
- a first layer comprising zinc tin oxide, wherein the layer has a thickness from 4 nm to 8 nm;
- a metal layer;
- a second layer comprising zinc tin oxide, wherein the layer has a thickness from 4 nm to 8 nm;
- a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
- a second radiation-cured acrylate layer;

wherein the film has an emissivity of less than 0.2,
wherein the film has reflected CIELAB parameters a* from −1 to 4, and b* from 0 to 3 and L* less than 48 before weathering,
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and
wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm, and
wherein the film has a reflected Δb* value of less than 3 after exposure to 7.2 MJ/m2 of total irradiance integrated over the band 295 nm to 385 nm and time, at a black panel temperature of 70° C., and humidity of 30% when irradiated through the coated side.

173. A film comprising the following elements immediately adjacent to each other in the recited order:
- a substrate;
- a first radiation-cured acrylate layer;
- a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
- a first layer comprising zinc tin oxide, wherein the layer has a thickness from 4 nm to 8 nm;
- a metal layer;
- a second layer comprising zinc tin oxide, wherein the layer has a thickness from 4 nm to 8 nm;
- a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
- a second radiation-cured acrylate layer;

wherein the film has an emissivity of less than 0.2,
wherein the film has reflected CIELAB parameters a* from −1 to 4, and b* from 0 to 3 and L* less than 48 before weathering,
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and
wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm, and
wherein the film has a reflected ΔE* value of less than 2 after exposure to 7.2 MJ/m2 of total irradiance integrated over the band 295 nm to 385 nm and time, at a black panel temperature of 70° C., and humidity of 30% when irradiated through the coated side.

174. A film comprising the following elements immediately adjacent to each other in the recited order:
- a substrate;
- a first radiation-cured acrylate layer;
- a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
- a first layer comprising zinc tin oxide, wherein the layer has a thickness from 4 nm to 8 nm;
- a metal layer;
- a second layer comprising zinc tin oxide, wherein the layer has a thickness from 4 nm to 8 nm;
- a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
- a second radiation-cured acrylate layer;

wherein the film has an emissivity of less than 0.2,
wherein the film has reflected CIELAB parameters a* from −1 to 4, and b* from 0 to 3 and L* less than 48 before weathering,
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm, and
wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm, and
wherein the film has an increase in emissivity of less than 0.02 after exposure to 7.2 MJ/m2 of total irradiance integrated over the band 295 nm to 385 nm and time, at a black panel temperature of 70° C., and humidity of 30% when irradiated through the coated side.

175. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof; and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof; and
   a second radiation-cured acrylate layer;
   wherein the film has an emissivity of less than 0.2,
   wherein the film has reflected CIELAB parameters a* from −1 to 4, and b* from 0 to 3 and L* less than 48 before weathering,
   wherein the sum of the thickness of the first layer comprising a silicon compound plus the thickness of the first layer comprising zinc tin oxide is from 15 nm to 30 nm,
   wherein the sum of the thickness of the second layer comprising a silicon compound plus the thickness of the second layer comprising zinc tin oxide is from 9 nm to 15 nm, and
   wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm, and
   wherein the film has a change in visible light transmission of less than 3 after exposure to 7.2 MJ/m2 of total irradiance integrated over the band 295 nm to 385 nm and time, at a black panel temperature of 70° C., and humidity of 30% when irradiated through the coated side.

176. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof; and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof; and
   a second radiation-cured acrylate layer;
   wherein the film has an emissivity of less than 0.2,
   wherein the film has reflected CIELAB parameters a* from −1 to 4, and b* from 0 to 3 and L* less than 48 before weathering,
   wherein the sum of the thickness of the first layer comprising a silicon compound plus the thickness of the first layer comprising zinc tin oxide is from 15 nm to 30 nm,
   wherein the sum of the thickness of the second layer comprising a silicon compound plus the thickness of the second layer comprising zinc tin oxide is from 9 nm to 15 nm, and
   wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm, and
   wherein the film has a reflected ΔL* value of less than 3, a reflected Δa* value of less than 2, reflected Δb* value of less than 2, reflected ΔE* value of less than 2, increase in emissivity of less than 0.02, and change in visible light transmission of less than 2 after exposure to 7.2 MJ/m2 of total irradiance integrated over the band 295 nm to 385 nm and time, at a black panel temperature of 70° C., and humidity of 30% when irradiated through the coated side.

177. The film according to any of the preceding embodiments, wherein the sum of the thickness of the first layer comprising a silicon compound plus the thickness of the first layer comprising zinc tin oxide is from 15 nm to 30 nm.

178. The film according to any of the preceding embodiments, wherein the sum of the thickness of the first layer comprising a silicon compound plus the thickness of the first layer comprising zinc tin oxide is from 16 nm to 30 nm.

179. The film according to any of the preceding embodiments, wherein the sum of the thickness of the first layer comprising a silicon compound plus the thickness of the first layer comprising zinc tin oxide is from 20 nm to 30 nm.

180. The film according to any of the preceding embodiments, wherein the sum of the thickness of the first layer comprising a silicon compound plus the thickness of the first layer comprising zinc tin oxide is from 25 nm to 30 nm.

181. The film according to any of the preceding embodiments, wherein the sum of the thickness of the first layer comprising a silicon compound plus the thickness of the first layer comprising zinc tin oxide is from 25 nm to 28 nm.

182. The film according to any of the preceding embodiments, wherein the sum of the thickness of the first layer comprising a silicon compound plus the thickness of the first layer comprising zinc tin oxide is from 25 nm to 27 nm.

183. The film according to any of the preceding embodiments, wherein the sum of the thickness of the second layer comprising a silicon compound plus the thickness of the second layer comprising zinc tin oxide is from 9 nm to 15 nm.

184. The film according to any of the preceding embodiments, wherein the sum of the thickness of the second 185. The film according to any of the preceding embodiments, wherein the sum of the thickness of the second layer comprising a silicon compound plus the thickness of the second layer comprising zinc tin oxide is from 10 nm to 13 nm.
186. The film according to any of the preceding embodiments, wherein the sum of the thickness of the second layer comprising a silicon compound plus the thickness of the second layer comprising zinc tin oxide is from 11 nm to 13 nm.
187. The film according to any of the preceding embodiments, wherein the sum of the thickness of the second layer comprising a silicon compound plus the thickness of the second layer comprising zinc tin oxide is from 10 nm to 12 nm.
188. The film according to any of the preceding embodiments, wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm.
189. The film according to any of the preceding embodiments, wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 30 nm.
190. The film according to any of the preceding embodiments, wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 35 nm.
191. The film according to any of the preceding embodiments, wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 35 nm to 40 nm.
192. The film according to any of the preceding embodiments, wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 30 nm to 35 nm.
193. The film according to any of the preceding embodiments, wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 30 nm to 40 nm.
194. The film according to any of the preceding embodiments, wherein the sum of the thickness of the first layer comprising a silicon compound plus the thickness of the first layer comprising zinc tin oxide is from 15 nm to 30 nm and wherein the sum of the thickness of the second layer comprising a silicon compound plus the thickness of the second layer comprising zinc tin oxide is from 9 nm to 15 nm.
195. The film according to any of the preceding embodiments, wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1 is different from T2.
196. The film according to any of the preceding embodiments, wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is greater than 5 nm.
197. The film according to any of the preceding embodiments, wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is greater than 10 nm.
198. The film according to any of the preceding embodiments, wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 1 nm to 20 nm.
199. The film according to any of the preceding embodiments, wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 1 nm to 15 nm.
200. The film according to any of the preceding embodiments, wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 5 nm to 15 nm.
201. The film according to any of the preceding embodiments, wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 10 nm to 15 nm.
202. The film according to any of the preceding embodiments, wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is from 10 nm to 20 nm.

203. The film according to any of the preceding embodiments, wherein the sum of the thickness of the first layer comprising a silicon compound plus the thickness of the first layer comprising zinc tin oxide is from 15 nm to 30 nm, wherein the sum of the thickness of the second layer comprising a silicon compound plus the thickness of the second layer comprising zinc tin oxide is from 9 nm to 15 nm, and wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm.

204. The film according to any of the preceding embodiments, wherein the film has a reflected ΔL* value of less than 2 after exposure to 720 MJ/m2 of total irradiance integrated over the band 295 nm to 385 nm and time, at a black panel temperature of 70° C., and humidity of 30% when irradiated through the substrate.

205. The film according to any of the preceding embodiments, wherein the film has a reflected Δa* value of less than 2 after exposure to 720 MJ/m2 of total irradiance integrated over the band 295 nm to 385 nm and time, at a black panel temperature of 70° C., and humidity of 30% when irradiated through the substrate.

206. The film according to any of the preceding embodiments, wherein the film has a reflected Δb* value of less than 5 after exposure to 720 MJ/m2 of total irradiance integrated over the band 295 nm to 385 nm and time, at a black panel temperature of 70° C., and humidity of 30% when irradiated through the substrate.

207. The film according to any of the preceding embodiments, wherein the film has a reflected ΔE* value of less than 5 after exposure to 720 MJ/m2 of total irradiance integrated over the band 295 nm to 385 nm and time, at a black panel temperature of 70° C., and humidity of 30% when irradiated through the substrate.

208. The film according to any of the preceding embodiments, wherein the film has an increase in emissivity of less than 0.02 after exposure to 720 MJ/m2 of total irradiance integrated over the band 295 nm to 385 nm and time, at a black panel temperature of 70° C., and humidity of 30% when irradiated through the substrate.

209. The film according to any of the preceding embodiments, wherein the film has a change in visible light transmission of less than 2% after exposure to 720 MJ/m2 of total irradiance integrated over the band 295 nm to 385 nm and time, at a black panel temperature of 70° C., and humidity of 30% when irradiated through the substrate.

210. The film according to any of the preceding embodiments, wherein the film has a reflected ΔL* value of less than 2, a reflected Δa* value of less than 2, reflected Δb* value of less than 5, reflected ΔE* value of less than 5, increase in emissivity of less than 0.02, and change in visible light transmission of less than 2% after exposure to 720 MJ/m2 of total irradiance integrated over the band 295 nm to 385 nm and time, at a black panel temperature of 70° C., and humidity of 30% when irradiated through the substrate.

211. The film according to any of the preceding embodiments, wherein the film has a reflected ΔL* value of less than 2 after exposure to 3.6 MJ/m2 of total irradiance integrated over the band 295 nm to 385 nm and time, at a black panel temperature of 70° C., and humidity of 30% when irradiated through the coated side.

212. The film according to any of the preceding embodiments, wherein the film has a reflected Δa* value of less than 2 after exposure to 3.6 MJ/m2 of total irradiance integrated over the band 295 nm to 385 nm and time, at a black panel temperature of 70° C., and humidity of 30% when irradiated through the coated side.

213. The film according to any of the preceding embodiments, wherein the film has a reflected Δb* value of less than 2 after exposure to 3.6 MJ/m2 of total irradiance integrated over the band 295 nm to 385 nm and time, at a black panel temperature of 70° C., and humidity of 30% when irradiated through the coated side.

214. The film according to any of the preceding embodiments, wherein the film has a reflected ΔE* value of less than 2 after exposure to 3.6 MJ/m2 of total irradiance integrated over the band 295 nm to 385 nm and time, at a black panel temperature of 70° C., and humidity of 30% when irradiated through the coated side.

215. The film according to any of the preceding embodiments, wherein the film has an increase in emissivity of less than 0.02 after exposure to 3.6 MJ/m2 of total irradiance integrated over the band 295 nm to 385 nm and time, at a black panel temperature of 70° C., and humidity of 30% when irradiated through the coated side.

216. The film according to any of the preceding embodiments, wherein the film has a change in visible light transmission of less than 2 after exposure to 3.6 MJ/m2 of total irradiance integrated over the band 295 nm to 385 nm and time, at a black panel temperature of 70° C., and humidity of 30% when irradiated through the coated side.

217. The film according to any of the preceding embodiments, wherein the film has a reflected ΔL* value of less than 2, a reflected Δa* value of less than 2, reflected Δb* value of less than 2, reflected ΔE* value of less than 2, increase in emissivity of less than 0.02, and change in visible light transmission of less than 2 after exposure to 3.6 MJ/m2 of total irradiance integrated over the band 295 nm to 385 nm and time, at a black panel temperature of 70° C., and humidity of 30% when irradiated through the coated side.

218. The film according to any of the preceding embodiments, wherein the film has a reflected ΔL* value of less than 2 after exposure to 7.2 MJ/m2 of total irradiance integrated over the band 295 nm to 385 nm and time, at a black panel temperature of 70° C., and humidity of 30% when irradiated through the coated side.

219. The film according to any of the preceding embodiments, wherein the film has a reflected Δa* value of less than 2 after exposure to 7.2 MJ/m2 of total irradiance integrated over the band 295 nm to 385 nm and time, at a black panel temperature of 70° C., and humidity of 30% when irradiated through the coated side.

220. The film according to any of the preceding embodiments, wherein the film has a reflected Δb* value of less than 3 after exposure to 7.2 MJ/m2 of total irradiance integrated over the band 295 nm to 385 nm and time, at a black panel temperature of 70° C., and humidity of 30% when irradiated through the coated side.

221. The film according to any of the preceding embodiments, wherein the film has a reflected ΔE* value of less than 2 after exposure to 7.2 MJ/m2 of total irradiance integrated over the band 295 nm to 385 nm and time, at a black panel temperature of 70° C., and humidity of 30% when irradiated through the coated side.

222. The film according to any of the preceding embodiments, wherein the film has a Increase in emissivity of less than 0.02 after exposure to 7.2 MJ/m2 of total irradiance integrated over the band 295 nm to 385 nm and time, at a black panel temperature of 70° C., and humidity of 30% when irradiated through the coated side.

223. The film according to any of the preceding embodiments, wherein the film has a change in visible light transmission of less than 3 after exposure to 7.2 MJ/m2 of total irradiance integrated over the band 295 nm to 385 nm and time, at a black panel temperature of 70° C., and humidity of 30% when irradiated through the coated side.

224. The film according to any of the preceding embodiments, wherein the film has a reflected ΔL* value of less than 3, a reflected Δa* value of less than 2, reflected Δb* value of less than 2, reflected ΔE* value of less than 2, increase in emissivity of less than 0.02, and change in visible light transmission of less than 2 after exposure to 7.2 MJ/m2 of total irradiance integrated over the band 295 nm to 385 nm and time, at a black panel temperature of 70° C., and humidity of 30% when irradiated through the coated side.

225. The film according to any of the preceding embodiments, wherein the first radiation-cured acrylate layer comprises silica nanoparticles having a diameter from 5 nm to 75 nm.

226. The film according to any of the preceding embodiments, wherein the first radiation-cured acrylate layer does not comprises nanoparticles.

227. The film according to any of the preceding embodiments, wherein the second radiation-cured acrylate layer comprises silica nanoparticles having a diameter from 5 nm to 75 nm.

228. The film according to any of the preceding embodiments, wherein the second radiation-cured acrylate layer does not comprises nanoparticles.

229. The film according to any of the preceding embodiments, wherein the second radiation-cured acrylate layer comprises a fluoroacrylate polymer.

230. The film according to any of the preceding embodiments, wherein the film has reflected CIELAB parameter a* from −2 to 5, and b* from −2 to 5 and L* less than 50 before weathering.

231. The film according to any of the preceding embodiments, wherein the film has reflected CIELAB parameters a* from −1 to 4, and b* from 0 to 3 and L* less than 48, before weathering.

232. The film according to any of the preceding embodiments, wherein the film has reflected CIELAB parameters a* from −1 to 4, and b* from 0 to 3 and L* less than 48 before weathering.

233. The film according to any of the preceding embodiments, wherein the film has reflected CIELAB parameters a* from −1 to 4, and b* from 0 to 3 and L* less than 43 before weathering.

234. The film according to any of the preceding embodiments, wherein the film is substantially color neutral in both transmission and reflection as defined by CIELAB color values.

235. The film according to any of the preceding embodiments, wherein the film has an emissivity of less than 0.17.

236. The film according to any of the preceding embodiments, wherein the film has an emissivity of less than 0.15.

237. The film according to any of the preceding embodiments, wherein the film has an emissivity of less than 0.12.

238. The film according to any of the preceding embodiments, wherein the film has a visible reflectance of less than 60%.

239. The film according to any of the preceding embodiments, wherein the film has a visible reflectance of less than 50%.

240. The film according to any of the preceding embodiments, wherein the film has a visible reflectance of less than 40%.

241. The film according to any of the preceding embodiments, wherein the film has a visible reflectance of less than 30%.

242. The film according to any of the preceding embodiments, wherein the film has a visible reflectance of less than 20%.

243. The film according to any of the preceding embodiments, wherein the film has a visible reflectance of less than 15%.

244. The film according to any of the preceding embodiments, wherein the film has a visible transmission greater than 10%.

245. The film according to any of the preceding embodiments, wherein the film has a visible transmission greater than 15%.

246. The film according to any of the preceding embodiments, wherein the film has a visible transmission greater than 20%.

247. The film according to any of the preceding embodiments, wherein the film has a visible transmission greater than 25%.

248. The film according to any of the preceding embodiments, wherein the film has a visible transmission greater than 30%.

249. The film according to any of the preceding embodiments, wherein the film has a visible transmission greater than 35%.

250. The film according to any of the preceding embodiments, wherein the film has a visible transmission greater than 40%.

251. The film according to any of the preceding embodiments, wherein the film has a visible transmission greater than 45%.

252. The film according to any of the preceding embodiments, wherein the film has a visible transmission greater than 50%.

253. The film according to any of the preceding embodiments, wherein the film has a visible transmission greater than 55%.

254. The film according to any of the preceding embodiments, wherein the film has a visible transmission greater than 60%.

255. The film according to any of the preceding embodiments, wherein the film has a visible transmission greater than 65%.

256. The film according to any of the preceding embodiments, wherein the film has a visible transmission greater than 70%.

257. The film according to any of the preceding embodiments, wherein the film has a visible transmission greater than 75%.

258. The film according to any of the preceding embodiments, wherein the film has a visible transmission greater than 80%.

259. The film according to any of the preceding embodiments, wherein the film has a visible transmission from 75 to 85%.

260. The film according to any of the preceding embodiments, wherein the film further comprises a grey metal layer.

261. The film according to any of the preceding embodiments, wherein the film further comprises a grey metal layer between the first layer comprising a silicon compound and the second layer comprising a silicon compound.
262. The film according to any of the preceding embodiments, wherein the film further comprises a grey metal layer, wherein the grey metal is chosen from stainless steel, nickel, inconel, monel, chrome, nichrome alloys, and combinations thereof.
263. The film according to any of the preceding embodiments, wherein the substrate comprises a dyed PET.
264. The film according to any of the preceding embodiments, further comprising a dyed PET layer.
265. The film according to any of the preceding embodiments, further comprising a dyed PET layer adjacent the substrate opposite the first radiation cured acrylate layer.
266. The film according to any of the preceding embodiments, further comprising a dyed PET layer immediately adjacent the substrate opposite the first radiation cured acrylate layer.
267. The film according to any of the preceding embodiments, further comprising a dyed PET layer, wherein the dyed PET layer has a visible light transmission less than 50%.
268. The film according to any of the preceding embodiments, further comprising a dyed PET layer, wherein the dyed PET layer has a visible light transmission less than 40%.
269. The film according to any of the preceding embodiments, further comprising a dyed PET layer, wherein the dyed PET layer has a visible light transmission less than 30%.
270. The film according to any of the preceding embodiments, further comprising a dyed PET layer, wherein the dyed PET layer has a visible light transmission less than 20%.
271. The film according to any of the preceding embodiments, wherein the metal layer comprises one or more metallic component chosen from silver, gold, copper, nickel, iron, cobalt, zinc, and alloys of one or more metals chosen from gold, copper, nickel, iron, cobalt, and zinc.
272. The film according to any of the preceding embodiments, wherein the metal layer comprises a silver-gold alloy.
273. The film according to any of the preceding embodiments, wherein the metal layer comprises a silver alloy comprising at least 80% silver.
274. The film according to any of the preceding embodiments, wherein the first radiation-cured acrylate layer comprises an acid functionalized monomer comprising from 0.01% to 10%.
275. The film according to any of the preceding embodiments, wherein the second radiation-cured acrylate layer comprises an acid functionalized monomer comprising from 0.01% to 10%.
276. The film according to any of the preceding embodiments, wherein the film further comprises one or more additional radiation-cured acrylate layers immediately adjacent the first radiation-cured acrylate layer, between the first radiation-cured acrylate layer and the first layer comprising a silicon compound, and wherein each of the one or more additional radiation-cured acrylate layers immediately adjacent the first radiation-cured acrylate layer has a refractive index from 1.45 to 1.6.
277. The film according to any of the preceding embodiments, wherein the film further comprises one or more additional radiation-cured acrylate layers immediately adjacent the second radiation-cured acrylate layer, between the second radiation-cured acrylate layer and the second layer comprising a silicon compound, and wherein each of the one or more additional radiation-cured acrylate layers immediately adjacent the second radiation-cured acrylate layer has a refractive index from 1.45 to 1.6.
278. The film according to any of the preceding embodiments, wherein the first radiation-cured acrylate layer comprises additives for improving interlayer adhesion.
279. The film according to any of the preceding embodiments, wherein the first radiation-cured acrylate layer comprises additives for improving interlayer adhesion comprising one or more silane compounds.
280. The film according to any of the preceding embodiments, wherein the first radiation-cured acrylate layer comprises additives for improving interlayer adhesion comprising one or more silane compounds having an acrylate functionality.
281. The film according to any of the preceding embodiments, wherein the second radiation-cured acrylate layer comprises additives for improving interlayer adhesion.
282. The film according to any of the preceding embodiments, wherein the second radiation-cured acrylate layer comprises additives for improving interlayer adhesion comprising one or more silane compounds.
283. The film according to any of the preceding embodiments, wherein the second radiation-cured acrylate layer comprises additives for improving interlayer adhesion comprising one or more silane compounds having an acrylate functionality.
284. The film according to any of the preceding embodiments, wherein the first radiation-cured acrylate layer has a thickness from 500 nm to 3000 nm.
285. The film according to any of the preceding embodiments, wherein the first radiation-cured acrylate layer has a thickness from 500 nm to 2000 nm.
286. The film according to any of the preceding embodiments, wherein the first radiation-cured acrylate layer has a thickness from 500 nm to 1500 nm.
287. The film according to any of the preceding embodiments, wherein the first radiation-cured acrylate layer has a thickness from 800 nm to 1400 nm.
288. The film according to any of the preceding embodiments, wherein the first radiation-cured acrylate layer has a thickness from 900 nm to 1200 nm.
289. The film according to any of the preceding embodiments, wherein the first radiation-cured acrylate layer has a thickness from 900 nm to 1100 nm.
290. The film according to any of the preceding embodiments, wherein the first radiation-cured acrylate layer has a thickness from 900 nm to 1000 nm.
291. The film according to any of the preceding embodiments, wherein the second radiation-cured acrylate layer has a thickness from 20 nm to 120 nm.
292. The film according to any of the preceding embodiments, wherein the second radiation-cured acrylate layer has a thickness from 40 nm to 110 nm.
293. The film according to any of the preceding embodiments, wherein the second radiation-cured acrylate layer has a thickness from 50 nm to 110 nm.
294. The film according to any of the preceding embodiments, wherein the second radiation-cured acrylate layer has a thickness from 60 nm to 100 nm.

295. The film according to any of the preceding embodiments, wherein the second radiation-cured acrylate layer has a thickness from 70 nm to 90 nm.
296. The film according to any of the preceding embodiments, wherein the second radiation-cured acrylate layer has a thickness from 75 nm to 85 nm.
297. The film according to any of the preceding embodiments, wherein the second radiation-cured acrylate layer has a thickness from 15 nm to 40 nm.
298. The film according to any of the preceding embodiments, wherein the first radiation-cured acrylate layer further comprises nanoparticles that absorb electromagnetic radiation in the visible spectrum.
299. The film according to any of the preceding embodiments, wherein the first radiation-cured acrylate layer further comprises nanoparticles, wherein the nanoparticles comprise nanoparticles chosen from carbon, antimony tin oxide, indium tin oxide, tungsten tin oxide, and combinations thereof.
300. The film according to any of the preceding embodiments, wherein the first radiation-cured acrylate layer further comprises carbon nanoparticles.
301. The film according to any of the preceding embodiments, wherein the first radiation-cured acrylate layer further comprises nanoparticles that absorb radiation in the near infrared spectrum.
302. The film according to any of the preceding embodiments, wherein the first radiation-cured acrylate layer is an actinic radiation-cured acrylate layer.
303. The film according to any of the preceding embodiments, wherein the second radiation-cured acrylate layer is an actinic radiation-cured acrylate layer.
304. The film according to any of the preceding embodiments, wherein the silicon compound in the first layer comprising a silicon compound is silicon aluminum oxynitride and the ratio of oxygen to nitrogen in the silicon aluminum oxynitride is from 0 to 1.2.
305. The film according to any of the preceding embodiments, wherein the silicon compound in the first layer comprising a silicon compound is silicon aluminum oxynitride and the ratio of oxygen to nitrogen in the silicon aluminum oxynitride is from 0.8 to 1.2.
306. The film according to any of the preceding embodiments, wherein the silicon compound in the first layer comprising a silicon compound is silicon aluminum oxynitride and the ratio of oxygen to nitrogen in the silicon aluminum oxynitride is 0.9 to 1.1.
307. The film according to any of the preceding embodiments, wherein the silicon compound in the first layer comprising a silicon compound is silicon aluminum oxynitride.
308. The film according to any of the preceding embodiments, wherein the silicon compound in the first layer comprising a silicon compound is silicon aluminum oxide.
309. The film according to any of the preceding embodiments, wherein the silicon compound in the first layer comprising a silicon compound is silicon aluminum oxide and the first layer comprising a silicon compound comprises 5% or less of aluminum by atomic weight.
310. The film according to any of the preceding embodiments, wherein the first layer comprising a silicon compound comprises silicon oxide wherein the silicon to oxygen ratio is from 0.5 to 1.0.
311. The film according to any of the preceding embodiments, wherein the first layer comprising a silicon compound comprises silicon oxide wherein the silicon to oxygen ratio is from 0.4 to 0.8.
312. The film according to any of the preceding embodiments, wherein the first layer comprising a silicon compound comprises silicon oxide wherein the silicon to oxygen ratio is 0.5.
313. The film according to any of the preceding embodiments, wherein the first layer comprising a silicon compound comprises silicon oxynitride wherein the oxygen to nitrogen ratio in the silicon oxynitride is from 0.25 to 0.1.
314. The film according to any of the preceding embodiments, wherein the first layer comprising a silicon compound comprises silicon oxynitride, wherein the oxygen to nitrogen ratio in the silicon oxynitride is from 0.3 to 0.5.
315. The film according to any of the preceding embodiments, wherein the first layer comprising a silicon compound has a thickness from 3 nm to 20 nm.
316. The film according to any of the preceding embodiments, wherein the first layer comprising a silicon compound has a thickness from 5 nm to 20 nm.
317. The film according to any of the preceding embodiments, wherein the first layer comprising a silicon compound has a thickness from 5 nm to 15 nm.
318. The film according to any of the preceding embodiments, wherein the first layer comprising a silicon compound has a thickness from 5 nm to 10 nm.
319. The film according to any of the preceding embodiments, wherein the first layer comprising a silicon compound has a thickness from 5 nm to 9 nm.
320. The film according to any of the preceding embodiments, wherein the silicon compound in the second layer comprising a silicon compound is silicon aluminum oxynitride and the ratio of oxygen to nitrogen in the silicon aluminum oxynitride is from 0 to 1.0.
321. The film according to any of the preceding embodiments, wherein the silicon compound in the second layer comprising a silicon compound is silicon aluminum oxynitride and the ratio of oxygen to nitrogen in the silicon aluminum oxynitride is from 0.3 to 1.2.
322. The film according to any of the preceding embodiments, wherein the silicon compound in the second layer comprising a silicon compound is silicon aluminum oxynitride and the ratio of oxygen to nitrogen in the silicon aluminum oxynitride is 0.6 to 1.1.
323. The film according to any of the preceding embodiments, wherein the silicon compound in the second layer comprising a silicon compound is silicon aluminum oxynitride.
324. The film according to any of the preceding embodiments, wherein the silicon compound in the second layer comprising a silicon compound is silicon aluminum oxide.
325. The film according to any of the preceding embodiments, wherein the silicon compound in the second layer comprising a silicon compound is silicon aluminum oxide and the second layer comprising a silicon compound comprises 5% or less of aluminum by atomic weight.
326. The film according to any of the preceding embodiments, wherein the second layer comprising a silicon compound comprises silicon oxide wherein the silicon to oxygen ratio is from 0.3 to 1.0.
327. The film according to any of the preceding embodiments, wherein the second layer comprising a silicon compound comprises silicon oxide wherein the silicon to oxygen ratio is from 0.4 to 0.8.

328. The film according to any of the preceding embodiments, wherein the second layer comprising a silicon compound comprises silicon oxide wherein the silicon to oxygen ratio is 0.4 to 0.5.
329. The film according to any of the preceding embodiments, wherein the second layer comprising a silicon compound has a thickness from 3 nm to 20 nm.
330. The film according to any of the preceding embodiments, wherein the second layer comprising a silicon compound has a thickness from 5 nm to 20 nm.
331. The film according to any of the preceding embodiments, wherein the second layer comprising a silicon compound has a thickness from 5 nm to 15 nm.
332. The film according to any of the preceding embodiments, wherein the second layer comprising a silicon compound has a thickness from 5 nm to 10 nm.
333. The film according to any of the preceding embodiments, wherein the second layer comprising a silicon compound has a thickness from 5 nm to 9 nm.
334. The film according to any of the preceding embodiments, wherein the thickness of the first layer comprising zinc tin oxide is from 5 nm to 7 nm.
335. The film according to any of the preceding embodiments, wherein the thickness of the first layer comprising zinc tin oxide is from 5 nm to 6 nm.
336. The film according to any of the preceding embodiments, wherein the thickness of the first layer comprising zinc tin oxide is from 6 nm to 7 nm.
337. The film according to any of the preceding embodiments, wherein the thickness of the first layer comprising zinc tin oxide is about 5 nm.
338. The film according to any of the preceding embodiments, wherein the thickness of the first layer comprising zinc tin oxide is about 6 nm.
339. The film according to any of the preceding embodiments, wherein the thickness of the first layer comprising zinc tin oxide is about 7 nm.
340. The film according to any of the preceding embodiments, wherein the thickness of the second layer comprising zinc tin oxide is from 5 nm to 7 nm.
341. The film according to any of the preceding embodiments, wherein the thickness of the second layer comprising zinc tin oxide is from 5 nm to 6 nm.
342. The film according to any of the preceding embodiments, wherein the thickness of the second layer comprising zinc tin oxide is from 6 nm to 7 nm.
343. The film according to any of the preceding embodiments, wherein the thickness of the second layer comprising zinc tin oxide is about 5 nm.
344. The film according to any of the preceding embodiments, wherein the thickness of the second layer comprising zinc tin oxide is about 6 nm.
345. The film according to any of the preceding embodiments, wherein the thickness of the second layer comprising zinc tin oxide is about 7 nm.
346. The film according to any of the preceding embodiments, wherein the substrate comprises a polyester.
347. The film according to any of the preceding embodiments, wherein the substrate comprises a polyethylene terephthalate polyester.
348. The film according to any of the preceding embodiments, wherein the substrate comprises a polyethylene terephthalate polyester that is coated with a primer.
349. The film according to any of the preceding embodiments, wherein the substrate comprises a multilayer optical film.
350. The film according to any of the preceding embodiments, further comprising a layer comprising a pressure sensitive adhesive immediately adjacent to the substrate opposite the first radiation-cured acrylate layer and further comprising a liner immediately adjacent to the layer comprising the pressure sensitive adhesive.
351. The film according to any of the preceding embodiments, further comprising a layer comprising a pressure sensitive adhesive immediately adjacent to the substrate opposite the first radiation-cured acrylate layer and further comprising a liner immediately adjacent to the layer comprising the pressure sensitive adhesive, wherein the layer comprising a pressure sensitive adhesive further comprises one or more UV absorbers.
352. The film according to any of the preceding embodiments, further comprising one or more additives in one or more layers, wherein the additives are chosen from UV absorbers, dyes, anti-oxidants, and hydrolytic stabilizers.
353. The film according to any of the preceding embodiments, wherein the film is resistant to condensed water.
354. The film according to any of the preceding embodiments, wherein the film is resistant to dilute acetic acid.
355. The film according to any of the preceding embodiments, wherein the film is resistant to scratching by steel wool.
356. The film according to any of the preceding embodiments, wherein the film is resistant to cracking.
357. The film according to any of the preceding embodiments, wherein the film is resistant to rubbing.
358. The film according to any of the preceding embodiments, wherein the film further comprises a hydrophobic layer as the outermost layer.
359. The film according to any of the preceding embodiments, wherein the film further comprises a hydrophobic layer as the outermost layer and wherein the hydrophobic layer comprises a fluoropolymer.
360. The film according to any of the preceding embodiments, wherein the film further comprises a hydrophobic layer as the outermost layer and wherein the hydrophobic layer comprises a fluoropolymer chosen from fluoro acrylates, fluoro silanes, fluoro silane acrylates, fluoro silicones, and fluoro silicone acrylates.
361. The film according to any of the preceding embodiments, wherein the film further comprises a hydrophobic layer as the outermost layer and the hydrophobic layer is adjacent the second radiation-cured acrylate layer.
362. The film according to any of the preceding embodiments, wherein the film further comprises a hydrophobic layer as the outermost layer and the hydrophobic layer is immediately adjacent the second radiation-cured acrylate layer.
363. The film according to any of the preceding embodiments, wherein the film is a window film.
364. An article comprising the film according to any of the preceding embodiments, directed to a film.
365. An article comprising the film according to any of the preceding embodiments, directed to the film, wherein the article is a glazing unit.
366. A method of reducing emissivity of an article, comprising applying the film according to any of the preceding embodiments, to the article.
367. A method of reducing emissivity of an article, comprising applying the film according to any of the preceding embodiments, to the article; wherein the article is a glazing unit.

Examples

The present invention is more particularly described in the following examples that are intended as illustrations only, since numerous modifications and variations within the scope of the present invention will be apparent to those skilled in the art. Unless otherwise noted, all parts, percentages, and ratios reported in the following examples are on a weight basis. Reagents were purchased from Sigma-Aldrich Corporation, St. Louis, Mo., unless otherwise noted.

Materials

| Material name or description | Trade name or abbreviation | Source |
| --- | --- | --- |
| 3-Trimethoxysilylpropyl isocyanate | — | Sigma-Aldrich Corporation, St. Louis, MO |
| Dibutyltin dilaurate | DBTDL | Sigma-Aldrich Corporation, St. Louis, MO |
| 2-Hydroxyethyl acrylate | — | Sigma-Aldrich Corporation, St. Louis, MO |
| Tricyclodecane dimethanol diacrylate | SR833S | Arkema, Inc., King of Prussia, PA |
| Acidic acrylate oligomer | CN147 | Arkema, Inc., King of Prussia, PA |
| PET film, 0.075 mm thick | Melinex ™ 454 | DuPont Teijin Films, Chester, VA |
| Titanium sputtering target | — | Soleras Advanced Coatings, Biddeford, ME |
| Silicon-aluminum sputtering target (90:10) | — | Soleras Advanced Coatings, Biddeford, ME |
| Zinc-tin alloy sputtering target (52.5:47.5) | — | Soleras Advanced Coatings, Biddeford, ME |
| Silver-gold alloy sputtering target (85:15) | — | Soleras Advanced Coatings, Biddeford, ME |
| Aluminum zinc oxide sputtering target | — | Soleras Advanced Coatings, Biddeford, ME |
| Zinc-tin alloy sputtering target (50:50) | — | Pro Tech Materials, Hayward, CA |
| Scotchcast Electrical Resin #5 | — | 3M Company, St. Paul, MN |

Emissivity

Emissivity was measured in accordance with ASTM C1371 using an emissometer, model AE1 and read directly from model RD1 scaling digital voltmeter, both available from Devices and Services Company, Dallas, Tex.

Visible Light Transmission

Spectral properties of films were measured in accordance with ASTM E903 in a Perkin Elmer Lambda 1050 spectrophotometer. The transmission and reflectance spectra were formatted for software compatibility and the data imported into Optics 6, which is publicly available glazing analysis software available from Lawrence Berkeley National Laboratories, Berkeley, Calif. (http://windows.lbl.gov/software/Optics/optics.html, last accessed on Apr. 14, 2017). NFRC_300_2003 was chosen as the standard for the calculation of visible light transmission.

Visible Light Reflection

Spectral properties of films were measured in accordance with ASTM E903 in a Perkin Elmer Lambda 1050 spectrophotometer. The transmission and reflectance spectra were formatted for software compatibility and the data imported into Optics 6, which is publicly available glazing analysis software available from Lawrence Berkeley National Laboratories, Berkeley, Calif. (http://windows.lbl.gov/software/Optics/optics.html, last accessed on 2 Feb. 2017. NFRC_300_2003 was chosen as the standard for the calculation of visible light reflection.

Elemental Composition

Compositional depth profiles were obtained via X-ray photoelectron spectroscopy (XPS) in conjunction with argon ion sputter etching. Data were obtained with a Physical Electronics Quantera II instrument utilizing monochromatic aluminum K-alpha x-rays and a 2 keV Ar$^+$ ion beam (Physical Electronics, Inc., Chanhassen, Minn.). Intensities of the measured photoelectron peaks were integrated and converted to atomic concentrations using the relative sensitivity factors provided in the instrument manufacturer's software (Physical Electronics Multipak). The analysis conditions were as follows:

| | |
| --- | --- |
| analysis areas | ≈200 μm diameter |
| photoelectron take-off angle | 45° ± 20° solid angle of acceptance |

-continued

| | |
| --- | --- |
| X-ray source | Monochromatic Al Kα (1486.6 eV) 85 W |
| charge neutralization | Low energy e$^-$ and Ar$^+$ flood sources |
| charge correction | none |
| sputter ion gun conditions | 2 keV Ar$^+$, 3 mm by 3 mm raster, 2.6 nm/min SiO$_2$ |
| analysis chamber pressure | <3 × 10$^{-8}$ torr |

Atomic ratios of elements within the referred layer as used herein are calculated at their respective peak intensities. For example, the O:N ratio in the first silicon compound comprising silicon oxynitride in Example 1 is calculated from the atomic depth profile in Table 7 at the sputter time of 33.5 min is 13.7/42.3=0.32. Similarly, for the same inventive example, the Si:O ratio in the second silicon compound comprising silicon oxide is at a sputter depth of 23.5 min is 16.6/43.7=0.38. It is understood that the elements immediately below the surface may influence the signal and a different analysis technique may yield a different value for the referred elemental ratios.

Layer Thickness

Layer thicknesses were generally measured using electron microscopy. Scanning electron microscopy (SEM) or transmission electron microscopy (TEM) was used as appropriate. Samples for TEM investigation were prepared by cryoultramicrotomy. Film samples were first cut out of the web (approximately 1"×1"). The side-of-interest was sputter-coated with a thin Au—Pd layer to mark the surface, then 'house-shapes' (optimal size and shape for a standard Leica UC7 ultramicrotome) were cut out with a scalpel blade and embedded in Scotchcast Electrical Resin #5. The embedded samples were allowed to cure overnight at room temperature before microtomy slicing. Cryo-ultramicrotomy was performed at temperatures between −35° and −50° C., and cutting was done either over a DMSO:H$_2$O (60:40) solution or dry. In the cryo-chamber, the thin sections were collected onto standard carbon/formvar 200 mesh Cu TEM grids. Samples were allowed to warm up to room-temperature under a dry N2 purge.

Three modes of transmission electron microscopy were used on an FEI Osiris field emission TEM (200 kV): Standard Bright Field (BF) imaging, scanning transmission electron microscopy (STEM) imaging, and high angle annular dark field (HAADF) imaging.

X-ray microanalysis was performed using the Bruker Espirit Super-X quad x-ray SDD (silicon drift detector) and accompanying analysis software system. Data was collected with the TEM in HAADF mode (Spot Size 10, Camera Length 220 nm). Quantitative elemental concentrations were calculated from background subtracted, deconvolved line intensities using the Cliff-Lorimer method in the Espirit analysis software. Standard deviations of 3a error were also determined for all the quantitative data. In order for adequate counting statistics, each x-ray scan was run between 14,000 and 28,000 sec.

Measurement of Color

Color measurements were made using an Ultrascan PRO color measurement device (available from Hunter Associates Laboratory, Reston, Va., USA). Standard practice as described in ASTM E308 was followed to calculate the color in the CIELAB space. D65 illuminant and 10° observer were used for calculating the color. In the case of reflectance, specular included configuration was used.

Test Method for Resistance to Wet Rub

Figure 2:
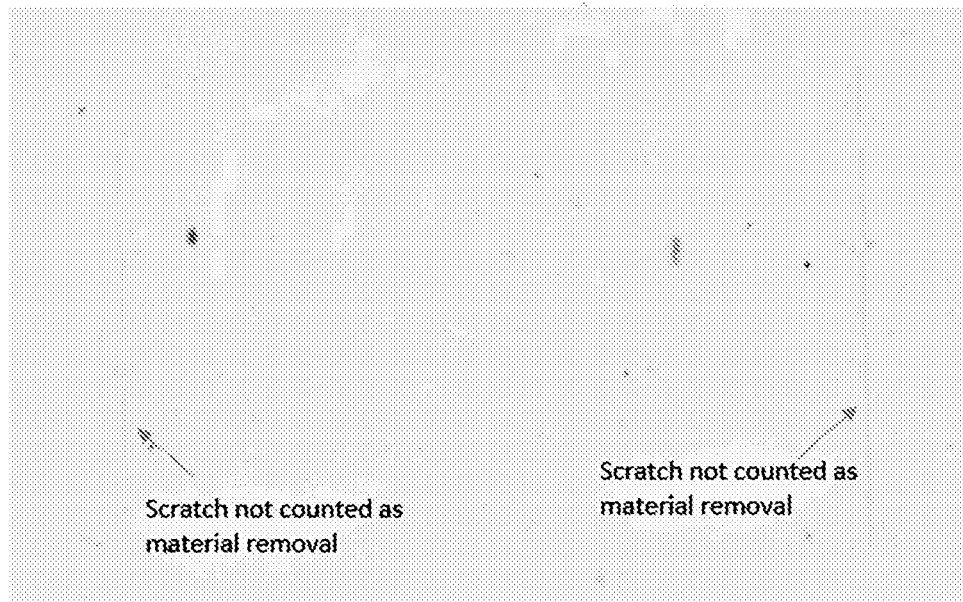
FIG. 2 shows a test specimen after the rub test that exhibits no removal of coating (center). The scratches shown in the figure are not considered removal of coating under the rub test.
Figure 3:
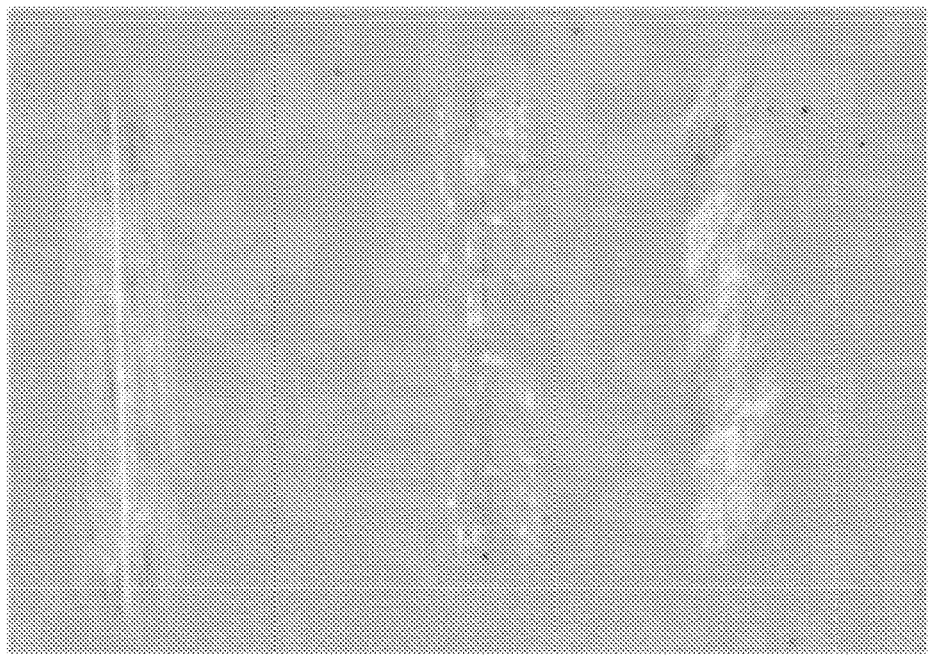
FIG. 3 shows a test specimen exhibiting partial removal of coating after rub test.

Samples to be tested were cut to sheets that are approximately 3 inches wide by 5 inches long. Samples were then taped using 3M Polyester tape 8406 to a 6 mm thick glass plate that was affixed underneath the testing arm of a linear abraser (Taber Industries 20 Model 5750 Linear Abraser, Tonawanda, N.Y.). An 8" square knitted polyester cloth (PN-99 Polynit Wipe available from Contec, Inc., Spartanburg, S.C.) was immersed in water then hand wrung to remove excess water so that cloth was damp, but did not drip. The wet cloth was folded into fourths, then attached using a hose clamp to the bottom of the testing arm which had been fitted with a circular, 12-mm diameter jumbo wearaser collet (Taber Industries part number 131862). A 2 kg weight was placed on the top of the testing arm and the arm was lowered so that the cloth was in contact with the sample surface to be tested. The tester was then run for 50 cycles at a rate of 30 cycles per minute and stroke length of 2.5 inches. The sample was removed from the glass plate, any excess water droplets were wiped gently with a dry cloth, and the sample was inspected for evidence of layer damage/delamination. Inspection was performed with human eyes both against a white backdrop and a black backdrop. Three levels of removal were noted as none, partial and complete. Presence of scratches in the test area was distinguished from the removal of coating by abrasion and not considered as removal of material. Representative images of the complete removal, partial removal and no removal but with scratches present are shown in FIGS. 1, 3 and 2, respectively.

Test Method for Weathering Resistance

Samples to be tested were cut to approximately 2.75 inches wide by 5.5 inches long. The samples to be weathered were attached to a steel sample holder and placed in a weathering chamber (model Ci5000 available from Atlas Material Testing Technology, Mount Prospect, Ill.). The weathering chamber was operated according the standard practice outlined in ASTM G151 and ASTM G155. The exposure conditions used for the test were listed in Table 5A and 5B. The film to be tested was adhered to 3 mm clear glass, secured in a metal frame and weathered according to the conditions listed in Table 5A for a total integrated UV dose of 720 MJ/m$^2$ (TUV from 295 nm to 385 nm). The glass surface was oriented towards the light source. Properties of the film before and after weathering were listed in Table 8. The film was also clipped to a metal frame and weathered according the conditions listed in Table 5A for a total integrated UV dose of 3.6 MJ/m$^2$. The low emissivity surface of the film (coated side) was oriented towards the light source and water spray. The properties of the film before and after weathering are listed in Table 9. Additionally, the film was clipped to a metal frame and weathered according the conditions listed in Table 5B for a total integrated UV dose of 3.6 MJ/m$^2$. The low emissivity surface of the film (coated side) was oriented towards the light source and water spray. The properties of the film before and after weathering are listed in Table 10.

TABLE 5A

Weathering exposure conditions A

| Lamp type | Filter type | Phase | Irradiance (W/m$^2$/nm @ 340 nm) | Time (min) | Condition | BPT (° C.) | ChT (° C.) | RH (%) |
|---|---|---|---|---|---|---|---|---|
| Xenon Arc | Daylight with CIRA ™ | a | 1.30 | continuous | Light | 70 | 47 | 30 |

TABLE 5B

Weathering exposure conditions B

| Lamp type | Filter type | Phase | Irradiance (W/m$^2$/nm @ 340 nm) | Time (min) | Condition | BPT (° C.) | ChT (° C.) | RH (%) |
|---|---|---|---|---|---|---|---|---|
| Xenon Arc | Daylight with CIRA ™ | a | 1.30 | 102 | Light | 70 | 47 | 30 |
| | | b | 1.3 | 18 | Light + Spray | 47 | 47 | 75 |

Preparative Example 1

A 500 mL round-bottomed flask equipped with overhead stirrer was charged with 140.52 g 3-trimethoxysilylpropyl isocyanate and 0.22 g DBTDL and heated to 55° C. Using an addition funnel, 79.48 g 2-hydroxyethyl acrylate was added over about one hour. At about 4 hours total time, the product shown below was isolated and bottled:

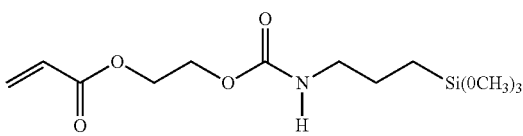

Comparative Example 1

The low emissivity film of Comparative Example 1 was a commercially available low emissivity window film. The film was analyzed using x-ray photoelectron spectroscopy, scanning electron microscopy and transmission electron microscopy as described previously. The layer composition is shown in Table 1. The layer structure deduced from the elemental depth profile is shown in Table 2.

Comparative Example 2

Figure 4:
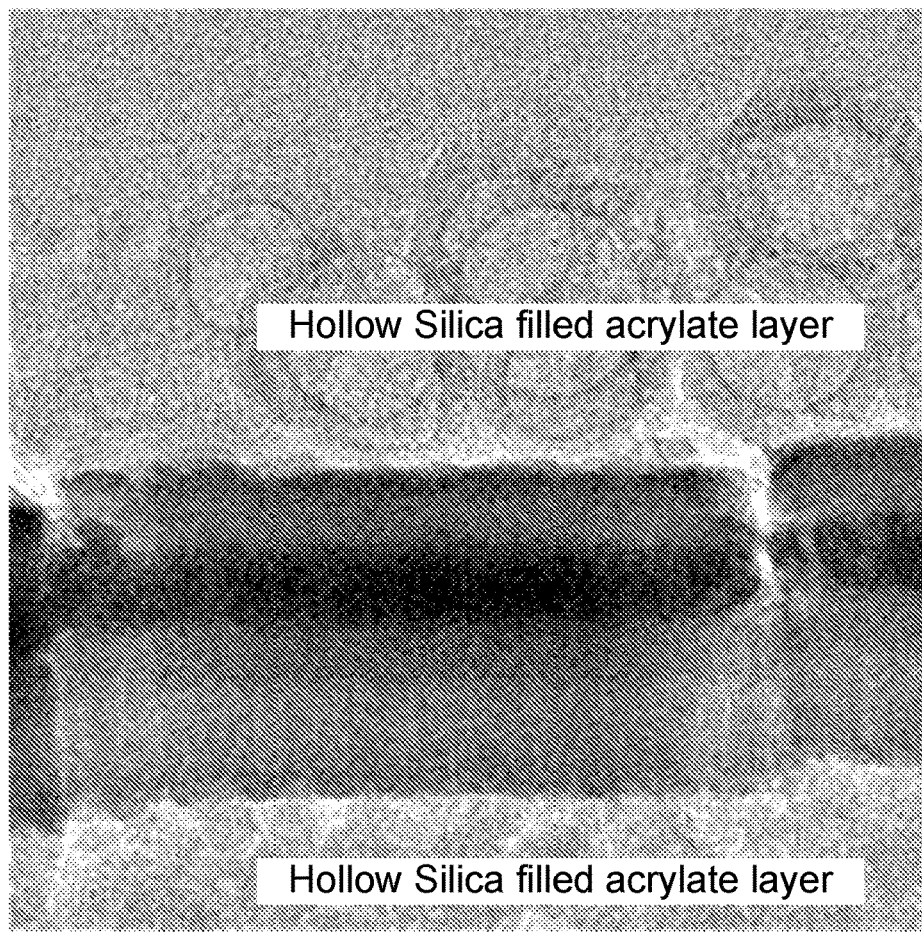
FIG. 4 is the cross-sectional transmission electron micrograph of Comparative Example 3.

The low emissivity film of Comparative Example 2 was a commercially available low emissivity window film. The film was analyzed using x-ray photoelectron spectroscopy, scanning electron microscopy and/or transmission electron microscopy (TEM) as described previously. A cross-sectional TEM image showing the layers is shown in FIG. 4. The layer composition is shown in Table 1. The layer structure deduced from the elemental depth profile is shown in Table 3.

Comparative Example 3

The low emissivity film of Comparative Example 3 was a commercially available low emissivity window film. The film was analyzed using x-ray photoelectron spectroscopy, scanning electron microscopy and transmission electron microscopy as described previously. The layer composition is shown in Table 1. The layer structure deduced from the elemental depth profile is shown in Table 4.

Comparative Example 4

A PET substrate (0.075 mm thick film from DuPont Teijin Films under the designation Melinex 454) was loaded into the vacuum coating apparatus of example 1 and pumped down to a base pressure of less than $1 \times 10^4$ torr. The following layers were sequentially deposited to produce a multilayer optical stack.

Layer 1: A first acrylic layer, approximately 1.25 microns thick was obtained by flash evaporating a mixture consisting of 94% SR 833 and 6% CN147 and condensing the mixture on the PET substrate in contact with the chilled drum. The condensed acrylate layer was cured using an electron beam gun operating at 7 kV and 7 mA. The web speed was adjusted to obtain a cured coating thickness of approximately 1.0 microns.

Layer 2: A zinc tin oxide layer was deposited on layer 1 using a reactive sputtering process from a metallic zinc-tin target of composition 50:50 by weight. The sputtering was started in the absence of oxygen. AC sputtering process was used in a dual magnetron configuration. Oxygen was gradually added to obtain a zinc tin oxide deposit. Power and web speed were adjusted to obtain approximately 6 nm thick ZTO coating.

Layer 3: A 12 nm thick gold silver alloy layer of composition 85% silver and 15% gold was deposited over the ZTO layer using magnetron sputtering process.

Layer 4: A second zinc tin oxide layer was deposited on layer 3 using same process and materials as used for layer 2. Power and web speed were adjusted to obtain approximately 6 nm thick ZTO coating.

Layer 5: An acrylate mixture of composition 88% SR833S, 6% CN147 and 6% silane coupling agent (preparative example 1) was flash evaporated and condensed over layer 5 and cured using an electron beam gun operating at 7 kV and 7 mA. The flow rate of the monomer and line speed were adjusted to obtain approximately 25 nm thick cured layer.

Layer 6: A silicon aluminum oxide layer was sputter deposited on layer 5 using a silicon aluminum target consisting of 90% silicon and 10% aluminum. An oxygen atmosphere was maintained during the deposition process. The sputtering process was carried in an AC dual magnetron configuration and sufficient flow of oxygen was maintained to obtain Si to O atomic ratio of about 0.5 in the deposited coating. The coating thickness obtained under the process conditions and chosen web speed resulted in a coating that was approximately 6 nm thick.

Layer 7: An acrylate mixture of composition 94% SR833 S and 6% silane coupling agent (preparative example 1) was flash evaporated and condensed over layer 6 and cured using an electron beam gun operating at 7 kV and 7 mA. The flow rate of the monomer and line speed were adjusted to obtain approximately 25 nm thick cured layer.

Example 1

A multilayer optical stack comprising zinc tin oxide, a silver alloy, silicon oxide or oxynitride, and radiation cured acrylate layers was deposited on a PET film substrate. All individual layers were formed using a vacuum coating apparatus similar to the one described in FIG. 3 of WO2009085741 without breaking the vacuum. A 0.075 mm thick PET film available from DuPont Teijin Films under the designation Melinex™ 454 was used for the substrate. No distinction was made regarding the side of the substrate to be coated. The sequence of layers deposited are as follows:

Layer 1: The substrate roll was loaded into a vacuum coater and the chamber pumped down to a base pressure of less than $1 \times 10^{-4}$ Torr. The film was exposed to a N2 plasma pre-treatment process using a titanium target run at 200 W. An acrylate monomer mixture comprising SR833S (Arkema), and CN147 (Arkema) in the ratio 94:6, respectively, was flash evaporated, condensed on the PET film substrate and cured with an electron beam source. The electron beam source was operated at 7 kV acceleration voltage and 7 mA beam current. The monomer flow rate, and web speed were chosen to result in a cured polymer layer thickness of approximately 1.0 µm.

Layer 2: A silicon aluminum oxynitride layer, approximately 20 nm thick was deposited using a reactive magnetron sputtering process on layer 1. A silicon-aluminum target consisting of 90% Si and 10% Al was used for the deposition of this layer. Gas flow consisting of 85% nitrogen (balance oxygen) was used in the deposition process. Pressure in the sputtering zone was maintained at less than approximately 3 mTorr. The composition of resulting coating was approximately 38% Si, 42% N, 15% O and 5% Al.

Layer 3: A zinc tin oxide layer was deposited on layer 2 using a reactive magnetron sputtering process. Sputtering power settings, oxygen flow rate and line speed chosen resulted in a coating thickness less than 6 nm.

Layer 4: A gold-silver alloy layer, approximately 12 nm thick, was deposited on zinc tin oxide layer using a magnetron sputtering process. The alloy target consisted of approximately 85% Silver and 15% Gold. The sheet resistance of the as-deposited film was approximately 12 ohms/sq.

Layer 5: A second zinc tin oxide layer was deposited over the gold-silver alloy layer using the same process conditions as for layer 3.

Layer 6: A silicon aluminum oxide layer was sputter deposited on layer 6 using a silicon aluminum target consisting of 90% silicon and 10% aluminum. An oxygen atmosphere was maintained during the deposition process. The coating thickness obtained under the process conditions was approximately 6 nm and Si:O atomic ratio as determined by XPS analysis was approximately 0.45.

Layer 7: An acrylate monomer mixture comprising SR833S (Arkema), CN147 (Arkema), and a silane coupling agent as described in preparative example 1 in the ratio 87:3:10, respectively, was flash evaporated, condensed on the PET film substrate and cured with an electron beam source. The electron beam source was operated at 7 kV acceleration voltage and 7 mA beam current. The monomer flow rate, and web speed were chosen to result in a cured polymer layer thickness of approximately 0.08 μm.

Examples 2-14

Several low emissivity films were prepared according the conditions described as Example 1. The deposition conditions (sputtering power or web speed or both) were chosen to obtain the coating thicknesses shown in Table 11.

Example 15

A low emissivity film as described in Example 1 was prepared except that the first silicon compound was omitted resulting in Layer 6 being the outermost layer.

TABLE 2

Atomic concentration depth profile of film from Comparative Example 1 as measured by XPS.

| Sputter time | Atomic concentrations (%) | | | | | | | | |
|---|---|---|---|---|---|---|---|---|---|
| (min) | C | N | O | F | Al | Si | Zn | In | Au |
| 0 | 24.5 | 8.0 | 20.1 | 36.5 | 0.7 | 10.1 | 0.0 | 0.1 | 0.0 |
| 0.25 | 3.4 | 34.0 | 17.5 | 3.9 | 3.2 | 37.8 | 0.0 | 0.2 | 0.0 |
| 0.5 | 1.8 | 40.2 | 10.8 | 1.4 | 3.3 | 42.3 | 0.0 | 0.2 | 0.0 |
| 1 | 1.0 | 45.2 | 5.4 | 0.0 | 3.3 | 44.7 | 0.1 | 0.4 | 0.0 |
| 1.5 | 0.8 | 46.7 | 3.9 | 0.0 | 3.2 | 44.5 | 0.2 | 0.6 | 0.0 |
| 2 | 0.0 | 47.8 | 4.0 | 0.0 | 2.9 | 44.0 | 0.1 | 1.2 | 0.0 |
| 2.5 | 0.0 | 46.0 | 7.0 | 0.0 | 2.9 | 41.3 | 0.0 | 2.8 | 0.0 |
| 3 | 0.0 | 36.4 | 16.5 | 0.0 | 2.4 | 37.0 | 0.2 | 7.4 | 0.0 |
| 3.5 | 0.0 | 22.2 | 33.5 | 0.0 | 2.1 | 28.1 | 0.9 | 13.2 | 0.0 |
| 4 | 0.0 | 11.3 | 46.2 | 0.0 | 1.5 | 19.6 | 2.5 | 18.9 | 0.0 |
| 5 | 0.0 | 2.2 | 53.7 | 0.0 | 1.0 | 8.8 | 4.9 | 29.3 | 0.0 |
| 6 | 0.0 | 0.0 | 54.6 | 0.0 | 0.3 | 1.8 | 6.1 | 37.3 | 0.0 |
| 7 | 0.0 | 0.4 | 52.5 | 0.0 | 0.0 | 0.0 | 5.8 | 41.3 | 0.0 |
| 8 | 0.0 | 0.4 | 52.0 | 0.0 | 0.0 | 0.0 | 5.6 | 42.0 | 0.0 |
| 9 | 0.0 | 0.0 | 51.9 | 0.0 | 0.0 | 0.3 | 5.7 | 42.0 | 0.0 |
| 10 | 0.0 | 0.0 | 51.3 | 0.0 | 0.0 | 0.0 | 5.6 | 40.7 | 2.4 |
| 11 | 0.0 | 0.0 | 42.0 | 0.0 | 0.0 | 0.0 | 5.2 | 35.4 | 17.3 |
| 12 | 0.0 | 0.0 | 22.6 | 0.0 | 0.0 | 0.0 | 3.3 | 20.3 | 53.7 |
| 13 | 0.0 | 0.0 | 15.0 | 0.0 | 0.0 | 0.0 | 2.3 | 13.9 | 68.8 |
| 14 | 0.0 | 0.0 | 36.1 | 0.0 | 0.0 | 0.0 | 3.2 | 28.8 | 31.9 |
| 15 | 0.0 | 0.0 | 46.5 | 0.0 | 0.0 | 0.0 | 4.7 | 37.2 | 11.7 |
| 16 | 0.0 | 0.0 | 50.6 | 0.0 | 0.0 | 0.0 | 5.1 | 40.3 | 4.0 |
| 17 | 0.0 | 0.0 | 51.9 | 0.0 | 0.0 | 0.0 | 5.5 | 41.1 | 1.5 |
| 18 | 0.3 | 0.0 | 52.7 | 0.0 | 0.0 | 0.0 | 5.6 | 41.4 | 0.0 |
| 19 | 0.4 | 0.0 | 52.1 | 0.0 | 0.0 | 0.1 | 5.5 | 41.9 | 0.0 |
| 20 | 0.0 | 0.0 | 52.8 | 0.0 | 0.0 | 0.0 | 5.6 | 41.6 | 0.0 |
| 21 | 0.0 | 0.0 | 52.7 | 0.0 | 0.0 | 0.0 | 5.8 | 41.5 | 0.0 |
| 22 | 0.3 | 0.0 | 52.7 | 0.0 | 0.0 | 0.1 | 5.7 | 41.2 | 0.0 |
| 23 | 0.5 | 0.0 | 53.6 | 0.0 | 0.0 | 0.0 | 5.4 | 40.5 | 0.0 |
| 24 | 0.4 | 0.0 | 54.2 | 0.0 | 0.0 | 4.0 | 5.2 | 36.3 | 0.0 |
| 25 | 0.4 | 0.0 | 58.3 | 0.0 | 0.0 | 9.0 | 4.3 | 28.0 | 0.0 |
| 26 | 5.3 | 0.6 | 58.5 | 0.0 | 0.0 | 17.2 | 2.6 | 15.9 | 0.0 |
| 27 | 16.0 | 1.1 | 53.1 | 0.0 | 0.0 | 22.9 | 1.0 | 6.0 | 0.0 |
| 28 | 21.3 | 1.0 | 50.5 | 0.0 | 0.0 | 25.2 | 0.2 | 1.9 | 0.0 |
| 29 | 25.5 | 1.2 | 47.5 | 0.0 | 0.0 | 25.0 | 0.0 | 0.8 | 0.0 |
| 30 | 28.2 | 1.4 | 45.3 | 0.0 | 0.0 | 24.6 | 0.0 | 0.4 | 0.0 |
| 31 | 31.3 | 1.2 | 43.3 | 0.0 | 0.0 | 23.9 | 0.1 | 0.3 | 0.0 |
| 32 | 34.3 | 1.3 | 40.7 | 0.0 | 0.0 | 23.5 | 0.0 | 0.1 | 0.0 |
| 33 | 36.1 | 1.3 | 39.7 | 0.0 | 0.0 | 22.8 | 0.0 | 0.1 | 0.0 |
| 34 | 37.6 | 1.8 | 38.2 | 0.0 | 0.0 | 22.3 | 0.0 | 0.1 | 0.0 |
| 35 | 39.3 | 1.6 | 37.5 | 0.0 | 0.0 | 21.5 | 0.0 | 0.1 | 0.0 |
| 37 | 41.2 | 1.5 | 36.2 | 0.0 | 0.0 | 21.1 | 0.0 | 0.0 | 0.0 |
| 39 | 44.1 | 1.4 | 34.2 | 0.0 | 0.0 | 20.2 | 0.0 | 0.0 | 0.0 |
| 41 | 46.6 | 1.1 | 32.8 | 0.0 | 0.0 | 19.5 | 0.0 | 0.0 | 0.0 |
| 43 | 48.0 | 1.4 | 31.9 | 0.0 | 0.0 | 18.7 | 0.0 | 0.0 | 0.0 |

TABLE 1

Materials and layer structure of comparative examples.

| | Comparative example 1 | | Comparative example 2 | | Comparative example 3 | |
|---|---|---|---|---|---|---|
| | Material | Thickness | Material | Thickness | Material | Thickness |
| Layer 1 | PET | 50 μm | PET | 50 μm | PET | 50 μm |
| Layer 2 | Silica filled polymer layer | 2.0 μm | Silica filled polymeric layer | 1.9 μm | Silica filled acrylic polymer | 2.1 μm |
| Layer 3 | Indium Zinc Oxide | 51 nm | Niobium Oxide | 16 nm | Zinc Tin Oxide | 20 nm |
| Layer 4 | Gold | 13 nm | Zinc Tin Oxide | 12 nm | Silver Palladium Alloy | 12 nm |
| Layer 5 | Indium Zinc Oxide | 31 nm | Silver Palladium alloy | 11 nm | Zinc Tin Oxide | 9 nm |
| Layer 6 | Silicon Nitride | 12 nm | Zinc Tin Oxide | 17 nm | Hollow silica filled polymeric layer | 51-59 nm |
| Layer 7 | Fluoropolymer | <5 nm | Hollow silica filled polymeric layer | 45-96 nm | None | — |

TABLE 2-continued

Atomic concentration depth profile of film from Comparative Example 1 as measured by XPS.

| Sputter time (min) | C | N | O | F | Al | Si | Zn | In | Au |
|---|---|---|---|---|---|---|---|---|---|
| 45 | 50.4 | 1.2 | 30.1 | 0.0 | 0.0 | 18.3 | 0.0 | 0.0 | 0.0 |
| 47 | 51.9 | 1.3 | 29.2 | 0.0 | 0.0 | 17.6 | 0.0 | 0.0 | 0.0 |
| 49 | 53.4 | 1.3 | 28.3 | 0.0 | 0.0 | 17.0 | 0.0 | 0.0 | 0.0 |

TABLE 3

Atomic concentration depth profile of film from comparative example 2 as measured by XPS.

| Sputter time (min) | C | N | O | F | Si | Zn | Nb | Pd | Ag | Sn |
|---|---|---|---|---|---|---|---|---|---|---|
| 0.0 | 53.2 | 1.2 | 29.1 | 3.3 | 13.0 | 0.0 | 0.0 | 0.0 | 0.0 | 0.1 |
| 1.5 | 37.6 | 0.6 | 38.4 | 1.7 | 21.5 | 0.0 | 0.0 | 0.1 | 0.1 | 0.1 |
| 3.0 | 27.1 | 0.3 | 46.2 | 1.4 | 24.7 | 0.1 | 0.0 | 0.0 | 0.0 | 0.1 |
| 4.5 | 21.3 | 0.8 | 50.0 | 1.2 | 26.6 | 0.0 | 0.0 | 0.0 | 0.0 | 0.1 |
| 6.0 | 15.3 | 0.3 | 54.8 | 1.0 | 28.2 | 0.2 | 0.0 | 0.0 | 0.0 | 0.1 |
| 7.5 | 12.5 | 0.2 | 56.8 | 1.0 | 29.4 | 0.0 | 0.0 | 0.0 | 0.0 | 0.1 |
| 9.0 | 10.6 | 0.3 | 58.6 | 0.9 | 29.4 | 0.0 | 0.0 | 0.0 | 0.0 | 0.1 |
| 10.5 | 9.2 | 0.1 | 59.9 | 0.7 | 29.8 | 0.0 | 0.1 | 0.0 | 0.1 | 0.1 |
| 12.0 | 8.2 | 0.2 | 60.6 | 0.7 | 30.1 | 0.0 | 0.0 | 0.0 | 0.0 | 0.2 |
| 13.5 | 8.9 | 0.0 | 61.3 | 0.5 | 28.9 | 0.0 | 0.0 | 0.0 | 0.0 | 0.3 |
| 15.0 | 8.8 | 0.2 | 61.2 | 0.5 | 28.7 | 0.1 | 0.0 | 0.0 | 0.0 | 0.5 |
| 16.5 | 9.4 | 0.4 | 60.5 | 0.4 | 28.3 | 0.2 | 0.0 | 0.0 | 0.0 | 0.9 |
| 18.0 | 10.8 | 0.4 | 59.0 | 0.6 | 27.3 | 0.2 | 0.2 | 0.0 | 0.0 | 1.5 |
| 19.5 | 13.9 | 0.3 | 56.5 | 0.3 | 25.8 | 0.6 | 0.1 | 0.0 | 0.0 | 2.7 |
| 21.0 | 15.0 | 0.2 | 54.8 | 0.0 | 24.6 | 1.1 | 0.0 | 0.0 | 0.0 | 4.3 |
| 22.5 | 15.4 | 0.6 | 52.7 | 0.1 | 22.6 | 2.0 | 0.0 | 0.0 | 0.0 | 6.6 |
| 24.0 | 15.5 | 0.0 | 50.6 | 0.0 | 21.3 | 3.2 | 0.0 | 0.0 | 0.1 | 9.3 |
| 25.5 | 17.2 | 0.0 | 49.6 | 0.0 | 15.9 | 4.4 | 0.0 | 0.1 | 0.2 | 12.6 |
| 27.0 | 14.5 | 0.0 | 50.4 | 0.0 | 12.9 | 6.2 | 0.0 | 0.0 | 0.5 | 15.4 |
| 28.5 | 13.1 | 0.0 | 46.9 | 0.0 | 12.1 | 8.4 | 0.0 | 0.0 | 1.2 | 18.3 |
| 30.0 | 12.6 | 0.0 | 46.5 | 0.0 | 8.9 | 9.6 | 0.1 | 0.1 | 2.7 | 19.7 |
| 31.5 | 9.5 | 0.0 | 46.5 | 0.0 | 5.7 | 11.3 | 0.1 | 0.2 | 5.5 | 21.3 |
| 33.0 | 7.7 | 0.0 | 43.3 | 0.0 | 4.3 | 12.4 | 0.0 | 0.4 | 9.7 | 22.2 |
| 34.5 | 7.3 | 0.0 | 42.4 | 0.0 | 1.1 | 12.5 | 0.0 | 0.6 | 14.6 | 21.5 |
| 36.0 | 5.7 | 0.0 | 39.9 | 0.0 | 0.0 | 12.9 | 0.1 | 1.0 | 19.2 | 21.3 |
| 37.5 | 5.6 | 0.0 | 39.4 | 0.0 | 0.0 | 11.8 | 0.0 | 1.2 | 21.1 | 20.9 |
| 39.0 | 3.1 | 0.0 | 40.4 | 0.0 | 0.0 | 12.1 | 0.1 | 1.3 | 21.4 | 21.6 |
| 40.5 | 2.3 | 0.0 | 41.4 | 0.0 | 0.0 | 12.1 | 0.1 | 1.3 | 20.3 | 22.4 |
| 42.0 | 1.0 | 0.0 | 43.2 | 0.0 | 0.0 | 12.5 | 0.9 | 1.3 | 18.4 | 22.7 |
| 43.5 | 1.5 | 0.0 | 44.0 | 0.0 | 0.0 | 12.7 | 1.7 | 1.3 | 16.3 | 22.6 |
| 45.0 | 0.8 | 0.0 | 46.6 | 0.0 | 0.0 | 12.5 | 2.9 | 1.2 | 14.0 | 22.1 |
| 46.5 | 0.4 | 0.0 | 48.5 | 0.0 | 0.0 | 12.3 | 5.0 | 0.9 | 11.8 | 21.2 |
| 48.0 | 0.4 | 0.0 | 50.5 | 0.0 | 0.0 | 11.8 | 7.7 | 0.9 | 9.4 | 19.2 |
| 49.5 | 0.0 | 0.0 | 53.4 | 0.0 | 0.0 | 10.7 | 11.2 | 0.8 | 7.0 | 16.9 |

TABLE 3-continued

Atomic concentration depth profile of film from comparative example 2 as measured by XPS.

| Sputter time (min) | C | N | O | F | Si | Zn | Nb | Pd | Ag | Sn |
|---|---|---|---|---|---|---|---|---|---|---|
| 51.0 | 0.4 | 0.0 | 56.7 | 0.0 | 0.0 | 8.9 | 14.0 | 0.7 | 4.8 | 14.5 |
| 52.5 | 0.2 | 0.0 | 57.1 | 0.0 | 0.7 | 7.8 | 17.8 | 0.4 | 3.3 | 12.8 |
| 54.0 | 1.0 | 0.0 | 58.1 | 0.0 | 0.5 | 7.1 | 21.0 | 0.3 | 1.7 | 10.3 |
| 55.5 | 0.0 | 0.0 | 59.3 | 0.0 | 0.1 | 6.0 | 24.6 | 0.3 | 0.8 | 9.0 |
| 57.0 | 0.1 | 0.0 | 60.2 | 0.0 | 0.0 | 4.9 | 27.5 | 0.2 | 0.0 | 7.1 |
| 58.5 | 0.0 | 0.0 | 61.0 | 0.0 | 0.3 | 3.8 | 29.6 | 0.1 | 0.0 | 5.3 |
| 60.0 | 0.9 | 0.0 | 61.0 | 0.0 | 0.0 | 2.9 | 31.3 | 0.1 | 0.0 | 3.8 |
| 61.5 | 0.0 | 0.8 | 60.4 | 0.0 | 3.0 | 1.9 | 31.4 | 0.0 | 0.0 | 2.5 |
| 63.0 | 1.5 | 0.0 | 59.9 | 0.0 | 3.3 | 1.4 | 32.2 | 0.1 | 0.0 | 1.5 |
| 64.5 | 2.7 | 0.0 | 59.6 | 0.0 | 5.5 | 0.7 | 30.6 | 0.0 | 0.0 | 0.9 |
| 66.0 | 5.8 | 0.0 | 57.5 | 0.0 | 7.7 | 0.6 | 27.8 | 0.0 | 0.0 | 0.6 |
| 67.5 | 6.5 | 0.1 | 57.9 | 0.0 | 10.2 | 0.2 | 24.8 | 0.1 | 0.0 | 0.4 |
| 69.0 | 8.0 | 0.7 | 55.9 | 0.0 | 13.2 | 0.1 | 22.0 | 0.0 | 0.0 | 0.2 |
| 70.5 | 10.6 | 0.0 | 55.0 | 0.0 | 15.6 | 0.1 | 18.5 | 0.1 | 0.0 | 0.1 |
| 72.0 | 12.1 | 0.0 | 54.1 | 0.0 | 17.9 | 0.1 | 15.8 | 0.1 | 0.0 | 0.0 |
| 73.5 | 14.6 | 0.1 | 52.7 | 0.0 | 19.5 | 0.0 | 13.1 | 0.0 | 0.0 | 0.0 |
| 75.0 | 14.3 | 0.3 | 53.4 | 0.0 | 21.1 | 0.0 | 10.9 | 0.0 | 0.0 | 0.0 |
| 76.5 | 15.8 | 0.2 | 52.6 | 0.0 | 23.0 | 0.0 | 8.3 | 0.0 | 0.0 | 0.0 |
| 78.0 | 16.4 | 0.3 | 52.3 | 0.0 | 24.4 | 0.0 | 6.6 | 0.0 | 0.0 | 0.0 |
| 79.5 | 16.2 | 0.4 | 53.2 | 0.0 | 25.2 | 0.0 | 5.1 | 0.0 | 0.0 | 0.0 |
| 81.0 | 17.0 | 0.2 | 52.8 | 0.0 | 26.1 | 0.1 | 3.8 | 0.0 | 0.0 | 0.0 |
| 82.5 | 17.9 | 0.2 | 52.9 | 0.0 | 26.1 | 0.0 | 2.9 | 0.0 | 0.0 | 0.0 |
| 84.0 | 17.5 | 0.3 | 53.2 | 0.0 | 26.8 | 0.0 | 2.2 | 0.0 | 0.0 | 0.0 |
| 85.5 | 17.3 | 0.1 | 53.9 | 0.0 | 27.1 | 0.0 | 1.7 | 0.0 | 0.0 | 0.0 |
| 87.0 | 16.4 | 0.4 | 53.9 | 0.0 | 27.9 | 0.0 | 1.4 | 0.0 | 0.0 | 0.0 |
| 88.5 | 17.2 | 0.3 | 53.5 | 0.0 | 27.8 | 0.0 | 1.1 | 0.0 | 0.0 | 0.0 |
| 90.0 | 16.6 | 0.4 | 54.4 | 0.0 | 27.8 | 0.0 | 0.9 | 0.0 | 0.0 | 0.0 |
| 91.5 | 17.1 | 0.3 | 54.0 | 0.0 | 28.0 | 0.0 | 0.6 | 0.0 | 0.0 | 0.0 |
| 93.0 | 16.2 | 0.3 | 54.4 | 0.0 | 28.6 | 0.0 | 0.5 | 0.0 | 0.0 | 0.0 |
| 94.5 | 16.8 | 0.2 | 54.0 | 0.0 | 28.7 | 0.0 | 0.3 | 0.0 | 0.0 | 0.0 |
| 96.0 | 16.8 | 0.1 | 54.4 | 0.0 | 28.3 | 0.0 | 0.3 | 0.0 | 0.0 | 0.0 |
| 97.5 | 16.4 | 0.3 | 54.2 | 0.0 | 28.8 | 0.0 | 0.2 | 0.0 | 0.0 | 0.0 |
| 99.0 | 16.5 | 0.3 | 53.8 | 0.0 | 29.1 | 0.0 | 0.3 | 0.0 | 0.0 | 0.0 |
| 100.5 | 16.6 | 0.2 | 54.2 | 0.0 | 28.7 | 0.0 | 0.3 | 0.0 | 0.0 | 0.0 |
| 102.0 | 17.0 | 0.3 | 53.8 | 0.0 | 28.7 | 0.0 | 0.2 | 0.0 | 0.0 | 0.0 |
| 103.5 | 16.7 | 0.4 | 54.1 | 0.0 | 28.7 | 0.0 | 0.1 | 0.0 | 0.0 | 0.0 |
| 105.0 | 16.8 | 0.4 | 54.2 | 0.0 | 28.6 | 0.0 | 0.0 | 0.0 | 0.0 | 0.0 |
| 106.5 | 17.5 | 0.3 | 53.7 | 0.0 | 28.4 | 0.0 | 0.1 | 0.0 | 0.0 | 0.0 |
| 108.0 | 17.1 | 0.5 | 53.9 | 0.0 | 28.4 | 0.0 | 0.0 | 0.0 | 0.0 | 0.0 |
| 109.5 | 17.0 | 0.3 | 53.8 | 0.0 | 28.9 | 0.0 | 0.0 | 0.0 | 0.0 | 0.0 |
| 111.0 | 16.4 | 0.5 | 54.2 | 0.0 | 28.8 | 0.0 | 0.0 | 0.0 | 0.0 | 0.0 |
| 112.5 | 17.4 | 0.3 | 54.0 | 0.0 | 28.3 | 0.0 | 0.0 | 0.0 | 0.0 | 0.0 |
| 114.0 | 17.2 | 0.4 | 53.9 | 0.0 | 28.3 | 0.1 | 0.1 | 0.0 | 0.0 | 0.0 |
| 115.5 | 17.6 | 0.2 | 53.6 | 0.0 | 28.5 | 0.0 | 0.1 | 0.0 | 0.0 | 0.0 |
| 117.0 | 17.0 | 0.6 | 53.6 | 0.0 | 28.7 | 0.0 | 0.0 | 0.0 | 0.0 | 0.0 |
| 118.5 | 17.8 | 0.3 | 53.2 | 0.0 | 28.6 | 0.1 | 0.0 | 0.0 | 0.0 | 0.0 |
| 120.0 | 17.2 | 0.3 | 53.6 | 0.0 | 28.9 | 0.0 | 0.0 | 0.1 | 0.0 | 0.0 |
| 121.5 | 17.5 | 0.5 | 53.4 | 0.0 | 28.6 | 0.0 | 0.0 | 0.0 | 0.0 | 0.0 |

TABLE 4

Atomic concentration depth profile of film from comparative example 3 as measured using XPS.

| Sputter time (min) | C | N | O | F | Si | Zn | Pd | Ag | Sn |
|---|---|---|---|---|---|---|---|---|---|
| 0 | 44.19 | 2.77 | 22.57 | 26.5 | 3.89 | 0.05 | 0 | 0 | 0.03 |
| 0.5 | 27.08 | 0.74 | 47.7 | 0.06 | 24.35 | 0 | 0 | 0 | 0.07 |
| 1 | 21.1 | 0 | 51.87 | 0.15 | 26.8 | 0 | 0 | 0 | 0.08 |
| 1.5 | 18.98 | 0.99 | 52.55 | 0.1 | 27.23 | 0 | 0.03 | 0.05 | 0.07 |
| 2 | 16.62 | 0.49 | 54.72 | 0.23 | 27.78 | 0.02 | 0.03 | 0.05 | 0.07 |
| 2.5 | 17.93 | 0 | 53.48 | 0.31 | 28.12 | 0.11 | 0 | 0.06 | 0 |
| 3 | 18.4 | 0 | 52.86 | 0.12 | 28.54 | 0 | 0 | 0.01 | 0.06 |
| 3.5 | 18.45 | 0.44 | 52.62 | 0.43 | 27.93 | 0 | 0.01 | 0.06 | 0.07 |
| 4 | 20.89 | 0.41 | 50.59 | 0.52 | 27.24 | 0.25 | 0.01 | 0.04 | 0.05 |
| 4.5 | 22.17 | 0.64 | 49.85 | 0.15 | 26.92 | 0.14 | 0.03 | 0 | 0.1 |
| 5 | 21.51 | 0 | 49.95 | 0.68 | 27.59 | 0.05 | 0 | 0.02 | 0.2 |
| 5.5 | 22.18 | 0.47 | 49.85 | 0.11 | 26.86 | 0 | 0.04 | 0 | 0.47 |

TABLE 4-continued

Atomic concentration depth profile of film from comparative example 3 as measured using XPS.

| Sputter time (min) | C | N | O | F | Si | Zn | Pd | Ag | Sn |
|---|---|---|---|---|---|---|---|---|---|
| 6 | 23.2 | 0.38 | 48.51 | 1.12 | 25.46 | 0.34 | 0 | 0 | 0.99 |
| 6.5 | 23.78 | 0.78 | 48.54 | 0.97 | 23.31 | 0.65 | 0 | 0.01 | 1.96 |
| 7 | 23.25 | 0 | 48.8 | 0 | 23.09 | 1.02 | 0.01 | 0.01 | 3.82 |
| 7.5 | 25.2 | 0.55 | 46.8 | 0 | 19.33 | 1.73 | 0 | 0 | 6.39 |
| 8 | 22.64 | 0.7 | 45.6 | 0.05 | 17.81 | 3 | 0 | 0.07 | 10.12 |
| 8.5 | 19.18 | 1.85 | 44.83 | 0 | 13.99 | 5.14 | 0 | 0.02 | 15 |
| 9 | 16.22 | 0 | 45.92 | 0 | 10.82 | 7.32 | 0.06 | 0 | 19.66 |
| 9.5 | 12.02 | 0.15 | 47.33 | 0 | 6.72 | 9.69 | 0.05 | 0.02 | 24.02 |
| 10 | 5.65 | 0 | 48.53 | 0 | 5.15 | 12.57 | 0 | 0.48 | 27.62 |
| 10.5 | 6.25 | 0.07 | 47.58 | 0 | 3.53 | 13.63 | 0.14 | 1.26 | 27.55 |
| 11 | 1.56 | 0 | 49.52 | 0 | 1.54 | 15.7 | 0.17 | 2.88 | 28.63 |
| 11.5 | 1.66 | 0.38 | 48.26 | 0 | 0 | 16.84 | 0.2 | 5.36 | 27.31 |
| 12 | 0.78 | 0 | 45.7 | 0 | 0 | 17.33 | 0.45 | 10.07 | 25.67 |
| 12.5 | 0.75 | 0.66 | 40.72 | 0 | 0 | 16.96 | 0.8 | 17.22 | 22.89 |
| 13 | 0.89 | 0 | 37.24 | 0 | 0 | 15.56 | 1.16 | 27 | 18.15 |
| 13.5 | 0.43 | 0 | 29.16 | 0 | 0 | 13.24 | 1.71 | 40.7 | 14.75 |
| 14 | 2.45 | 1.58 | 24.53 | 0 | 0 | 9.16 | 2.19 | 48.79 | 11.3 |
| 14.5 | 0 | 0 | 27.38 | 0.5 | 0 | 7.41 | 2.48 | 50.22 | 12.01 |
| 15 | 7.57 | 1.41 | 31.44 | 0 | 0 | 6.79 | 2.19 | 36.85 | 13.74 |
| 15.5 | 8.39 | 0.67 | 38.89 | 0 | 0 | 8.17 | 1.88 | 24.62 | 17.37 |
| 16 | 18.5 | 0.81 | 39.63 | 0 | 0.89 | 8.62 | 1.34 | 12.95 | 17.25 |
| 16.5 | 26.57 | 0 | 38.15 | 0 | 5.28 | 8.23 | 0.98 | 6.3 | 14.5 |
| 17 | 38.07 | 0.18 | 33.28 | 0 | 7.62 | 6.27 | 0.72 | 3.01 | 10.85 |
| 17.5 | 43.23 | 1.06 | 31.21 | 0.23 | 9.96 | 4.91 | 0.44 | 1.6 | 7.36 |
| 18 | 48.16 | 0.79 | 29.57 | 0.2 | 12.43 | 3.04 | 0.28 | 0.86 | 4.67 |
| 18.5 | 49.89 | 0.66 | 30.03 | 0.31 | 13.53 | 1.82 | 0.23 | 0.62 | 2.92 |
| 19 | 49.39 | 1.65 | 30.57 | 0 | 15.24 | 0.95 | 0.16 | 0.32 | 1.71 |
| 19.5 | 50.39 | 0.6 | 30.93 | 0.16 | 15.9 | 0.56 | 0.16 | 0.24 | 1.07 |
| 20 | 49.76 | 1.07 | 31.49 | 0.3 | 16.3 | 0.25 | 0.05 | 0.13 | 0.66 |
| 20.5 | 48.78 | 0.8 | 32.39 | 0 | 17.13 | 0.23 | 0.07 | 0.04 | 0.54 |
| 21 | 50.26 | 1.33 | 31.17 | 0.18 | 16.53 | 0.05 | 0.06 | 0.03 | 0.4 |
| 21.5 | 50.92 | 0.86 | 30.84 | 0 | 16.82 | 0.15 | 0.03 | 0.08 | 0.3 |
| 22 | 51.91 | 1.34 | 29.91 | 0 | 16.44 | 0.01 | 0.06 | 0.1 | 0.22 |
| 22.5 | 52.74 | 0.47 | 29.55 | 0.06 | 16.94 | 0.01 | 0.02 | 0.07 | 0.14 |
| 23 | 54.76 | 0 | 28.96 | 0 | 16.1 | 0.04 | 0.01 | 0 | 0.13 |
| 23.5 | 54.52 | 0.66 | 29.03 | 0 | 15.62 | 0 | 0.03 | 0.02 | 0.11 |
| 24 | 55.15 | 0.65 | 28.2 | 0 | 15.88 | 0 | 0 | 0.01 | 0.11 |
| 24.5 | 54.96 | 1.5 | 26.64 | 0.6 | 16.05 | 0.12 | 0 | 0.04 | 0.1 |
| 25 | 56.65 | 0.23 | 26.97 | 0.31 | 15.56 | 0.14 | 0 | 0.05 | 0.1 |
| 25.5 | 56.49 | 0.85 | 27.19 | 0 | 15.36 | 0.02 | 0.01 | 0 | 0.08 |
| 26 | 57.09 | 0.32 | 26.84 | 0 | 15.56 | 0.07 | 0.02 | 0 | 0.1 |
| 26.5 | 57 | 1.02 | 26.45 | 0.4 | 15.11 | 0 | 0 | 0 | 0.02 |
| 27 | 58.22 | 0.15 | 26.42 | 0 | 15.1 | 0.03 | 0 | 0.04 | 0.03 |
| 27.5 | 57.27 | 1.06 | 26.08 | 0.29 | 15.22 | 0.05 | 0 | 0 | 0.04 |
| 28 | 58.44 | 0.17 | 26.49 | 0 | 14.9 | 0 | 0 | 0 | 0 |
| 28.5 | 58.83 | 0.09 | 26.04 | 0 | 14.95 | 0 | 0.05 | 0.01 | 0.02 |
| 29 | 58.4 | 1.11 | 25.63 | 0.06 | 14.8 | 0 | 0 | 0 | 0 |
| 29.5 | 59.24 | 0.48 | 25.47 | 0 | 14.78 | 0 | 0.01 | 0.02 | 0 |
| 30 | 58.64 | 1.21 | 25.7 | 0 | 14.34 | 0.02 | 0.05 | 0.02 | 0.02 |

TABLE 6

Atomic concentration depth profile of film of comparative example 4 as measured by XPS.

| min | C | N | O | Al | Si | Zn | Ag | Sn | Au |
|---|---|---|---|---|---|---|---|---|---|
| 0 | 80.0 | 0.0 | 18.9 | 0.0 | 1.1 | 0.0 | 0.1 | 0.0 | 0.0 |
| 0.5 | 98.4 | 0.1 | 1.1 | 0.0 | 0.4 | 0.0 | 0.0 | 0.0 | 0.0 |
| 1 | 98.6 | 0.0 | 1.2 | 0.0 | 0.2 | 0.0 | 0.0 | 0.0 | 0.0 |
| 1.5 | 98.0 | 0.2 | 1.5 | 0.0 | 0.4 | 0.0 | 0.0 | 0.0 | 0.0 |
| 2 | 97.7 | 0.2 | 1.8 | 0.0 | 0.4 | 0.0 | 0.0 | 0.0 | 0.0 |
| 2.5 | 97.4 | 0.0 | 1.8 | 0.2 | 0.7 | 0.0 | 0.0 | 0.0 | 0.0 |
| 3 | 96.8 | 0.0 | 2.3 | 0.1 | 0.7 | 0.1 | 0.0 | 0.0 | 0.0 |
| 3.5 | 96.2 | 0.0 | 2.7 | 0.0 | 1.0 | 0.0 | 0.0 | 0.0 | 0.0 |
| 4 | 95.2 | 0.1 | 3.3 | 0.1 | 1.4 | 0.1 | 0.0 | 0.0 | 0.0 |
| 4.5 | 93.3 | 0.0 | 4.0 | 0.2 | 2.5 | 0.1 | 0.0 | 0.0 | 0.0 |
| 5 | 90.7 | 0.0 | 6.0 | 0.2 | 3.1 | 0.0 | 0.0 | 0.0 | 0.0 |
| 5.5 | 87.3 | 0.1 | 7.7 | 0.3 | 4.5 | 0.0 | 0.1 | 0.0 | 0.0 |
| 6 | 82.7 | 0.0 | 10.6 | 0.4 | 6.2 | 0.0 | 0.0 | 0.0 | 0.0 |
| 6.5 | 76.3 | 0.5 | 14.1 | 0.6 | 8.5 | 0.0 | 0.0 | 0.0 | 0.0 |
| 7 | 68.9 | 0.3 | 19.2 | 0.7 | 10.9 | 0.0 | 0.0 | 0.0 | 0.0 |
| 7.5 | 61.1 | 0.6 | 23.9 | 1.3 | 13.2 | 0.0 | 0.0 | 0.1 | 0.0 |
| 8 | 54.4 | 0.3 | 28.2 | 1.0 | 16.1 | 0.0 | 0.0 | 0.0 | 0.0 |
| 8.5 | 50.1 | 0.7 | 30.6 | 1.5 | 17.1 | 0.1 | 0.0 | 0.0 | 0.0 |
| 9 | 48.8 | 0.8 | 31.5 | 1.7 | 17.3 | 0.0 | 0.0 | 0.0 | 0.0 |
| 9.5 | 51.7 | 0.5 | 29.5 | 1.3 | 16.9 | 0.0 | 0.1 | 0.0 | 0.0 |
| 10 | 58.5 | 0.2 | 24.6 | 1.6 | 15.0 | 0.1 | 0.0 | 0.0 | 0.0 |
| 10.5 | 67.0 | 0.6 | 18.7 | 1.4 | 12.3 | 0.0 | 0.0 | 0.0 | 0.0 |

TABLE 6-continued

Atomic concentration depth profile of film of comparative example 4 as measured by XPS.

Atomic concentrations (%)

| min | C | N | O | Al | Si | Zn | Ag | Sn | Au |
|---|---|---|---|---|---|---|---|---|---|
| 11 | 76.0 | 0.4 | 13.9 | 0.9 | 8.8 | 0.0 | 0.0 | 0.1 | 0.0 |
| 11.5 | 82.9 | 0.5 | 8.7 | 0.7 | 7.1 | 0.0 | 0.0 | 0.0 | 0.0 |
| 12 | 87.3 | 0.0 | 6.4 | 0.5 | 5.8 | 0.0 | 0.0 | 0.0 | 0.0 |
| 12.5 | 91.3 | 0.0 | 4.2 | 0.4 | 3.9 | 0.1 | 0.1 | 0.1 | 0.0 |
| 13 | 94.0 | 0.0 | 2.8 | 0.3 | 2.9 | 0.0 | 0.0 | 0.1 | 0.0 |
| 13.5 | 94.7 | 0.0 | 2.6 | 0.4 | 2.1 | 0.0 | 0.0 | 0.2 | 0.1 |
| 14 | 94.9 | 0.0 | 3.0 | 0.3 | 1.5 | 0.0 | 0.0 | 0.3 | 0.1 |
| 14.5 | 93.8 | 0.0 | 3.4 | 0.5 | 1.3 | 0.4 | 0.1 | 0.5 | 0.1 |
| 15 | 91.0 | 0.0 | 5.1 | 0.4 | 1.5 | 0.7 | 0.2 | 0.9 | 0.2 |
| 15.5 | 90.4 | 0.0 | 5.1 | 0.1 | 0.8 | 1.1 | 0.4 | 1.8 | 0.3 |
| 16 | 84.7 | 0.0 | 8.4 | 0.0 | 0.1 | 2.4 | 1.1 | 2.9 | 0.4 |
| 16.5 | 76.2 | 0.0 | 10.0 | 0.0 | 0.0 | 5.1 | 3.3 | 4.6 | 0.8 |
| 17 | 64.4 | 0.0 | 11.7 | 0.5 | 0.0 | 7.9 | 8.0 | 6.2 | 1.4 |
| 17.5 | 47.7 | 0.0 | 13.3 | 0.0 | 0.0 | 11.0 | 18.4 | 7.1 | 2.5 |
| 18 | 33.3 | 0.0 | 12.2 | 0.0 | 0.0 | 11.8 | 32.1 | 6.8 | 3.8 |
| 18.5 | 20.9 | 0.0 | 10.7 | 0.0 | 0.0 | 11.5 | 45.3 | 6.3 | 5.3 |
| 19 | 19.4 | 0.0 | 12.4 | 0.0 | 0.0 | 10.4 | 46.2 | 6.0 | 5.7 |
| 19.5 | 25.9 | 0.1 | 14.5 | 0.0 | 0.0 | 10.8 | 37.0 | 6.7 | 5.1 |
| 20 | 37.1 | 0.0 | 15.9 | 0.0 | 0.0 | 10.7 | 25.3 | 7.0 | 4.0 |
| 20.5 | 54.2 | 0.0 | 13.4 | 0.0 | 0.0 | 9.7 | 13.9 | 5.9 | 2.8 |
| 21 | 67.9 | 0.0 | 10.4 | 0.0 | 0.0 | 8.3 | 7.1 | 4.5 | 1.9 |
| 21.5 | 79.7 | 0.0 | 6.5 | 0.1 | 0.0 | 5.5 | 3.8 | 3.2 | 1.2 |
| 22 | 87.6 | 0.0 | 3.6 | 0.0 | 0.0 | 3.8 | 2.0 | 2.1 | 0.8 |
| 22.5 | 92.8 | 0.0 | 2.1 | 0.0 | 0.0 | 2.3 | 1.0 | 1.3 | 0.5 |
| 23 | 95.0 | 0.0 | 1.7 | 0.2 | 0.1 | 1.3 | 0.6 | 0.9 | 0.4 |
| 23.5 | 97.1 | 0.0 | 1.1 | 0.0 | 0.0 | 0.7 | 0.3 | 0.6 | 0.2 |
| 24 | 97.6 | 0.0 | 0.9 | 0.2 | 0.1 | 0.4 | 0.2 | 0.5 | 0.2 |
| 24.5 | 98.4 | 0.0 | 0.8 | 0.0 | 0.0 | 0.2 | 0.1 | 0.3 | 0.1 |
| 25 | 98.7 | 0.0 | 0.7 | 0.0 | 0.0 | 0.1 | 0.1 | 0.3 | 0.1 |
| 25.5 | 98.8 | 0.0 | 0.8 | 0.0 | 0.0 | 0.0 | 0.1 | 0.2 | 0.1 |
| 26 | 98.3 | 0.0 | 1.1 | 0.1 | 0.0 | 0.1 | 0.1 | 0.1 | 0.1 |
| 26.5 | 98.7 | 0.0 | 0.8 | 0.2 | 0.0 | 0.0 | 0.1 | 0.1 | 0.1 |
| 27 | 98.4 | 0.0 | 1.2 | 0.1 | 0.0 | 0.1 | 0.1 | 0.2 | 0.0 |
| 27.5 | 98.4 | 0.0 | 1.2 | 0.1 | 0.0 | 0.0 | 0.1 | 0.1 | 0.0 |
| 28 | 98.7 | 0.0 | 1.0 | 0.0 | 0.0 | 0.0 | 0.0 | 0.1 | 0.0 |
| 28.5 | 98.8 | 0.0 | 1.2 | 0.0 | 0.0 | 0.0 | 0.0 | 0.1 | 0.0 |
| 29 | 98.4 | 0.0 | 1.5 | 0.0 | 0.1 | 0.0 | 0.0 | 0.1 | 0.0 |
| 29.5 | 98.6 | 0.0 | 1.2 | 0.1 | 0.0 | 0.0 | 0.0 | 0.0 | 0.0 |
| 30 | 98.8 | 0.0 | 1.1 | 0.0 | 0.0 | 0.0 | 0.0 | 0.1 | 0.0 |
| 30.5 | 98.7 | 0.0 | 1.2 | 0.0 | 0.0 | 0.0 | 0.0 | 0.1 | 0.0 |
| 31 | 98.4 | 0.0 | 1.4 | 0.1 | 0.2 | 0.0 | 0.0 | 0.0 | 0.0 |
| 31.5 | 98.8 | 0.0 | 1.1 | 0.0 | 0.1 | 0.0 | 0.0 | 0.0 | 0.0 |
| 32 | 98.7 | 0.0 | 1.2 | 0.0 | 0.0 | 0.0 | 0.0 | 0.0 | 0.0 |
| 32.5 | 98.9 | 0.0 | 0.9 | 0.1 | 0.0 | 0.1 | 0.0 | 0.0 | 0.0 |
| 33 | 98.5 | 0.0 | 1.4 | 0.0 | 0.0 | 0.0 | 0.0 | 0.1 | 0.0 |
| 33.5 | 98.5 | 0.0 | 1.4 | 0.0 | 0.1 | 0.0 | 0.0 | 0.0 | 0.0 |
| 34 | 98.6 | 0.0 | 1.3 | 0.1 | 0.0 | 0.0 | 0.0 | 0.0 | 0.0 |
| 34.5 | 98.4 | 0.0 | 1.5 | 0.0 | 0.0 | 0.1 | 0.0 | 0.0 | 0.0 |
| 35 | 98.4 | 0.0 | 1.4 | 0.0 | 0.2 | 0.0 | 0.0 | 0.0 | 0.0 |

TABLE 7

Atomic concentration depth profile of film of example 1 as measured by XPS.

| Sputter time in min | C | N | O | Al | Si | Zn | Ag | Sn | Au |
|---|---|---|---|---|---|---|---|---|---|
| 0 | 73.3 | 0.8 | 22.1 | 0.0 | 3.6 | 0.0 | 0.1 | 0.0 | 0.0 |
| 0.5 | 95.7 | 0.5 | 2.3 | 0.0 | 1.5 | 0.0 | 0.0 | 0.0 | 0.0 |
| 1 | 96.9 | 0.1 | 1.9 | 0.0 | 1.1 | 0.0 | 0.1 | 0.0 | 0.0 |
| 1.5 | 96.3 | 0.2 | 2.0 | 0.1 | 0.9 | 0.0 | 0.0 | 0.0 | 0.0 |
| 2 | 96.2 | 0.5 | 2.3 | 0.0 | 0.8 | 0.0 | 0.1 | 0.0 | 0.0 |
| 2.5 | 96.9 | 0.5 | 2.3 | 0.1 | 1.0 | 0.0 | 0.0 | 0.0 | 0.0 |
| 3 | 96.3 | 0.0 | 2.3 | 0.0 | 0.7 | 0.0 | 0.1 | 0.0 | 0.0 |
| 3.5 | 96.1 | 0.3 | 2.7 | 0.0 | 0.6 | 0.0 | 0.1 | 0.0 | 0.0 |
| 4 | 96.6 | 0.7 | 2.7 | 0.0 | 0.5 | 0.0 | 0.0 | 0.0 | 0.0 |
| 4.5 | 96.3 | 0.0 | 2.5 | 0.0 | 0.8 | 0.0 | 0.0 | 0.0 | 0.0 |
| 5 | 96.4 | 0.3 | 2.6 | 0.0 | 0.7 | 0.0 | 0.1 | 0.0 | 0.0 |

TABLE 7-continued

Atomic concentration depth profile of film of example 1 as measured by XPS.

| Sputter time in min | C | N | O | Al | Si | Zn | Ag | Sn | Au |
|---|---|---|---|---|---|---|---|---|---|
| 5.5 | 96.5 | 0.3 | 2.5 | 0.0 | 0.8 | 0.0 | 0.0 | 0.1 | 0.0 |
| 6 | 96.4 | 0.2 | 2.6 | 0.0 | 0.7 | 0.0 | 0.0 | 0.0 | 0.0 |
| 6.5 | 96.4 | 0.5 | 2.4 | 0.1 | 0.6 | 0.1 | 0.1 | 0.0 | 0.0 |
| 7 | 96.5 | 0.2 | 2.9 | 0.0 | 0.5 | 0.0 | 0.0 | 0.0 | 0.0 |
| 7.5 | 96.5 | 0.1 | 2.7 | 0.0 | 0.5 | 0.0 | 0.1 | 0.0 | 0.0 |
| 8 | 96.2 | 0.5 | 2.3 | 0.0 | 0.7 | 0.0 | 0.0 | 0.0 | 0.0 |
| 8.5 | 96.6 | 0.3 | 2.9 | 0.0 | 0.6 | 0.0 | 0.0 | 0.0 | 0.0 |
| 9 | 96.2 | 0.2 | 2.6 | 0.0 | 0.6 | 0.0 | 0.0 | 0.0 | 0.0 |
| 9.5 | 96.6 | 0.5 | 2.6 | 0.1 | 0.5 | 0.0 | 0.0 | 0.1 | 0.0 |
| 10 | 96.8 | 0.4 | 2.5 | 0.0 | 0.5 | 0.0 | 0.0 | 0.0 | 0.0 |
| 10.5 | 97.0 | 0.1 | 2.6 | 0.0 | 0.6 | 0.0 | 0.0 | 0.0 | 0.0 |
| 11 | 96.5 | 0.1 | 2.2 | 0.1 | 0.5 | 0.1 | 0.0 | 0.0 | 0.0 |
| 11.5 | 96.4 | 0.0 | 2.9 | 0.0 | 0.5 | 0.1 | 0.0 | 0.0 | 0.0 |
| 12 | 96.2 | 0.6 | 2.4 | 0.0 | 0.5 | 0.0 | 0.0 | 0.0 | 0.0 |
| 12.5 | 96.6 | 0.2 | 2.9 | 0.1 | 0.6 | 0.0 | 0.0 | 0.0 | 0.0 |
| 13 | 96.2 | 0.0 | 2.5 | 0.0 | 0.9 | 0.0 | 0.0 | 0.0 | 0.0 |
| 13.5 | 97.0 | 0.7 | 2.5 | 0.0 | 0.7 | 0.0 | 0.0 | 0.0 | 0.0 |
| 14 | 96.6 | 0.2 | 2.2 | 0.0 | 0.5 | 0.0 | 0.0 | 0.0 | 0.0 |
| 14.5 | 96.2 | 0.4 | 2.4 | 0.0 | 0.6 | 0.0 | 0.0 | 0.0 | 0.0 |
| 15 | 95.9 | 0.5 | 2.5 | 0.0 | 0.6 | 0.1 | 0.0 | 0.0 | 0.0 |
| 15.5 | 96.6 | 0.7 | 2.5 | 0.1 | 0.7 | 0.1 | 0.0 | 0.1 | 0.0 |
| 16 | 96.8 | 0.2 | 2.2 | 0.1 | 0.6 | 0.1 | 0.0 | 0.1 | 0.0 |
| 16.5 | 96.6 | 0.4 | 1.9 | 0.0 | 0.9 | 0.1 | 0.0 | 0.0 | 0.0 |
| 17 | 96.0 | 0.2 | 2.2 | 0.0 | 0.9 | 0.0 | 0.0 | 0.0 | 0.0 |
| 17.5 | 96.0 | 0.6 | 2.1 | 0.1 | 1.0 | 0.0 | 0.0 | 0.0 | 0.0 |
| 18 | 94.7 | 0.6 | 3.1 | 0.3 | 1.2 | 0.0 | 0.0 | 0.0 | 0.0 |
| 18.5 | 93.5 | 0.7 | 3.6 | 0.1 | 1.9 | 0.0 | 0.0 | 0.0 | 0.0 |
| 19 | 91.6 | 0.6 | 3.6 | 0.1 | 2.2 | 0.1 | 0.0 | 0.1 | 0.0 |
| 19.5 | 88.0 | 0.1 | 4.8 | 0.3 | 3.1 | 0.0 | 0.1 | 0.1 | 0.0 |
| 20 | 84.5 | 0.8 | 6.9 | 0.4 | 3.9 | 0.0 | 0.0 | 0.0 | 0.0 |
| 20.5 | 78.5 | 0.5 | 8.6 | 0.4 | 5.5 | 0.2 | 0.2 | 0.1 | 0.1 |
| 21 | 70.3 | 0.8 | 12.6 | 0.5 | 7.2 | 0.1 | 0.1 | 0.2 | 0.1 |
| 21.5 | 60.4 | 0.8 | 18.2 | 0.8 | 9.2 | 0.1 | 0.1 | 0.4 | 0.1 |
| 22 | 50.2 | 0.7 | 24.3 | 0.5 | 12.4 | 0.5 | 0.2 | 0.8 | 0.2 |
| 22.5 | 35.3 | 0.3 | 30.5 | 0.9 | 14.6 | 1.2 | 0.7 | 1.4 | 0.3 |
| 23 | 25.8 | 0.8 | 38.8 | 1.6 | 17.2 | 2.1 | 1.6 | 2.2 | 0.5 |
| 23.5 | 16.7 | 1.5 | 43.7 | 1.6 | 16.6 | 3.7 | 3.3 | 3.1 | 0.8 |
| 24 | 10.2 | 0.0 | 48.1 | 1.4 | 15.9 | 5.9 | 6.8 | 4.1 | 1.2 |
| 24.5 | 3.2 | 0.4 | 47.4 | 1.4 | 14.7 | 7.6 | 12.0 | 4.6 | 1.8 |
| 25 | 5.0 | 0.4 | 46.5 | 1.2 | 10.3 | 9.9 | 20.6 | 5.1 | 2.8 |
| 25.5 | 1.5 | 0.6 | 37.3 | 1.5 | 8.5 | 9.7 | 29.3 | 4.4 | 3.7 |
| 26 | 0.1 | 0.3 | 32.3 | 1.3 | 4.7 | 9.3 | 41.6 | 4.1 | 5.1 |
| 26.5 | 0.0 | 1.9 | 26.8 | 0.0 | 3.2 | 8.6 | 49.2 | 4.0 | 6.2 |
| 27 | 0.4 | 5.9 | 23.8 | 0.6 | 4.8 | 7.7 | 46.6 | 4.4 | 6.2 |
| 27.5 | 1.1 | 9.9 | 25.5 | 1.6 | 9.9 | 6.9 | 36.2 | 4.4 | 5.3 |
| 28 | 1.3 | 14.5 | 26.9 | 1.8 | 17.4 | 6.1 | 24.5 | 3.9 | 4.0 |
| 28.5 | 0.5 | 18.8 | 28.6 | 2.1 | 22.6 | 5.2 | 15.3 | 3.3 | 2.9 |
| 29 | 0.0 | 24.3 | 27.3 | 2.7 | 27.8 | 4.1 | 8.7 | 2.6 | 2.0 |
| 29.5 | 0.3 | 28.8 | 25.3 | 3.4 | 31.5 | 3.1 | 4.7 | 1.7 | 1.4 |
| 30 | 1.5 | 33.4 | 22.2 | 3.6 | 34.3 | 2.0 | 2.4 | 1.0 | 0.9 |
| 30.5 | 0.0 | 35.7 | 19.3 | 3.8 | 36.4 | 1.2 | 1.2 | 0.5 | 0.5 |
| 31 | 0.7 | 39.1 | 17.0 | 4.2 | 38.1 | 0.6 | 0.5 | 0.2 | 0.3 |
| 31.5 | 1.6 | 40.2 | 15.3 | 3.9 | 39.2 | 0.2 | 0.2 | 0.1 | 0.2 |
| 32 | 0.8 | 40.5 | 14.3 | 4.3 | 38.9 | 0.1 | 0.1 | 0.1 | 0.1 |
| 32.5 | 1.5 | 42.1 | 13.9 | 4.0 | 39.0 | 0.1 | 0.1 | 0.0 | 0.1 |
| 33 | 0.3 | 41.5 | 13.5 | 4.4 | 38.9 | 0.1 | 0.0 | 0.1 | 0.1 |
| 33.5 | 1.1 | 42.3 | 13.7 | 4.3 | 39.3 | 0.0 | 0.0 | 0.0 | 0.0 |
| 34 | 2.5 | 41.6 | 13.7 | 4.3 | 39.3 | 0.0 | 0.1 | 0.0 | 0.0 |
| 34.5 | 1.4 | 41.0 | 14.4 | 4.2 | 37.9 | 0.0 | 0.0 | 0.0 | 0.0 |
| 35 | 2.7 | 40.5 | 15.7 | 4.2 | 38.1 | 0.0 | 0.0 | 0.1 | 0.0 |
| 35.5 | 5.5 | 38.4 | 17.5 | 4.4 | 37.0 | 0.0 | 0.0 | 0.1 | 0.0 |
| 36 | 10.7 | 36.1 | 18.7 | 4.2 | 35.5 | 0.0 | 0.1 | 0.0 | 0.0 |
| 36.5 | 18.8 | 31.4 | 20.8 | 4.0 | 33.2 | 0.0 | 0.0 | 0.0 | 0.0 |
| 37 | 30.8 | 26.4 | 21.2 | 3.6 | 30.0 | 0.0 | 0.0 | 0.0 | 0.0 |
| 37.5 | 45.7 | 19.8 | 21.3 | 3.0 | 25.1 | 0.0 | 0.0 | 0.0 | 0.0 |
| 38 | 58.8 | 13.5 | 18.8 | 2.5 | 19.6 | 0.0 | 0.0 | 0.0 | 0.0 |
| 38.5 | 71.4 | 8.7 | 15.4 | 2.0 | 15.1 | 0.0 | 0.0 | 0.0 | 0.0 |
| 39 | 80.2 | 5.3 | 11.3 | 1.7 | 10.4 | 0.0 | 0.0 | 0.0 | 0.0 |
| 39.5 | 85.9 | 2.9 | 8.3 | 1.1 | 7.6 | 0.0 | 0.0 | 0.0 | 0.0 |
| 40 | 90.4 | 1.9 | 6.1 | 0.8 | 5.3 | 0.0 | 0.0 | 0.0 | 0.0 |
| 40.5 | 92.7 | 0.9 | 4.4 | 0.6 | 3.7 | 0.0 | 0.0 | 0.0 | 0.0 |
| 41 | 94.6 | 0.6 | 3.3 | 0.5 | 2.8 | 0.0 | 0.1 | 0.0 | 0.0 |
| 41.5 | 95.4 | 0.4 | 2.4 | 0.3 | 2.4 | 0.0 | 0.0 | 0.0 | 0.0 |

TABLE 7-continued

Atomic concentration depth profile of film of example 1 as measured by XPS.

| Sputter time in min | C | N | O | Al | Si | Zn | Ag | Sn | Au |
|---|---|---|---|---|---|---|---|---|---|
| 42 | 95.6 | 0.6 | 1.9 | 0.2 | 1.9 | 0.0 | 0.0 | 0.0 | 0.0 |
| 42.5 | 96.7 | 0.4 | 2.0 | 0.3 | 1.6 | 0.1 | 0.0 | 0.0 | 0.0 |
| 43 | 97.2 | 0.3 | 1.6 | 0.2 | 1.2 | 0.0 | 0.0 | 0.0 | 0.0 |
| 43.5 | 97.2 | 0.3 | 1.3 | 0.1 | 1.0 | 0.0 | 0.1 | 0.0 | 0.0 |
| 44 |  | 0.2 | 1.6 | 0.1 | 0.9 | 0.0 | 0.0 | 0.0 | 0.0 |

TABLE 8

Selected optical properties of the film before and after weathering for 720 $MJ/m^2$ total integrated UV dose.

| | Comparative Example 1 | | Comparative Example 2 | | Comparative Example 3 | | Comparative Example 4 | | Example 1 | |
|---|---|---|---|---|---|---|---|---|---|---|
| | Weathering | | Weathering | | Weathering | | Weathering | | Weathering | |
| | Before | After | Before | After | Before | After | Before | After | Before | After |
| Transmission | 68.8 | 68.4 | 71.7 | 72.0 | 73.6 | 73.5 | 75.4 | 68.2 | 77 | 77.9 |
| Reflected L* | 26.1 | 25.4 | 40.2 | 38.0 | 35.7 | 33.2 | 42.8 | 44.4 | 37.5 | 37.5 |
| Reflected a* | −3.6 | −5.3 | 7.1 | 8.7 | 0.7 | 4.0 | 4.1 | 6.3 | 8.1 | 9.5 |
| Reflected b* | 5.2 | 6.0 | −5.6 | −2.0 | −0.7 | −0.2 | 2.0 | 4.4 | 9.7 | 4.2 |
| $\Delta E_{ab}$ | 1.9 | | 4.5 | | 4.2 | | 3.6 | | 4.4 | |
| Emissivity | — | — | — | — | 0.12 | 0.14 | 0.13 | 0.18 | 0.12 | 0.13 |

TABLE 9

Selected optical properties of the film before and after weathering for 3.6 $MJ/m^2$ total integrated UV dose with the weathering chamber operated according to the conditions listed in Table 5A.

| | Comparative Example 1 | | | Comparative Example 2 | | | Comparative Example 3 | | |
|---|---|---|---|---|---|---|---|---|---|
| | Weathering | | | Weathering | | | Weathering | | |
| | Before | After 3.6 $MJ/m^2$ | After 7.2 $MJ/m^2$ | Before | After 3.6 $MJ/m^2$ | After 7.2 $MJ/m^2$ | Before | After 3.6 $MJ/m^2$ | After 7.2 $MJ/m^2$ |
| Transmission | 68.8 | 68.4 | 68.4 | 71.3 | 69.0 | 68.4 | 73.8 | 70.7 | 70.0 |
| Reflected L* | 23.9 | 23.9 | 23.7 | 39.9 | 42.4 | 43.7 | 36.3 | 39.7 | 39.6 |
| Reflected a* | −1.7 | −2.9 | −3.0 | 7.6 | 6.9 | 6.5 | 0.6 | 1.7 | 2.3 |
| Reflected b* | 4.0 | 4.1 | 4.4 | −3.8 | −0.8 | 0.4 | −0.5 | 0.8 | 1.8 |
| $\Delta E_{ab}$ | | 0.6 | 1.4 | | 3.9 | 5.7 | | 3.9 | 4.4 |
| Emissivity | 0.11 | 0.11 | 0.11 | 0.08 | 0.08 | 0.08 | 0.13 | 0.12 | 0.13 |

| | Comparative Example 4 | | | Example 1 | | |
|---|---|---|---|---|---|---|
| | Weathering | | | Weathering | | |
| | Before | After 3.6 $MJ/m^2$ | After 7.2 $MJ/m^2$ | Before | After 3.6 $MJ/m^2$ | After 7.2 $MJ/m^2$ |
| Transmission | 76.3 | 69.4 | 68.2 | 74.0 | 70.7 | 70.8 |
| Reflected L* | 45.2 | 46.7 | 46.6 | 46.6 | 48.6 | 49.2 |
| Reflected a* | 1.0 | 1.7 | 2.2 | 0.5 | 0.4 | 0.4 |
| Reflected b* | −2.2 | −2.0 | −1.2 | 1.7 | 2.5 | 3.1 |
| $\Delta E_{ab}$ | | 1.7 | 2.1 | | 2.1 | 2.9 |
| Emissivity | 0.14 | 0.17 | 0.16 | 0.11 | 0.11 | 0.13 |

TABLE 10

Selected optical properties of the film before and after weathering for 3.6 MJ/m² total integrated UV dose with the weathering chamber operated according to the conditions listed in Table 5B.

|  | Comparative example 1 | | | Comparative example 2 | | | Comparative example 3 | | |
|---|---|---|---|---|---|---|---|---|---|
|  | Weathering | | | Weathering | | | Weathering | | |
|  | Before | After 3.6 MJ/m² | After 7.2 MJ/m² | Before | After 3.6 MJ/m² | After 7.2 MJ/m² | Before | After 3.6 MJ/m² | After 7.2 MJ/m² |
| Transmission | 69.1 | 68.3 | 68.0 | 70.9 | 71.0 | 69.0 | 73.4 | 75.3 | 74.9 |
| Reflected L* | 23.7 | 23.9 | 23.7 | 40.5 | 39.4 | 41.9 | 37.5 | 30.7 | 29.3 |
| Reflected a* | −0.8 | −2.9 | −3.1 | 7.3 | 9.0 | 10.4 | 0.2 | 6.4 | 9.9 |
| Reflected b* | 3.1 | 5.0 | 5.0 | −5.1 | 3.4 | 3.2 | 0.9 | 1.0 | 5.2 |
| Δ $E_{ab}$ | — | 2.9 | 3.0 | — | 8.6 | 8.9 | — | 9.2 | 13.4 |
| Emissivity | 0.09 | 0.11 | 0.12 | 0.09 | 0.08 | 0.10 | 0.09 | 0.13 | 0.13 |

|  | Comparative example 4 | | | Example 1 | | |
|---|---|---|---|---|---|---|
|  | Weathering | | | Weathering | | |
|  | Before | After 3.6 MJ/m² | After 7.2 MJ/m² | Before | After 3.6 MJ/m² | After 7.2 MJ/m² |
| Transmission | 76.2 | 69.4 | 68.0 | 74.1 | 71.9 | 71.0 |
| Reflected L* | 45.2 | 45.5 | 44.7 | 47.6 | 49.4 | 49.2 |
| Reflected a* | 0.5 | 3.0 | 4.2 | 1.0 | 1.0 | 1.7 |
| Reflected b* | −1.4 | 0.6 | 3.0 | 2.6 | 3.2 | 4.9 |
| Δ $E_{ab}$ | — | 3.2 | 5.8 | — | 1.9 | 1.9 |
| Emissivity | 0.14 | 0.17 | 0.18 | 0.13 | 0.11 | 0.12 |

TABLE 11

Materials and coating thicknesses of low emissivity films of Examples 2-14.

| | Layer Description | Example number | | | | | | | | | | | | |
|---|---|---|---|---|---|---|---|---|---|---|---|---|---|---|
| | | 2 | 3 | 4 | 5 | 6 | 7 | 8 | 9 | 10 | 11 | 12 | 13 | 14 |
| 7 | Thickness of second radiation cured acrylate layer in nm | 80 | 80 | 80 | 80 | 80 | 80 | 80 | 80 | 80 | 80 | 80 | 65 | 50 |
| 6 | Thickness of Second Layer Comprising a Silicon Compound in nm | 12 | 3 | 6 | 6 | 6 | 6 | 6 | 6 | 6 | 6 | 6 | 6 | 6 |
|  | Second Layer Comprising a Silicon Compound | SiO | SiO | SiO | SiO | SiO | SiO | SiO | SiO | SiO | SiO | SiO | SiO | SiO |
| 5 | Thickness of Second Layer Comprising a Metal, a Metal Oxide, or a Metal Nitride in nm | 6 | 6 | 6 | 6 | 6 | 6 | 3 | 3 | 6 | 0 | 6 | 6 | 6 |
|  | Second Layer Comprising a Metal, a Metal Oxide, or a Metal Nitride | ZTO | ZTO | ZTO | ZTO | ZTO | ZTO | ZTO | ZTO | ZTO | ZTO | ZTO | ZTO | ZTO |
| 4 | Thickness of Metal Layer in nm | 12 | 12 | 12 | 12 | 12 | 12 | 12 | 12 | 12 | 12 | 12 | 12 | 12 |
|  | Metal Layer | AuAg | AuAg | AuAg | AuAg | AuAg | AuAg | AuAg | AuAg | AuAg | AuAg | AuAg | AuAg | AuAg |
| 3 | Thickness First Layer Comprising a Metal, a Metal Oxide, or a Metal Nitride in nm | 6 | 6 | 6 | 6 | 6 | 3 | 6 | 3 | 3 | 0 | 6 | 6 | 6 |
|  | First Layer Comprising a Metal, a Metal Oxide, or a Metal Nitride | ZTO | ZTO | ZTO | ZTO | ZTO | ZTO | ZTO | ZTO | ZTO | ZTO | ZTO | ZTO | ZTO |

TABLE 11-continued

Materials and coating thicknesses of low emissivity films of Examples 2-14.

| Layer Description | | Example number | | | | | | | | | | | | |
|---|---|---|---|---|---|---|---|---|---|---|---|---|---|---|
| | | 2 | 3 | 4 | 5 | 6 | 7 | 8 | 9 | 10 | 11 | 12 | 13 | 14 |
| 2 | Thickness of First Layer Comprising a Silicon Compound in nm | 20 | 20 | 20 | 5 | 20 | 20 | 20 | 20 | 20 | 20 | 20 | 20 | 20 |
| | First Layer Comprising a Silicon Compound | SiON | SiON | SiON | SiON | SiON | SiON | SiON | SiON | SiON | SiON | SiON | SiON | SiON |
| 1 | Thickness First radiation cured acrylate layer in nm | 1000 | 1000 | 1000 | 1000 | 1000 | 1000 | 1000 | 1000 | 1000 | 1000 | 1000 | 1000 | 1000 |

TABLE 12

Properties of low emissivity films of Examples 2-15.

| | Example number | | | | | | | | | | | | | |
|---|---|---|---|---|---|---|---|---|---|---|---|---|---|---|
| | 2 | 3 | 4 | 5 | 6 | 7 | 8 | 9 | 10 | 11 | 12 | 13 | 14 | 15 |
| Transmission | 70.0 | 74.5 | 72.4 | 69.2 | 76.9 | 74.9 | 77.3 | 76.1 | 72.9 | 77.3 | 70.0 | 71.0 | 72.0 | 68.9 |
| Emissivity | 0.11 | 0.12 | 0.13 | 0.11 | 0.12 | 0.13 | 0.13 | 0.13 | 0.12 | 0.11 | 0.13 | 0.14 | 0.12 | 0.12 |
| Trans-a* | −1.0 | −1.0 | −1.4 | −1.0 | −1.6 | −1.1 | −1.0 | −1.2 | −1.5 | −1.2 | −2.3 | −2.7 | −3.1 | −0.91 |
| Trans-b* | −0.4 | 0.0 | 0.8 | −0.7 | −0.5 | −0.3 | −0.3 | 0.0 | −0.9 | −1.3 | 1.2 | 0.2 | −1.8 | 0.09 |
| Refl L* | 51.7 | 47.1 | 50.0 | 53.6 | 44.9 | 46.6 | 45.2 | 43.6 | 47.5 | 47.1 | 51.4 | 47.5 | 48.0 | 54.71 |
| Refl-a* | 0.8 | 1.5 | 1.2 | −0.2 | 2.2 | 1.1 | 0.4 | 2.2 | 2.6 | 1.9 | 3.1 | 5.7 | 6.9 | 0.19 |
| Refl-b* | 2.6 | 2.2 | 1.1 | 2.6 | 1.9 | 1.3 | 0.7 | 0.9 | 1.3 | 1.7 | 0.2 | 2.5 | 12.7 | −0.79 |
| Resistance to Wet rub* | O | O | O | O | O | O | O | O | X | X | O | O | O | Δ |

*Key: O = No removal, X = Complete removal, Δ = Partial removal, as defined in Test method for resistance to wet rub

We claim:

1. A film comprising the following elements immediately adjacent to each other in the recited order:
   a substrate;
   a first radiation-cured acrylate layer;
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a first layer comprising zinc tin oxide, wherein the layer has a thickness from 4 nm to 8 nm;
   a metal layer;
   a second layer comprising zinc tin oxide, wherein the layer has a thickness from 4 nm to 8 nm;
   a second layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof, and
   a second radiation-cured acrylate layer;
wherein the film has an emissivity of less than 0.2
wherein the sum of the thickness of the first layer comprising a silicon compound plus the thickness of the first layer comprising zinc tin oxide is from 15 nm to 30 nm,
wherein the sum of the thickness of the second layer comprising a silicon compound plus the thickness of the second layer comprising zinc tin oxide is from 9 nm to 15 nm.

2. The film according to claim 1, wherein the sum of the thickness of the first layer comprising a silicon compound plus the thickness of the first layer comprising zinc tin oxide plus the thickness of the second layer comprising a silicon compound plus the thickness of the second layer comprising zinc tin oxide is from 25 nm to 40 nm.

3. The film according to claim 1, wherein the sum of the thickness of the first layer comprising a silicon compound plus the thickness of the first layer comprising zinc tin oxide is T1, wherein the sum of the thickness of the second layer comprising a silicon compound plus the thickness of the second layer comprising zinc tin oxide is T2, and wherein T1−T2 is greater than 5 nm.

4. The film according to claim 1, wherein the film has a reflected ΔL* value of less than 2 after exposure to 720 MJ/m2 of total irradiance integrated over the band 295 nm to 385 nm and time, at a black panel temperature of 70° C., and humidity of 30% when irradiated through the substrate.

5. The film according to claim 1, wherein the film has a reflected Δa* value of less than 2 after exposure to 720 MJ/m2 of total irradiance integrated over the band 295 nm to 385 nm and time, at a black panel temperature of 70° C., and humidity of 30% when irradiated through the substrate.

6. The film according to claim 1, wherein the film has a reflected Δb* value of less than 5 after exposure to 720 MJ/m2 of total irradiance integrated over the band 295 nm to 385 nm and time, at a black panel temperature of 70° C., and humidity of 30% when irradiated through the substrate.

7. The film according to claim 1, wherein the film has a reflected ΔE* value of less than 5 after exposure to 720 MJ/m2 of total irradiance integrated over the band 295 nm to 385 nm and time, at a black panel temperature of 70° C., and humidity of 30% when irradiated through the substrate.

8. The film according to claim 1, wherein the film has an increase in emissivity of less than 0.02 after exposure to 720 MJ/m2 of total irradiance integrated over the band 295 nm to 385 nm and time, at a black panel temperature of 70° C., and humidity of 30% when irradiated through the substrate.

9. The film according to claim 1, wherein the second radiation-cured acrylate layer comprises a fluoroacrylate polymer.

10. The film according to claim 1, wherein the film is substantially color neutral in both transmission and reflection as defined by CIELAB color values.

11. The film according to claim 1, further comprising a dyed PET layer adjacent the substrate opposite the first radiation cured acrylate layer.

12. The film according to claim 1, wherein the metal layer comprises a silver-gold alloy.

13. The film according to claim 1, wherein the first radiation-cured acrylate layer has a thickness from 500 nm to 1500 nm.

14. The film according to claim 1, further comprising a layer comprising a pressure sensitive adhesive immediately adjacent to the substrate opposite the first radiation-cured acrylate layer and further comprising a liner immediately adjacent to the layer comprising the pressure sensitive adhesive.

15. The film according to claim 1, wherein the film is a window film.

\* \* \* \* \*